United States Patent [19]
Acker

[11] 4,335,361
[45] Jun. 15, 1982

[54] VARIABLE GAIN AMPLIFIER

[75] Inventor: William F. Acker, Seminole, Fla.

[73] Assignee: Honeywell Inc., Minneapolis, Minn.

[21] Appl. No.: 102,600

[22] Filed: Dec. 12, 1979

Related U.S. Application Data

[62] Division of Ser. No. 829,705, Sep. 1, 1977.

[51] Int. Cl.³ .......................... H03G 3/30; H03F 1/34
[52] U.S. Cl. .................................... 330/285; 330/278; 330/290; 330/254; 330/293
[58] Field of Search ............... 330/285, 278, 290, 293, 330/85, 278, 259

[56] References Cited
U.S. PATENT DOCUMENTS 3,736,520  5/1973  Acker ................... 330/282
3,921,091  11/1975  Van Kessel et al. ........ 330/254

*Primary Examiner*—James B. Mullins
*Assistant Examiner*—Gene Wan
*Attorney, Agent, or Firm*—Theodore F. Neils

[57] ABSTRACT

A communications channel monitoring system is disclosed for digitally based communication channels carrying signals corrupted by noise. The monitor system provides a signal indicative of the expected value of the communication channel signal if uncorrupted by noise and provides a signal indicating the extent of any such corruption.

15 Claims, 18 Drawing Figures

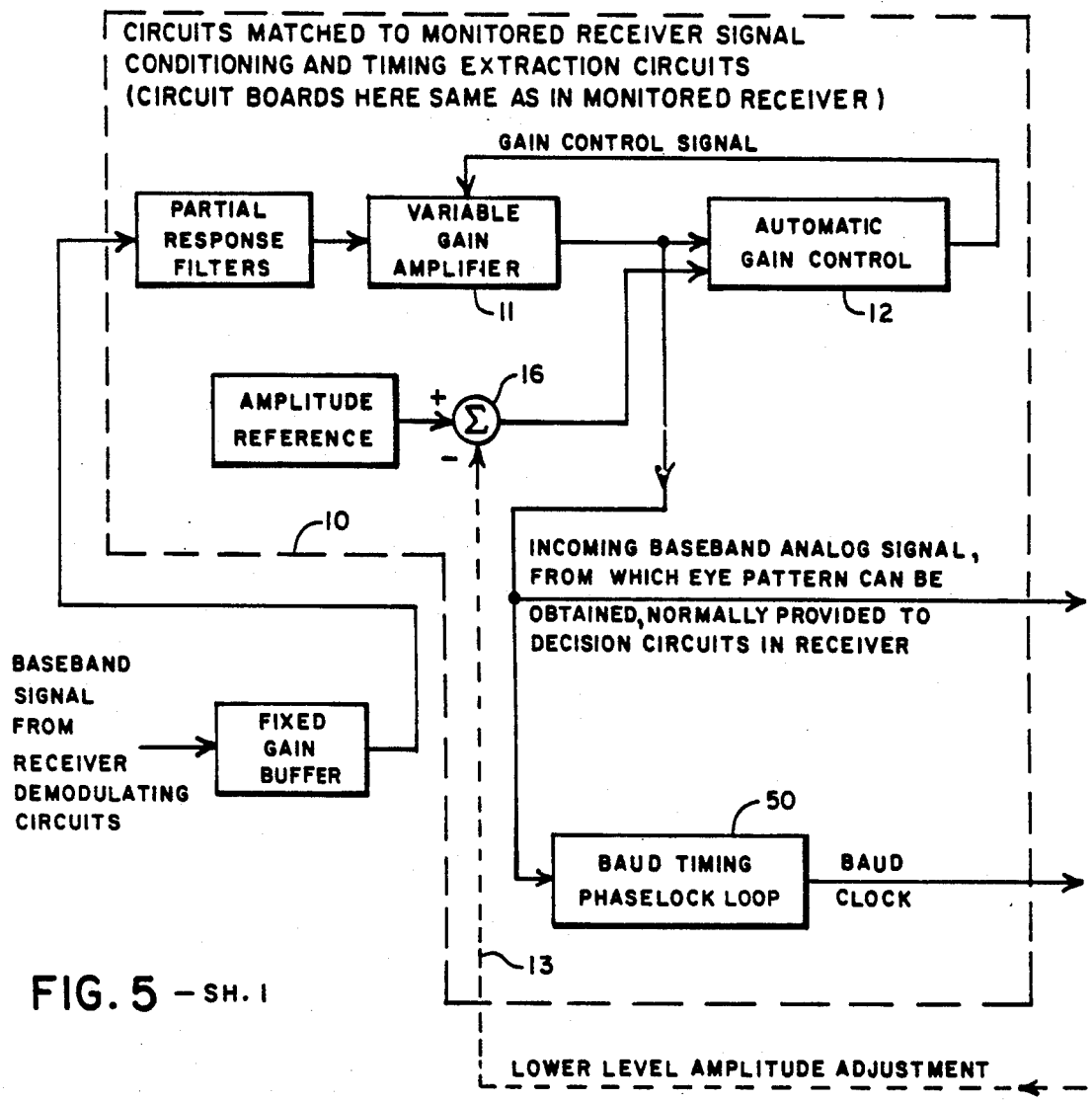
FIG. 5 — SH. 1

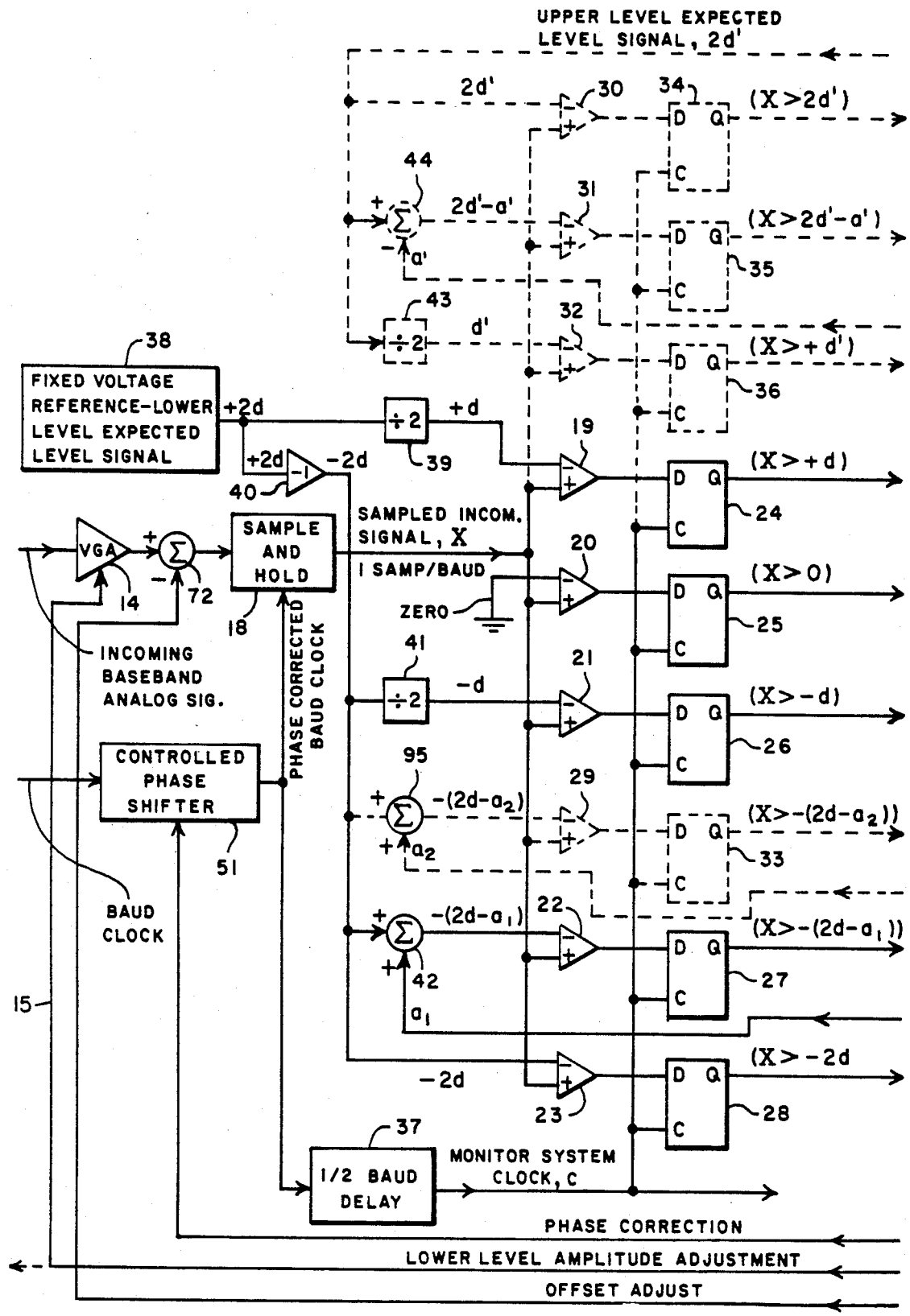
FIG. 5 -SH.2

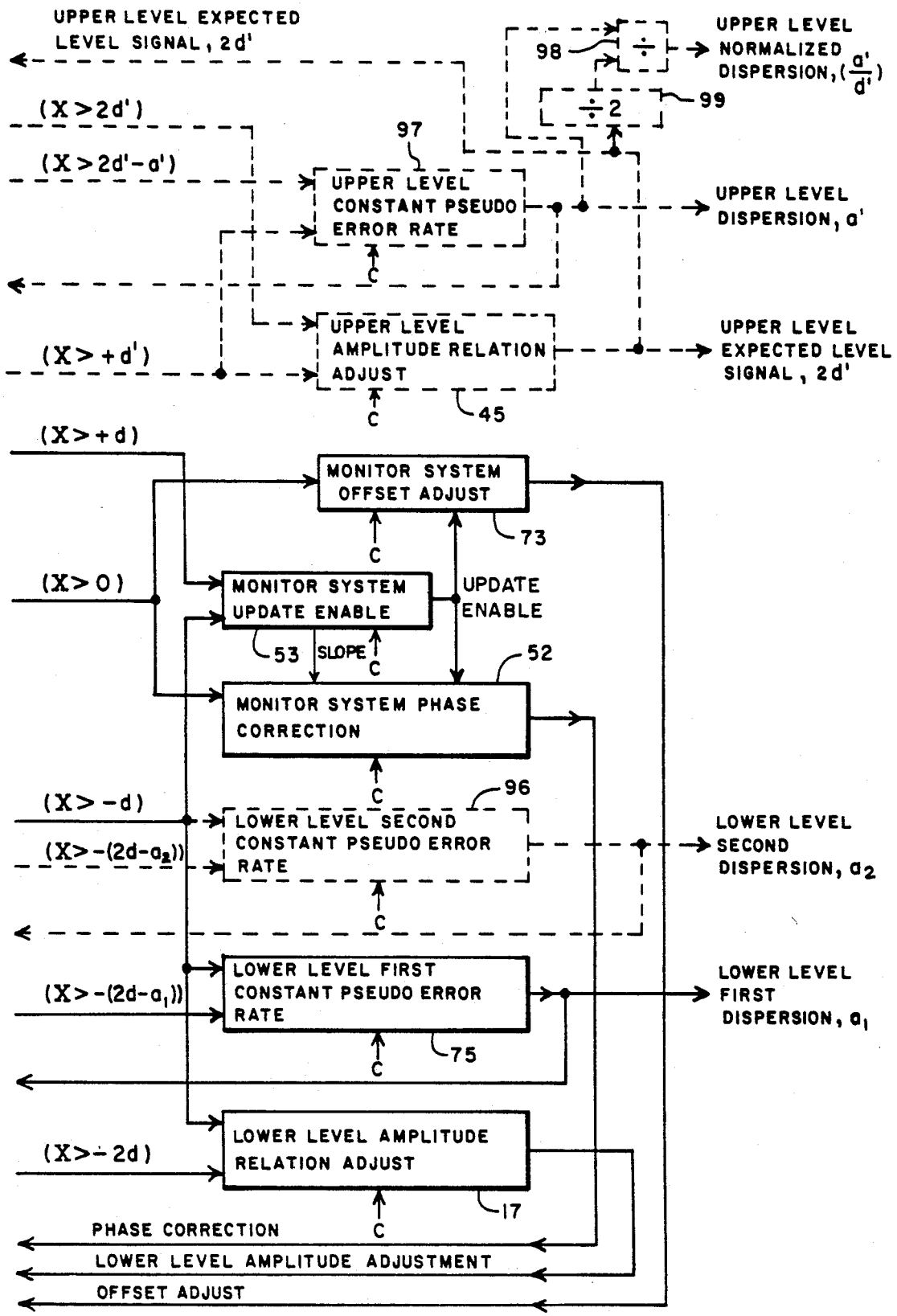
FIG. 5 — SH. 3

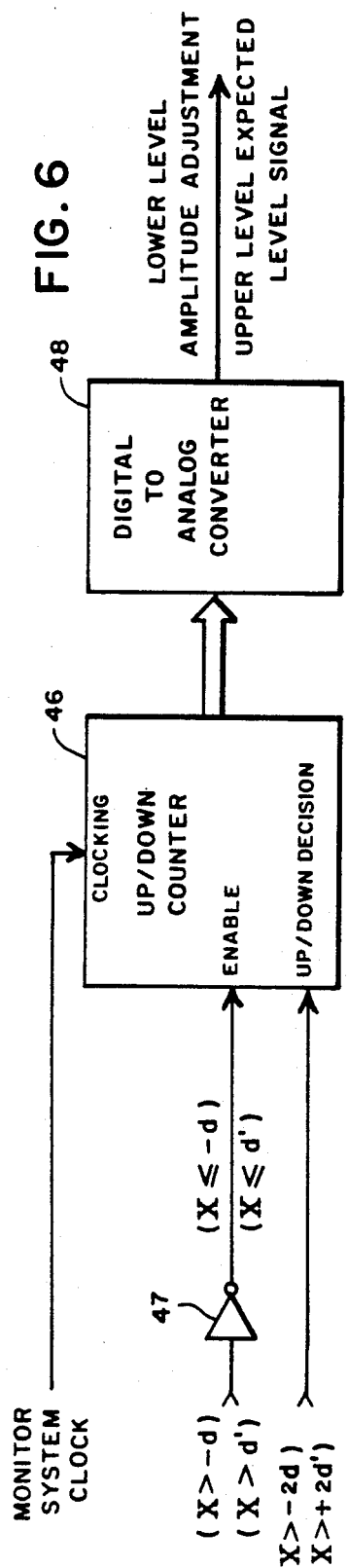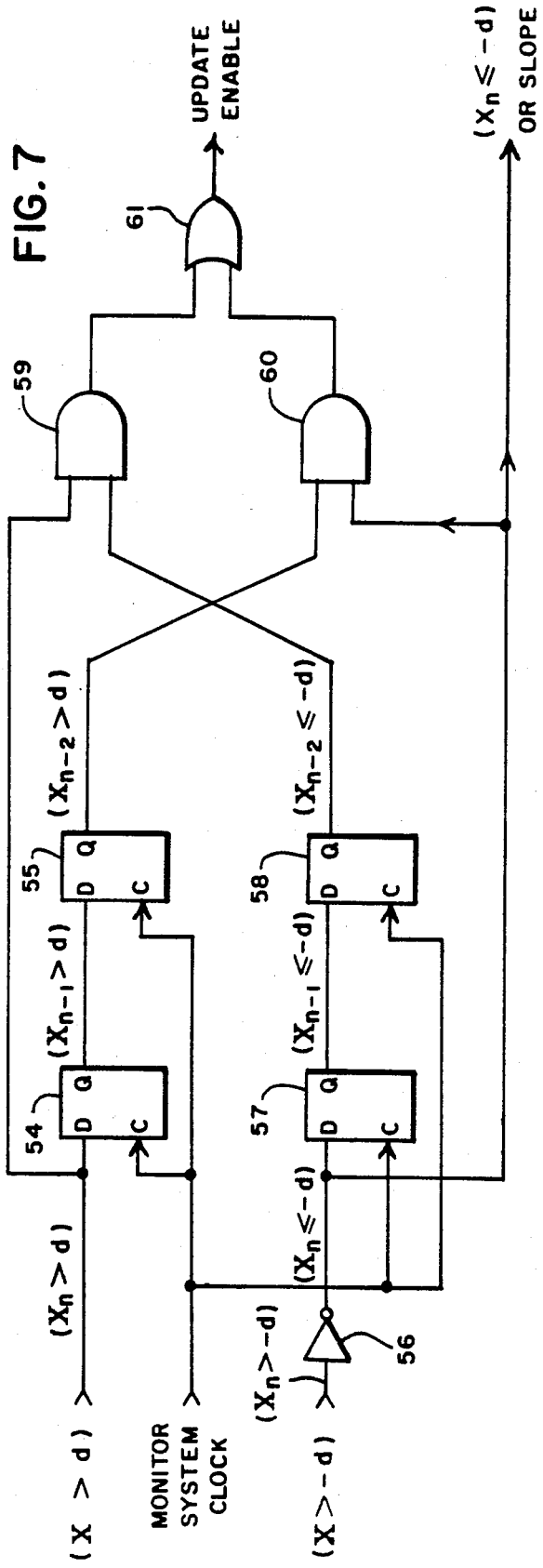

VARIABLE GAIN AMPLIFIER

This is a division of application Ser. No. 829,705, filed Sept. 1, 1977.

The invention herein described was made in the course of, or under a contract, or subcontract thereunder, with the Department of the Air Force.

BACKGROUND OF THE INVENTION

The present invention relates to communication channel quality monitor systems, and more particularly, to monitoring systems for indicating the intended values of signals in the communications channel if uncorrupted by noise and for indicating the extent of any such corruption occurring.

Communication channels can be entirely analog extending from the information source to the transmitter, and then along the channel link to the receiver, and finally to the user of the transmitted information. Communication channels can also be digitally based, either totally or partially. A typical situation is to have a digital information source but where the information is sent over an analog channel link to a receiver which reconverts the information to a digital format.

Digital communication channels or communication channels having digital portions along the channel, i.e. digitally based communication channels hereinafter, are designed to have as large a tolerance for noise and other signal degradations as practicable. Such a system can have so large a designed-in tolerance that the system will operate substantially error free even though one or more elements thereof comes to operate in a severely degraded manner.

A major objective of performance monitoring is to detect such element degradation before corresponding errors are introduced, to thereby permit corrections or other expedients to prevent any such errors before they begin to occur in the communications channel. Obviously, the desired information indicating degradation cannot be first obtained through examining the output of a digitally based communications channel because the foregoing monitoring objective requires detecting degradations before errors occur in the channel.

True, there are tests possible which remove digital elements in the communication channel from service long enough to subject them to test sequences to measure the error rates of these elements, and further, there can be use made of error detection and correction codes. There certainly are situations in which these techniques are useful in performance monitoring. However, in circumstances of degradation, they are not adequate for measuring the performance margin between the point of error free operation and the point where some selected error rate occurs because these techniques give no indication that degraded signal circumstances exist until the degradation is sufficient to cause errors in the received signals. Thus, a useful signal degradation monitoring technique should be capable of detecting the degradation before it becomes extensive enough to cause errors in the signal received at the end of the communications channel.

For both analog and digitally based communication channels, the ability to be able to detect signal degradation, before such degradation becomes so extensive as to cause errors in the received messages in either kind of communications channel, is of vital importance. In comparison, however, the ability to detect gradually increasing signal degradations, and so anticipate loss of the communications channel, is far more easily available or acquired for analog based communication channels than it is for digitally based communication channels.

In analog communication channels, such as voice channels, signal degradation due to such causes as channel induced noise and distortion is delivered to the information user at the receiver right along with the desired signal, with the result that these degradations are quite detectable by the user. Further, these signal degradations are detectable by the user at power levels several decades lower than the level at which they make the analog communications channel unusable through rendering substantially unintelligible the voice signal received. That is, in an analog communications channel there is typically a large margin between the point at which noise and distortion signal degradations are first detectable and the point where such degradations become intolerable. Finally, the user of a voice channel can readily estimate the degree of signal degradation by a qualitative estimate of signal intelligibility.

On the other hand, the user at the receiver of a digitally based communications channel is presented with a very different situation. This is because each digital element in the communications channel reshapes the digital pulses received by it so that ay signal degradation occurring theretofore, due to channel noise, distortion or the like, is removed before the signal is transmitted to the next element in the digitally based communications channel. Such reshaping of the digital pulses is part of the designed-in tolerance to signal degradation provided in a digitally based communications channel as mentioned above. That is, the error rate is reduced by removing the noise and distortion at each digital element in a digitally based communications channel so that the degradation occurring in elements of the digitally based communications channel prior to that element, and in that element, are not allowed to accumulate as they would in an analog communications channel.

Thus, the combination of the noise and distortion for the entire communications channel may be so large as to produce an intolerable error rate across the digitally based communications channel were there are no intermediate pulse reshaping. Yet, the actual error rate across the digitally based communications channel can be reduced to approximately zero by the described removing of signal degradation, the removing accomplished through regenerating the digital signal at some or all of the digital elements occurring along the digitally based communications channel.

Therefore, so long as the accumulated degradation in each digital element is kept below the critical level for that element, each digital element will run error free, and hence, the digital communications channel as a whole will run error free. On the other hand, if degradation in one, several, or all of these digital elements occurs to the extent so as to be just slightly below the critical level at which errors begin to occur in the particular digital element, there will be no indication of an impending problem in the error free signal being delivered to the user at the receiver.

The result is that the reshaping of the digital pulses in the digitally based communications channels is advantageous in reducing the error rate across the channel. Unadvoidably, however, such reshaping removes, in the signal delivered to the user at the receiver, any indication of channel degradation. Hence, the signals received at the channel receiver by the user provide no indication of degradation until errors are actually occurring in these signals. As a result, the user who has nothing but the error rate in the signal obtained by him at the receiver to observe also has no means of estimating how close signal degradation is to critical levels in the digital elements, the levels at which errors begin to occur, until one or more of these levels has been exceeded thereby introducing such errors.

The inability of the user to detect gradual degradation of the signals delivered to him at the receiver, until they contained errors, would be less objectionable if there were a greater separation between the degradation level at which the error rate becomes just barely measureable and the degradation level at which the error rate becomes intolerable. The smallness of this separation can be seen by first assuming that the source of the signal degradation is additive, uncorrelated Gaussian noise so that the amplitude of the noise will be distributed in accordance with the cumulative normal probability function, a graph of which shown in FIG. 1. (To reduce the vertical extent of the graph, the ordinate axis values are provided on the curve with every seven orders of magnitude of the curve graphed repeatedly on the same vertical axis.)

From FIG. 1, one can observe that the probability function, $P(z>t)$, for the normally distributed noise amplitude, z, to exceed an arbitrary threshold, t, decreases so rapidly with increasing t that even when using a seven decade semilog scale, the probability function crosses seven decades vertically more than seven times (indicating more than 49 decades) as the amplitude of t changes less than 24 db (1.2 decades). The consequence of this extremely rapid change in $P(z>t)$ with respect to t, is that the bit error rate of a receiver at the end of a digitally based communications link can change very rapidly with respect to small changes in the amplitude of the additive Gaussian noise.

For ordinary pulse amplitude modulated signalling (PAM), one can show that the baud error rate (BER), i.e. the probability of receiving one or more bits incorrectly in a single baud or sample period (for additive, uncorrelated Gaussian noise) is as follows:

$$BER = 2\left(1 - \frac{1}{L}\right) P\left[z > \left(\frac{3}{L^2 - 1} \frac{S^2}{N^2}\right)^{\frac{1}{2}}\right].$$

where
L $\triangleq$ number of levels per baud.
z $\triangleq$ normally distributed random variable with mean=0 and variance=1.
S $\triangleq$ r.m.s. signal power at receiver decision circuit.
N $\triangleq$ r.m.s. noise power at receiver decision circuit.
$P[z > \ldots]$ $\triangleq$ the probability plotted in FIG. 1.

Where either of the most common types of partial response signalling are used, Class I with n=2 or Class IV with n=3, one can show that the BER for additive, uncorrelated Gaussian noise is as follows:

$$BER = 2\left(1 - \frac{1}{M^2}\right) P\left[z > \left(\frac{1}{2(M^2 - 1)} \frac{S^2}{N^2}\right)^{\frac{1}{2}}\right].$$

where

-continued
$$M \triangleq \frac{L + 1}{2}.$$

In each of these equations, the receiver is assumed to receive an analog signal which the decision circuit therein determines to be at one of the discrete analog levels that the received analog signal is intended to equal at some point in the sample period. The symbols in this latter BER equation are the same as those used in the first equation with the exception of M which is defined therebelow.

Now from the latter of the above BER equations, one can show for partial response signalling how the BER can change, for a relatively small change in the signal to noise ratio, from a BER value essentially equal to zero to a BER value so large as to be intolerable. The following table is constructed to display this for a Class IV, three level, partial response signalling system having a baud rate of 12.5 megabauds/sec:

| Errors/Time | BER | (S/N) db |
|---|---|---|
| 10,000 errors/second | $8 \times 10^{-4}$ | 13.31 |
| 100 errors/second | $8 \times 10^{-6}$ | 15.89 |
| 1 error/second | $8 \times 10^{-8}$ | 17.52 |
| 1 error/minute | $1.33 \times 10^{-9}$ | 18.60 |
| 1 error/hour | $2.22 \times 10^{-11}$ | 19.46 |
| 1 error/day | $9.26 \times 10^{-13}$ | 20.04 |
| 1 error/year | $2.54 \times 10^{-15}$ | 20.94 |
| 1 error/century | $2.54 \times 10^{-17}$ | 21.53 |

The first column of this table presents errors as a function of time which are converted into the baud error rate, BER, in the center column. With the corresponding BER, the signal-to-noise ratio (S/N) at the receiver decision circuit is calculated as shown in the right-hand column of the above table. As can been seen in this table, the difference in S/N required to go from 100 errors/sec. to 1 error/century is only 5.64 db.

Further problems arise for the user at the receiver of the digitally based communications channel should he attempt to rely on detecting degradation in the signal received by him through the channel by the method of observing the errors in this signal as the means of monitoring channel performance. These problems arise because of the number of errors which the user must observe for any meaningful conclusions as to the error rate being experienced.

To obtain a reasonably accurate performance measurement, the user must observe a significant number of errors because the standard deviation of the number of errors measured per observation sample essentially equals the square root of the average number of errors measured per observation sample. By the way of example, if the average number of errors per observation sample is 100, then the standard deviation for this ovservation sample is computed as $(100)^{\frac{1}{2}} = 10$. This means that the BER is being measured with an r.m.s. error of about 10%, that is, one standard deviation equals about 10%.

Now for observing the errors in the signals delivered at the receiver for an observation sampling period of an hour, the percentage error in the calculated error rate determined from the hour observation will increase rapidly as the error rate in the signal delivered to the receiver drops below 1 error/min as can be seen from the foregoing statements concerning the standard deviation of the observed errors. Also, for observation periods of an hour during which there is sampling of the number of errors occurring in the signals delivered to the receiver, the user will be computing an error rate that is based on error observations which on the average are already half an hour old at the time the computation is made. Yet the S/N producing 1 error/min is only 2.71 db lower than the S/n producing 100 errors/second. This is a very small performance margin between acceptable and intolerable system performance, a margin which may be reduced by the errors in measuring the actual error rate, and a margin which can quickly be overcome by changes in the communications channel that can take place in relatively short periods of time.

A monitor system for monitoring the performance of a digitally based communications channel based on using these error counting methods of the signals delivered at the system receiver, having such a narrow S/N margin between acceptable and intolerable performance, is not a very satisfactory system for a monitor that is intended to predict rather than confirm failure in the channel. And, of course, if a larger observation time is used to increase the error sample for the purpose of reducing the error occurring in the measuring of the error rate, the longer time causes an even longer delay in the monitoring process. This makes it difficult or impossible for the monitor system to keep up with what is presently occurring in the communications channel.

From the foregoing, one concludes that counting errors in the signals delivered to the user at the receiver of a digitally based communications channel is likely to be an unsatisfactory monitoring method for monitoring the performance of the communications channel even though such counting techniques are relatively easily implemented in an electronic monitoring system.

Another well known method for monitoring the performance of digitally based communication channels is to display on an oscilloscope the "eye patterns" developed at the inputs to the receiver decision circuits in a channel using an analog link ahead of the receiver decision circuits. This is accomplished by taking the analog signal from the communications channel just before it is submitted to the decision circuits in the receiver and displaying it on the vertical scale of the oscilloscope, with the oscilloscope horizontal scale (time base) synchronized to the baud rate characterizing the delivered signal.

FIG. 2 shows the resulting oscilloscope pattern in such an arrangement for a Class IV, three level, partial response baseband signal assuming no noise is present with the signal. The three levels represent discrete values of signal amplitude, one of which the received partial response signal is intended to equal at the sampling time in each baud. These three levels are shown having the values $+2d$ volts at the upper expected incoming signal level, zero volts at the center expected incoming signal level, and $-2d$ volts at the lower expected incoming signal level. Such a signal format leads to designating the resulting pattern on the oscilloscope as a three level "eye pattern". The eye pattern has two "eye openings" at each sampling point, with each eye opening bracketed by one of the expected signal levels.

The receiver decision circuits effectively sample the baseband signal at each of the sampling times to decide whether an upper, center, or lower expected incoming signal level was intended to be received at the sampling time, the decisions being based on where the signal amplitude is with respect to he receiver decision circuit thresholds. These thresholds are set normally half way between the expected signal levels, i.e. they are set at $+d$ volts for the upper level decision circit threshold and at $-d$ volts for the lower level decision circuit threshold. Thus, the "eye openings" are more or less centered around one or the other of the decision circuit thresholds.

As noise and distortion degrade the signal delivered at the receiver to the user, the oscilloscope traces of these signals shown in FIG. 2 will no longer all appear to go through one of the three expected incoming signal levels at the sampling times but at least some will pass at various distances above or below these levels causing the eye openings to shrink. That is, as noise and distortion increase, the oscilloscope traces appear to blur and widen about the upper, middle and lower expected incoming signal levels.

When the widening of signal traces around any of the expected incoming signal levels becomes so wide that there is no longer a clear separation between the top and bottom of the eye openings, the decision circuits will begin to misinterpret the signal delivered at the receiver, and so the intended message carried therein, leading to errors. That is, the baseband signal (incoming signal after final demodulation) obtained from the signals delivered at the receiver may be sufficiently perturbed by noise and distortion to have values at the various sampling points, or times, other than a value of one of the expected incoming signal levels. The deviation from the intended expected incoming signal level may become so great as to pass on the wrong side of a decision circuit threshold value of either $+d$ or $-d$ volts. Then an error will be made by the receiver decision circuit through its assigning the signal at a particular sampling point to an expected incoming signal level other than the intended expected incoming signal level.

The size of the eye openings relative to the distances between the centers of the adjacent expected incoming signal levels, when expressed as a "percentage of eye opening", has long been used as a figure of merit for performance measurement of digitally based communications channels. This is quite a useful performance measurement, but it has limitations. First, if the decision threshold levels are not located in the center of the eye openings vertically in FIG. 3 and, second, if the sampling times are not centered horizontally in the eye openings in FIG. 3, then the receiver will begin to make errors before the eye openings are totally closed. Third, since the noise encountered in the communications channel typically has a Gaussian amplitude distribution, the widths of the delivered baseband signals about the expected incoming signal levels (and hence the percentage of the eye openings) is not sharply defined. This lack of definition is because the width of the delivered baseband signals about an expected incoming signal level on the oscilloscope can be varied considerably depending upon the intensity setting of the oscilloscope and the length of the time exposure. Finally, the method of observing an oscilloscope is hardly very easily implemented directly in an electronic system.

Another method for assessing signal quality has been to count the number of sample values over a number of baud periods between two fixed thresholds, such as d and another higher threshold set at $2d-b$ in FIG. 3, and then taking this count divided by the number of baud periods to be a "pseudo error rate". However, this "pseudo error rate" is generally not a linear function of the signal degradation and no one pair of fixed threshold values seems to give adequate sensitivity for the present purposes for the entire range of degradation encountered. A system more or less along this line for a two level eye pattern is described in U.S. Pat. No. 3,721,959 to George.

What is really desired for a digitally based communications channel monitoring system is to measure that probability density function for the signal perturbations, i.e. deviations, from the expected incoming signal levels (those various levels of baseband signal amplitude which would occur at the sampling points in the absence of degradation) so that the desired error rates and performance margins can be predicted. In actual practice, however, point by point determination of this probability density function is usually economically not feasible.

A practical alternative is to assume that the distribution of perturbations, or deviation amplitudes, from the expected incoming signal levels, due to signal degradation, are Gaussian and to make some measurement with respect to the signal delivered to the receiver from which the rms amplitude of the distribution may be inferred. However, there are several common signal degradation conditions such as additive tones, highly correlated intersymbol interference, and impulse noise for which the distribution of the perturbations will deviate significantly from a Gaussian distribution. Thus, there is a desire to augment the first measurement for inferring rms amplitude with a second measurement which can indicate either that the distribution is Gaussian or indicate the nature of its deviation from being Gaussian.

SUMMARY OF THE INVENTION

A monitor system is provided which determines a value for at least one expected incoming signal level associated with monitored incoming signals and further determines a dispersion level value representing the extent of perturbations in the incoming signal away from the expected incoming signal level value first determined. This monitor system uses an incoming signal amplitude range classifier to classify the incoming signal amplitude values into ranges related to the expected incoming signal level value determined. For those incoming signals which are properly related to the expected incoming signal level determined, the monitor system takes sample values thereof and apportions them into selected fractions above and below the expected incoming signal level and above and below the dispersion level as the basis for determining both the expected incoming signal level value and the dispersion level value. Further, the monitor system controls offsets about an expected incoming signal level in the incoming signals and controls the phase of data samples obtained from these signals to compensate for certain factors affecting the incoming signals.

To accomodate high data rates, the input range classifier relies on a sample and hold means coupled with delayed values of comparisons made with reference signals to determine the classification ranges. The monitor system, in connection with controlling the incoming signals, may also rely on a very rapidly operating variable gain amplifier which depends on having emitter currents in a pair of bipolar transistors dynamically matched. A level crossing and direction of crossing detector is used in connection with controlling offset and phase in the incoming signals, with this detector indicating crossings by the incoming signal of the level of interest based on data samples from the incoming signal occurring on either side of a data sample associated with level of interest, the detector storing earlier data sample information as necessary.

BRIEF DESCRIPTION OF THE DRAWINGS

FIG. 5 is a system diagram of the monitor system of the present invention, FIG. 6 shows the present invention in connection with developing certain expected level signals, FIGS. 7 and 8 show the present invention in connection with controlling offset and phase with respect to the monitored incoming signals.

DESCRIPTION OF THE PREFERRED EMBODIMENTS

Figure 1:
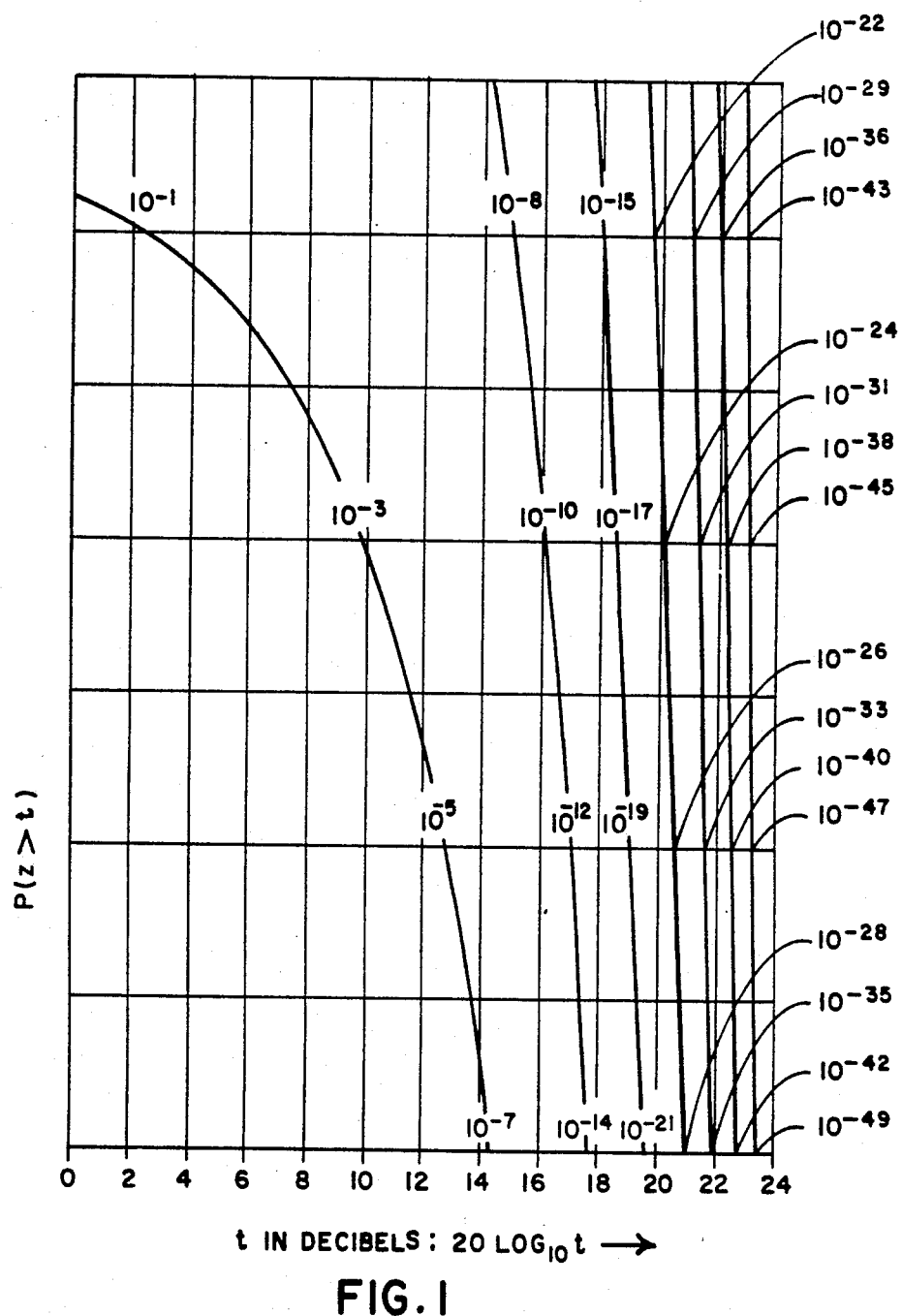
FIG. 1 is a graph of the cumulative normal probability function for noise amplitudes.
Figure 2:
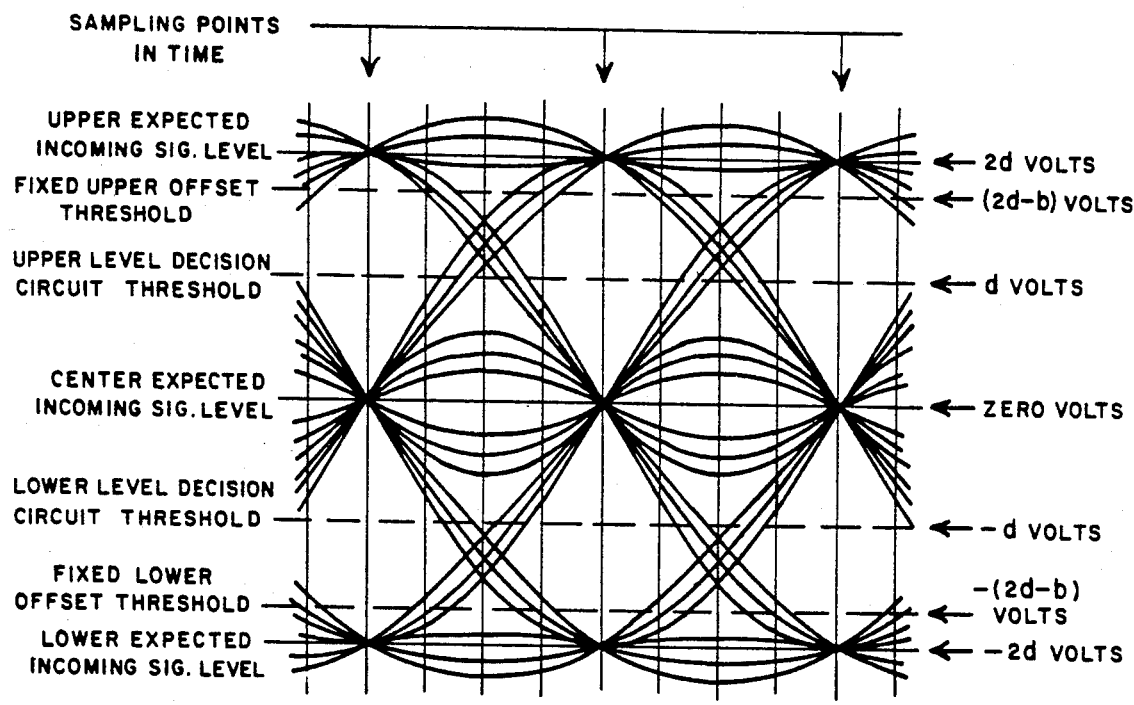
FIG. 2 shows a three level "eye pattern" with fixed offset thresholds.

As a prelude to determining the extent of the signal perturbations about an expected incoming signal level because of degradation occurring in the communications channel, one must determine the exact values of the expected incoming signal levels. This is necessary so that when the perturbations about the expected incoming signal level are thereafter determined, the determination will involve measuring only the perturbations themselves--not the perturbations plus or minus the error occurring in measuring of the expected incoming signal level. This cannot be done straightforwardly with an automatic gain control system based on the measurement of signals corrupted by noise, because this method of expected incoming signal level determination will necessarily change the value found for the expected incoming signal levels as the amount of corrupting noise changes. Again, if a peak clipping circuit is used with a monitored signal corrupted by noise to provide an amplitude sensing signal for the expected incoming signal level determination system, there will be difficulties because the larger the noise the smaller the controlled signal will be.

The present invention determines expected incoming signal level by adjusting the relationship between the incoming signal and a reference level of a comparator in a feedback loop. This relationship is adjusted so that from the data samples obtained from the incoming signal delivered to the user at the receiver, taking just those which are data samples associated with the particular expected incoming signal level, half will have an amplitude value above that expected level and the other half will have amplitudes which occur below that expected level.

Once the desired expected incoming signal levels have been determined, the present invention next provides an indication of the differences between each expected incoming signal level and the actual data sample amplitudes associated with a particular one of these expected incoming signal levels which are encountered in the incoming signals delivered to user at the receiver. As a conceptual matter, one possibility is to subtract the amplitude values of the incoming signal data samples from the expected incoming signal levels, determined in the manner heretofore set out, to thereby obtain the perturbation amplitudes associated with the degradation occurring in the incoming signals. Then, for finding the perturbation probability density function, the rms value of the perturbation amplitudes found can be computed. The density is then found by assuming that the perturbations are normally distributed with a zero mean and a standard deviation equal to the computed rms value.

However, there would be substantial difficulties in implementing such a method in an electronic system for a digitally based communication channel having incoming signals of a high data rate delivered to the user at the receiver. For instance, the invention described in the present disclosure operates at approximately 12.5 megabauds/sec. Further, one would also wish to make some additional measurements, such as the rectified average value of the incoming signals in addition to the rms value, to use for testing the distribution of perturbation amplitudes to determine if there is deviation from the assumed Gaussian distribution. This amount of desired computing becomes impractical to perform by an electronic system for incoming signals having high data rates.

A further possibility would be to use an expected level signal representing an expected incoming signal level determined as above, and to combine this expected level signal with a fixed offset value b, to form a reference signal for a comparator. This comparator would establish the fixed upper offset threshold, $(2d-b)$ volts, associated with the upper expected incoming signal level for a particular value of that level. Another comparator would use the value for the upper level decision circuit threshold, $+d$ volts, as a reference signal. Together, these comparators could determine which of the data samples, in the incoming signal delivered to the user at the receiver, have amplitudes which occur between the upper level decision circuit threshold at $+d$ volts and the fixed upper offset threshold at $+(2d-b)$ volts which are designated as "pseudo errors". While not likely to be confused as actual errors by the receiver upper level decision circuit, the occurrence of a substantial and increasing number of pseudo errors would indicate degradation is occurring in the incoming signal to such a degree as to indicate a substantial risk of actual errors soon occurring also. Further, this can be done simultaneously at another expected incoming signal level, e.g. also, adding as pseudo errors those data samples associated with the lower expected incoming signal level having amplitudes occurring between $-2d$ volts and $-(2d-b)$ volts.

There are at least two problems with this concept of using a fixed offset value b, as just set out, one or the other of these problems arising depending on the calibration procedure followed in choosing an actual value for b. The first problem arises where the value of b is chosen individually for each monitor system on the basis that the monitor system indicating an arbitrarily selected number of pseudo errors in a fixed time when monitoring any particular digitally based communications channel. Such a system would have no absolute scale such that a specific value of this quality output signal could be taken as having a specific meaning. This is because the calibration of the monitoring system under this procedure is accomplished after the system is attached to a specific digitally based communications channel which is to be monitored, and is accomplished without an absolute signal quality reference.

That is, the selected and then fixed offset value, b volts, is chosen in the calibration process for each monitor system, and its associated communications channel, to provide an arbitrary number of pseudo errors regardless of the individual variation in the operating conditions of the various channels at the time of calibration. This calibration process could well lead to a situation where the first troubleshooting step in circumstances raising a question of proper communication channel operation might be to check the calibration of the monitoring system by repeating the calibration procedure—a step that would result in the symptom of trouble automatically disappearing regardless of the condition of the channel. Possibly, a somewhat involved calibration technique could be developed to circumvent this problem by introducing some signal quality reference standard.

The second difficulty in the above concept arises when the calibration procedure is to choose a fixed value for the offset, b volts, that is the same for every monitor system regardless of the varying channel conditions among the channels to be monitored. A quality output signal, indicating pseudo errors as a measure of incoming signal degradation, from a monitor system based on the above concept would effectively represent a "pseudo error rate". "Pseudo error rate" would be defined as being equal to (i) the number of data samples observed between the upper level decision circuit threshold $+d$ volts and the fixed upper offset threshold $+(2d-b)$ volts, plus (ii) the number of data samples observed between the corresponding lower level points, i.e. between the lower level decision circuit threshold $-d$ volts and the fixed lower offset level $-(2-b)$ volts, all divided by the number of bauds during which the count of data samples occurring in these ranges was made. In these circumstances, when a fixed amplitude offset, $|b|$, is used, the "pseudo error rate" determination provides results which are again dependent on small changes in S/N as were the results obtained from the method of actually counting errors in the incoming signal, a method earlier described above.

That is, if the offset amplitude, $|b|$, is made too large, the pseudo error rate will be too small to make accurate measurements of low level degradation in the incoming signal because long averaging times are required for accuracy as earlier indicated in connection with baud error counting. On the other hand, if the offset is chosen too small, the pseudo error rate will change rapidly for small signal degradations but will tend to remain nearly constant at approximately 25% (assuming that the outer expected signal levels are used 50% of the time by the incoming signal on the average) for large noise levels in the amplitude range of greatest interest—where the system just begins to make actual errors. In either situation, the pseudo error rate variation versus noise level is a highly non-linear function which is not readily interpreted.

Figure 3:
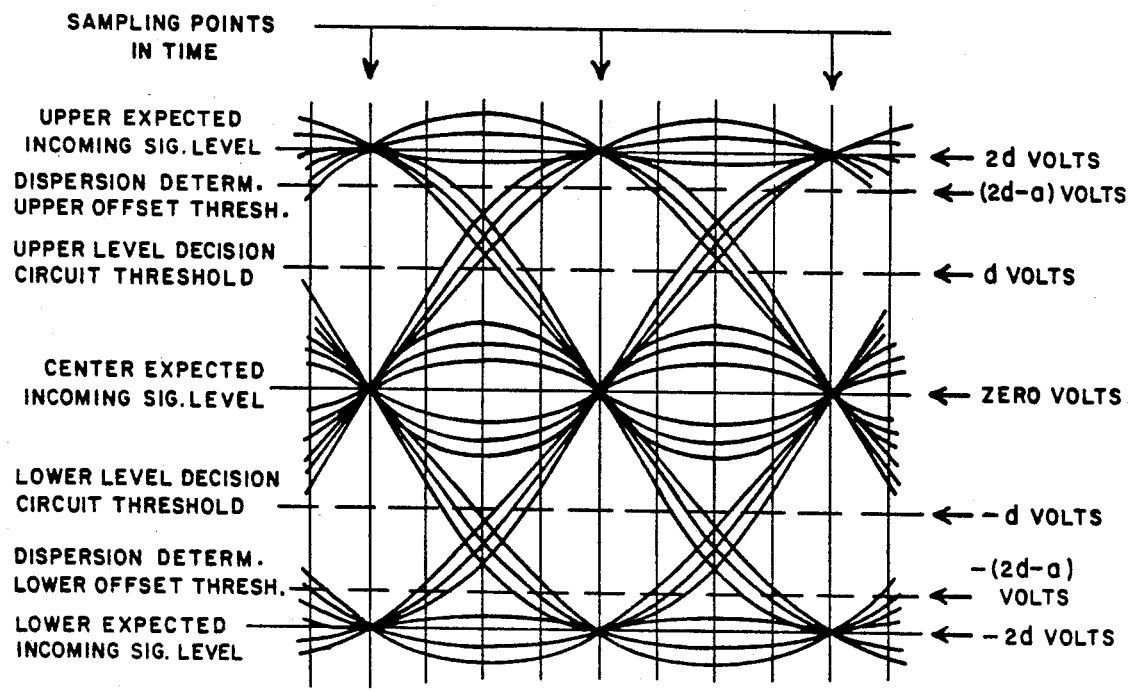
FIG. 3 shows a three level "eye pattern" with dispersion determined offset thresholds.

The present invention solves the offset value choice problem by using a closed-loop system which adjusts the offset as required to keep the pseudo error rate constant. FIG. 3 shows the situation with such a closed, or feedback, loop where the offset value is now designated by a variable, a, rather than by the constant b. Thus, the reference voltages for the comparators, which each determine one bound to the pseudo error rate regions in FIG. 3, are set by the values 2d−a volts and −(2d−a) volts, respectively. That is, the pseudo error rate, when based on both pseudo error ranges, is determined by those data samples occurring between the dispersion determined upper offset threshold, 2d−a volts, and the upper level decision circuit threshold, +d volts, on the one hand, plus those data samples occurring between the lower level decision circuit threshold, −d volts, and the dispersion determined lower offset threshold, −(2d−a) volts, on the other.

As will become clear below, the value for the offset, a, is related to a point on the probability density function currently characterizing the incoming signal perturbations, a point other than the mean, and so the offset, a, is determined by the dispersion of that distribution. Thus, the levels 2d−a and −(2d−a) are dispersion determined to a substantial extent and are so designated in FIG. 3.

To see the results of having the offset, a, vary in this manner, assume that perturbations in the incoming signal larger than +d volts from the expected incoming signal level +2d volts are rare compared to those perturbations that are merely larger than the variable offset, a volts, also with respect to the upper expected incoming signal level +2d volts. Then, the probability of counting a pseudo error when the incoming signal is nominally at the upper expected incoming signal level is equal to the probability that the amplitude perturbations, $\epsilon$, i.e. deviation amplitudes from the upper expected incoming signal level, in a negative direction are greater in absolute value than |a| volts. Then, to maintain the same pseudo error rate when the rms amplitude, i.e. the standard deviation, of the perturbations $\epsilon$ doubles, the amplitude of the offset signal, a, must also double.

Thus, within the limits of our approximation, when the variable offset, a, is adjusted to keep the pseudo error rate constant, then the offset, a, is directly proportional to the standard deviation measure of the dispersion of the perturbations $\epsilon$ from the upper expected incoming signal level. Of course, the same situation holds for perturbations around the lower expected incoming signal level, −2d volts.

The relationship alluded to in the foregoing can be more fully derived, that is the relationship indicating how the offset signal, a, (normalized through dividing it by the decision circuit threshold value d) must be adjusted to keep the pseudo error rate constant as changes occur in the rms value of the additive Gaussian noise N (normalized also through dividing it by the decision circuit threshold value d) which accompanies the incoming signals delivered to the user at the receiver. This relationship will be derived below for a three level partial response signal, a signal leading to the three level eye pattern shown in FIG. 3. Again, the assumption is that the degradation of the incoming signals at the receiver are due to uncorrelated, additive, Gaussian noise that is normally distributed with a mean of zero and a standard deviation equal to N.

This derivation will be for a pair of comparators associated with the upper expected incoming signal level of the three level, partial response incoming signal delivered to the user at the receiver in a digitally based communications channel. The pair of comparators will be used to determine the number of samples occurring between the upper level decision circuit threshold, +d volts, and the dispersion determined upper offset threshold, (2d−a) volts.

In actual practice, the pseudo error rate measured by this upper pair of comparators might very well differ from the pseudo error rate that would be measured by the use of a pair of comparators associated with the lower expected incoming signal level. This might be due to distortion by clipping or by saturation which occurs in such a manner that only one or the other of the upper or lower sides of the three level signal is distorted or is substantially distorted. However, quite often in practice the results at the upper expected signal level will be the results expected at the lower level, or at very least, an indication of degradation problems at the upper level will be sufficient to alert the user of degradation of the incoming signal. And by merely inverting the polarity of the incoming signal as desired, a monitor system can alternatively check both outer expected incoming signal levels. Therefore, the relationship of the offset, a, to Gaussian noise amplitudes associated with the upper expected incoming signal level only will be determined for constant pseudo error rates.

For the following analysis, the magnitude of each data sample taken from the incoming signals delivered to the user at the receiver is defined to be equal to the nominally intended magnitude, either +3d, 0, or −2d volts, plus the magnitude of the deviation from the nominal signal level, the signal perturbation $\epsilon$. The variable $\epsilon$, in accord with our previous assumption, is a normally distributed random variable, uncorrelated with the incoming signal, having a mean value of zero and a standard deviation equal to N.

Clearly, the probability of a particular data sample having an amplitude occurring between 2d−a volts and d volts depends on whether the nominal intended level for that data sample was +2d, 0, or −2d volts. Therefore, finding the probability of a pseudo error occurring which is associated with the upper expected incoming signal level requires that the mutually exclusive probability contributions be found from signals intended to occur at each of the nominal expected incoming signal levels, or $P$(upper level pseudo error detected) =

[$P$(upper level +2$d$ intended)] ·

[$P$(upper level pseudo error detected/ upper level +2$d$ intended)] +

[$P$(middle level 0 intended)] ·

[$P$(upper level pseudo error detected/middle level 0 intended)] +

[$P$(lower level −2$d$ intended)] ·

[$P$(upper level pseudo error detected/lower level −2$d$ intended)].

The values for the probabilities P(upper level 2d intended), P(middle level 0 intended), and P(lower level −2d intended) can be found from communications theory for the communications system involved. For the three level partial response signalling considered here, these probabilities are as follows:
P(upper level 2d intended) = ¼
P(middle level 0 intended) = ½

P(lower level $-2d$ intended) $= \frac{1}{4}$

The conditional probability of receiving a data sample having an amplitude value between $2d-a$ volts and $d$ volts, thereby appearing as a pseudo error, given that the intended level was $+2d$, is equal to the probability that $\epsilon$ is of the value to cause the data sample to occur within the pseudo error range. Hence, $$P(\text{upper level pseudo error detected/upper level } 2d \text{ intended})$$
$$= P(d \leq 2d + \epsilon < 2d - a)$$
$$= P(-d \leq \epsilon < -a)$$
$$= P(-d/N \leq \epsilon/N < -a/N)$$
$$= P(a/N < z \leq d/N)$$
$$= Q(a/N) - Q(d/N)$$

where
$z \triangleq \epsilon/N \sim N(0,1)$ because $\epsilon \sim N(0,N)$,
$Q(t) \triangleq P(z>t)$ given z is normally distributed with mean $=0$ and variance $=1$ or $z \sim N(0,1)$.

The conditional probability of receiving a data sample in the pseudo error range, and so having an amplitude level between $2d-a$ volts and $d$ volts, given that the intended level was 0, is equal to the probability that $\epsilon$ is of a proper amplitude with respect to the nominal level 0 to cause the data sample to have an amplitude which falls within this range, or $$P(\text{upper level pseudo error detected/middle level 0 intended})$$
$$= P(d < 0 + \epsilon \leq 2d - a)$$
$$= P(d/N < \epsilon/N \leq (2d - a)/N)$$
$$= Q(d/N) - Q[(2d - a)/N]$$

Finally, the conditional probability of receiving a data sample having an amplitude between $2d-a$ volts and $d$ volts, given that the intended level was $-2d$, is equal to the probability that $\epsilon$ is of the proper amplitude with respect to the nominal level to result in the data sample having an amplitude within this range, or $$P(\text{upper level pseudo error detected/lower level } -2d \text{ intended})$$
$$= P(d < -2d + \epsilon \leq 2d - a)$$
$$= P(3d < \epsilon \leq 4d - a)$$
$$= P(3d/N < \epsilon/N \leq (4d - a)/N)$$
$$= Q(3d/N) - Q[(4d - a)/N]$$

Then, inserting these equations into the first equation set out in this derivation, the following expression results for P(upper level pseudo error detected):

$$P(\text{upper level pseudo error detected})$$
$$= \frac{1}{4} \{Q(a/N) - Q(d/N)\}$$
$$+ \frac{1}{4} \{Q(d/N) - Q[(2d - a)/N]\}$$
$$+ \frac{1}{4} \{Q(3d/N) - Q[(4d - a)/N]\}$$
$$= \frac{1}{4} \{Q(a/N) + Q(d/N) - 2Q[(2d - a)/N]$$
$$+ Q(3d/N) - Q[(4d - a)/N]\}.$$

Using this equation, P(upper level pseudo error detected) can be solved for explicitly as the function of the two normalized variables a/N and d/N, or perhaps more conveniently as a function of a/N and N/d.

However, for prediction purposes, one desires a relationship expressing a/d as a function of N/d for a selected constant value for P(upper level pseudo error detected). The last equation above, being a transcendental equation, does not lend itself very easily to being manipulated into a form exhibiting this relationship. For full and complete accuracy, an iterative solution method must be used with a/d not necessarily being linearly related, at first glance anyway, to N/d.

In actual practice, however, a one term approximation to the last equation proves quite reasonable and accurate. Thus, the above equation can be approximated as $$P(\text{upper level pseudo error detected}) \approx \tfrac{1}{4} Q(a/N).$$

This can be rearranged to $$a/N \approx Q^{-1}[4 P(\text{upper level pseudo error detected})],$$

or $$a/d \approx Q^{-1}[4 P(\text{upper level pseudo error detected})]N/d.$$

Figure 4:
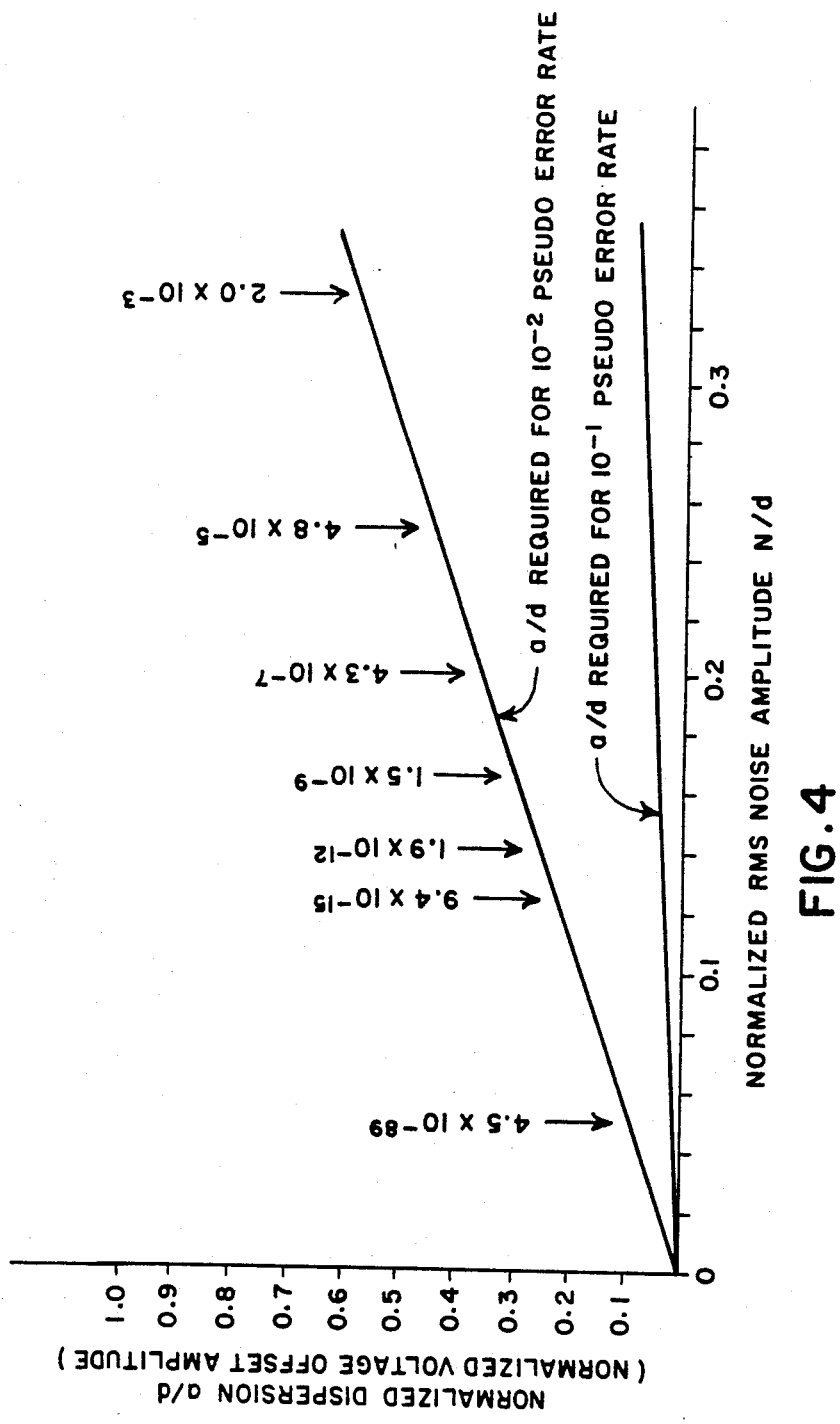
FIG. 4 is a graph of dispersion value and baud error rates versus rms noise value.

This last approximating equation linearly relates the normalized offset voltage, a/d, to the normalized rms noise amplitude, N/d. A graph of this relationship is shown in FIG. 4 for two different selected pseudo error rates. This approximate equation becomes more accurate as one approaches smaller normalized noise amplitudes.

Now for prediction purposes, the actual baud error rate must be computed and related to the graph shown in FIG. 4. To do this, the baud error rate equation set out in the background material above must be used. Because, as indicated above, the expected levels of the incoming signal are to be determined by the monitor system and are represented by $+2d,0$ and $=2d$ volts, the rms signal power S in the baud error rate equations can be represented by a relationship in which the only variable appearing is d in place of S.

For both of the baud error rate equations set out in the background material above, the probability function factor appearing therein represents the probability of the received data samples, with a normalized noise probability distribution, being greater than some threshold which is related to the expected incoming signal levels. With this being so, and with the signal power being related to the variable d by virtue of the way the intended levels are determined, as indicated in the preceeding paragraph, the PAM signalling system baud error rate equation can be shown to be effectively as follows (the probability function factor has been first written with unnormalized variables in which form the perturbations appear as being greater than the decision threshold level):

$$BER = 2(1 - 1/L) P(\epsilon > d).$$

This can be rearranged into the normalized variable form as indicated by the following:

$$BER = 2(1 - 1/L) P(\epsilon/N > d/N)$$

-continued $$= 2(1 - 1/L) Q(d/N).$$

where z and Q are defined as earlier.

Similarly, for the most common types of partial response signalling (Class I with n=2 and Class IV with n=3, with Class IV, n=3 partial response signalling have been used in our above derivation).

$$BER = 2(1 - 1/M^2) Q(d/N),$$

where M is defined in the background section above.

Using this last equation, the actual baud error rates corresponding to selected normalized rms noise amplitude N/d values of $\frac{1}{3}$, $\frac{1}{4}$, 1/5, 1/6, 1/7, $\frac{1}{8}$, and 1/20 are calculated and indicated in FIG. 4. Notice that N/d is really a measure of noise power relative to signal power since the value d is so closely related to the signal power S as indicated above. Hence, N/d is a measure of the signal to noise ratio. The numbers with the arrows pointing to the corresponding line for a pseudo error rate of $10^{-2}$ are the BER values calculated using the last equation above for the selected N/d values just set out, and these numbers show the predictative capability of the graph in FIG. 4. That is, there is an a/d value uniquely associated with each BER value since a/d depends on N/d as does the BER in the manners shown in the foregoing equations set out for both a/d and BER.

So in summary, the voltage offset, a, to be developed by the monitor system, is essentially a linear function of the rms noise in the incoming signal delivered to the user at the receiver. This relationship is shown graphically in FIG. 4 for baud error rates at the receiver over the range of zero to $2 \times 10^{-3}$, and for pseudo error rates of 10% and 1%.

Thus, there is to be made available in the monitor system a voltage signal, a, which is approximately linearly proportional to the rms value of the signal perturbations (indicating the perturbation dispersion) occurring about an expected incoming signal level determined by the monitor system which is also to be made available in this system. (The foregoing derivation was for perturbations about the upper expected incoming signal level +2d but might just as well have been about another expected signal level such as −2d.) Hence, the monitor system provides a readily measured indication of an expected incoming signal level (2d or −2d) unbiased by noise, and a readily measured indication of the associated noise level, a, unbiased by signal. This assumes, of course, that we measure the expected incoming signal level, either +2d or −2d, by apportioning 50% of the data samples obtained from the incoming signal delivered to the user at the receiver above the one of the pertinent levels +2d, or −2d, and so apportion the other 50% below that level, as earlier indicated. Further, this readily measured offset voltage, a, can be used to predict the actual BER occurring as shown by the values for the BER set out for the 1% pseudo error rate curve in FIG. 4.

At this point, then, the only information still needed for successful monitoring of a digitally based communication channel are the results of a test to determine whether or not the probability density function of the noise in the incoming signal delivered to the user at the receiver fits the assumed Gaussian probability distribution. Such information can be provided by using two closed-loop pseudo error detector systems, each based on maintaining a constant pseudo error rate, but where each uses a different pseudo error rate, such as a 1% and 10% pseudo error rates shown in FIG. 4. This is because, if the probability density function of the perturbations in the incoming signal are truely Gaussian, then the voltage offset signals, say $a_1$ and $a_2$, of the two closed-loop, constant pseudo error rate systems should maintain a constant ratio with respect to each other. This rate is 6.923 for the choices of 1% and 10% pseudo error rates for the single pseudo error band used in the above derivation.

However, where the perturbations are such that the probability density function is not Gaussian, other values for the ratios of the offset voltages $a_1$ and $a_2$ will be found to occur. For instance, where the probability density function characterizing the perturbations in the incoming signals have short tails relative to a Gaussian distribution, such as because there is single tone interference occurring, the ratio between the two offset voltages will be smaller than 6.923. On the other hand, where the distributions have relatively larger tails because of other types of signal degradation occurring, the ratio between the offset voltages $a_1$ and $a_2$ will be larger than 6.923.

Of course, the use of a larger number of pseudo error detectors, i.e. closed-loop systems based on maintaining a constant pseudo error rate, with each such detector based on a different constant pseudo error rate, will allow a more precise determination of the probability density function characterizing the incoming signals. However, a point of diminishing returns as quickly reached, particularly in view of the cost of adding further pseudo error rate detectors.

On the other hand, where the error rates around different expected incoming signal levels differ because of asymmetries present in a digitally based communication channels, it may be necessary to introduce pseudo error detectors around one or more or even all of the other expected incoming signal levels. The contributions of pseudo errors occurring around these levels may either be combined to give one overall pseudo error rate detector signal, or there may be at least one pseudo error rate detector signal developed around each expected incoming signal level for just the pseudo errors occurring around that expected incoming signal level about which the pseudo error rate detector is provided, or both pseudo error rate detector signal arrangements may be provided.

An implementation of the above-described monitoring system is shown in FIG. 5. In implementing such a monitoring system, an immediate question arises as to where along a digitally based communications channel, to be subjected to monitoring, should such monitoring be performed? That is, should the end of the link between the transmitter and receiver be the point of monitoring so that the signal coming into the receiver is monitored? Or should the signal after some or all of the receiving equipment has operated on it be monitored so that degradation of the signal occurring in the receiver is also measured by the monitoring equipment? These are questions which go to the purposes and goals of the monitoring effort so that the answers thereto may vary from application to application.

One could build a nearly ideal, or optimum, receiving system at least through both the demodulating circuits and the baseband signal conditioning and timing extraction circuits so that any degradation due to the ideal receiver would be known to be extremely small. In such a situation, the monitoring system will then be monitoring essentially the degradation due to the transmitter and channel link along the digitally based communications channel.

However, if it is important to predict the overall digitally based communications channel performance including degradation due to the receiver being used in the channel, one would want to monitor a system as far into the receiver signal processing complex as possible, but, usefully, this point is no further than the receiver decision circuits, a point where the receiver baseband signal can be used for creating "eye patterns".

FIG. 5 shows essentially how either of these monitoring concepts can be accomodated. The receiver circuits in the receiver system blocks shown inside the dashed-line region, 10, on sheet 1 of FIG. 5 are indicated to be matched to the normally used receiver signal conditioning and timing extraction circuits. That is, the baseband signal from the receiver demodulator circuits is obtained from the actual receiver demodulation circuits and sent through signal conditioning and timing extraction circuits which match those in the actual receiver used in the communications channel being monitored. Thus, receiver degradation of the signals occurring in the digitally based communications channel will be to substantial extent monitored if the apparatus suggested within dashed-line block 10 is used.

However, one could provide as near ideal receiver demodulating circuits as possible and also provide receiver signal conditioning and timing extraction circuits inside dashed-line region 10 designed to be as near ideal as possible. In these circumstances, the signal coming to the receiver along the channel link from the transmitter would be essentially what was being monitored as the optimally designed receiver would introduce relatively little further degradation into the received channel link signals.

For the situation where the receiver degradation is to also be monitored, the system of FIG. 5 assumes that the signal conditioning circuits in the receiver shown matched within dashed-line block 10—in particular, an automatic gain control system duplicated by a variable gain amplifier, 11, and by certain automatic gain control circuitry, 12—introduce degradation in the receiver signals passing through them. Despite this circumstance, the amplitude control necessary for operating the monitoring system shown in FIG. 5 is shown provided in one alternative by using this receiver matched automatic gain control system. (Essentially, the monitor system in FIG. 5 comprises that which follows the receiver matched circuits within dashed-line block 10.) The receiver matched automatic gain control system is directed to vary the gain therethrough to the extent required by the monitoring system via the control signal line, 13.

A typical receiver automatic gain control system shortcoming is that the bandwidth of the variable gain amplifier therein, and so its phase, will change with changes in the amplifier gain setting. However, using the receiver matched variable gain amplifier saves providing one in the monitoring system, although possibly at the cost of introducing some added degradation in the signal delivered to the monitor system.

In those situations where either (i) ideal receiver equipment is designed to permit monitoring of essentially the communications channel prior to the receiver, or (ii) there is no cost need to avoid adding a variable gain amplifier to the monitoring system, the amplitude control requirements for the monitoring system can be meet by adding a variable gain amplifier. Such a variable gain amplifier, 14, is shown in FIG. 5 ahead of the monitoring system and after the receiver dashed-line block 10 elements. Amplifier 14 is controlled via control line, 15, by the signals that would otherwise have been provided along control line 13. Hence, control line 13 (and the summing means used therewith, 16, for combining control signals with the reference signal for the receiver matched automatic gain control system) is entirely alternative to the use of the variable gain amplifier 14 with its control line 15. Hence, control line 13 is represented by a dashed-line while control line 15 is shown solid in FIG. 5.

A suitable variable gain amplifier design for variable gain amplifier 14 is set out below after the system description. The variable gain amplifier has exacting requirements because of the very high baud rates which it is required to accommodate, i.e. the amplifier must maintain sufficient bandwidth and satisfactory phase performance at the various gain settings in which it will operate over the frequence range of operation required.

The control signals to adjust the amplitude of the baseband signals supplied to the monitor system, the control signals provided either along control line 13 or control line 15, are generated in a slow-acting feedback loop. This is because receiver systems will have slow-acting sources of amplitude errors degrading the incoming signal, errors that are desired to be eliminated since the receivers in actual use could otherwise be adjusted to eliminate them anyway. For instance, some receiver automatic gain control systems, which are insufficiently designed, vary with temperature at a very slow rate which may not occur in practice because the temperature will be maintained relatively constant about the receiver.

Again, slow-acting errors may occur because a peak amplitude detecting method is used to adjust the variable gain amplifier gain in the receiver automatic gain control system. The result is that the peak amplitude for the composite signal, constituting the data signal and the noise thereon, is taken equal to the peak amplitude which should be characteristic of the data signal alone. In such circumstances, the result is that the data signal shrinks as the noise signal increases.

On the other hand, some receivers have relatively rapid acting sources of amplitude errors degrading the incoming signal that are not subject to being adjusted away. For example, additive impulse noise occurring in the channel link can cause signal gain level control by the receiver automatic gain control system to fluctuate rapidly with a resulting rapid variation in the amplitude of the signals present in the receiver.

The slow-acting feedback loop, for controlling the amplitude of the incoming baseband signal provided in the monitoring system, is designed to pass through the errors due to incoming signal degrading dynamic error sources in the receiver matched automatic gain control system. This is because the resulting errors could not be adjusted away in actual use and so would contribute to the receiver introduced signal degradation. However, the slow-acting amplitude control feedback loop eliminates the relatively slow changes due to causes such as temperature changes.

Because the slow-acting feedback control loop (i) supplies signals to either the receiver matched automatic gain control system, via line 13, or to the variable gain amplifier 14, via line 15, and either situation leads to controlling the amplitude of the incoming baseband signal in the receiver which is to be monitored by the monitoring system, and (ii) because any expected changes in the incoming signals irrespective of noise, as received by the receiver, are expected to be slow changes, the same slow-acting feedback system for controlling the amplitude of the incoming baseband signals from the receiver demodulator circuits can also be used for providing an expected level signal representing one of the expected incoming signal levels of the incoming signal. That is, this slow-acting, amplitude control feedback loop can be operated to control the incoming signal amplitude based on the earlier stated concept of requiring half of the data samples obtained from the incoming signal, and associated with an expected incoming signal level, to have an amplitude value below that level and the other half of the data samples to have an amplitude value above that level.

This concept can be used to develop the particular expected level signal, in the presence of perturbing signal degradations, for an associated expected incoming signal level of the incoming baseband signal. Hence, the criteria of apportioning equally in amplitude the incoming data samples above and below the associated expected incoming signal level can be met through this criteria being the basis of the feedback sensing mechanism used in operating the slow-acting, amplitude control feedback loop. This is accomplished by providing a fixed reference level as the expected level signal associated with the chosen expected incoming signal level and controlling the incoming baseband signal amplitude so that the apportioning requirement is met.

The components of the slow-acting, amplitude control feedback loop can be found in FIG. 5 by tracing back from the point where signal lines 13 and 15 diverge to a block in the system diagram designated lower level amplitude relation adjust 17. Block 17 in the system diagram of FIG. 5 has three inputs, a timing signal designated as the MONITOR SYSTEM CLOCK and two inputs from an amplitude range classifier. This classifier acts to classify data samples taken from the incoming baseband analog signal by determining whether these data samples have amplitudes occurring in one of several amplitude subranges. The timing system providing the MONITOR SYSTEM CLOCK will be described at a later point, while the description of the other slow-acting, amplitude control feedback loop components ensues at the point.

First, in FIG. 5, generally, the basic monitoring system for obtaining a dispersion measure based on a selected constant pseudo error rate for one expected incoming signal level associated with the incoming baseband signal is shown in solid lines to the right of variable gain amplifier 14 on sheets 2 and 3 of FIG. 5. For this basic system, the expected incoming signal level has been chosen to be the lower expected incoming signal level shown in FIG. 3. The dashed-line drawn portions of the monitoring system on sheets 2 and 3 of FIG. 5 to the right of variable gain amplifier 14 represent implementations of further monitoring system capabilities. These are the monitoring of the pseudo error rate about another expected incoming signal level, the upper expected incoming signal level shown in FIG. 3, and the provision of another dispersion determined offset, $a_2$, by another feedback loop about the lower expected incoming signal level, in addition the loop providing the offset voltage, $a_1$, both of the loops being based on different constant pseudo error rates.

In now describing the slow-acting, amplitude control feedback loop of the FIG. 5 basic system, the incoming signal amplitude range classifier comprises first the system block designated sample and hold, 18. The amplitude range classifier further comprises a number of analog comparators, 19, 20, 21, 22 and 23, in the basic system. Finally, for the basic system, the amplitude range classifier also comprises several D-type flip-flops, 24, 25, 26, 27 and 28.

The amplitude range classifier, however, also extends to the added capability apparatus shown as dashed-line portions in sheets 2 and 3 of FIG. 5. Thus, the amplitude range classifier also comprises additional analog comparators, 29, 30, 31, and 32, all shown in dashed-lines. Lastly, the amplitude range classifier also comprises further D-type flip-flops, 33, 34, 35 and 36, again shown in dashed-lines.

Conceptually, the function performed by the amplitude range classifier system could be performed by the use of an analog-to-digital converter which would supply digitized data samples at the output thereof to a series of digital comparators. However, at the very high baud rate, approximately 12.5 megabauds/sec, at which the digitally based communications channel in the present embodiment operates, there is not sufficient time for the currently available analog-to-digital converters to converge on a value for one data sample before the next data sample is to be taken.

Thus, the amplitude range classifier of FIG. 5 uses a standard sample and hold circuit arrangement for sample and hold block 18 to provide a discrete time, analog data sample at the output thereof, once in each baud, which is obtained from the incoming baseband analog signal supplied from dashed-line block 10. This incoming baseband analog signal of FIG. 5 from the receiver matched circuits of dashed-line block 10 (which may be adjusted directly in amplitude if variable gain amplifier 14 is used, otherwise provided with its amplitude adjusted, and which may have an offset adjustment made thereto) is a continuous time analog signal. Sample and hold circuit 18 is used to provide each data sample at its output to the inputs of the comparators connected thereto for a time sufficient for the transient response of these comparators to decay in amplitude before the comparator outputs are stored in the succeeding and connected D-type flip-flops.

Again conceptually, the monitor system would function just as well with the comparators in the amplitude range classifier all connected directly to the incoming baseband analog signal, i.e. excluding the sample and hold circuit 18, if the time delays in each of the comparators and corresponding D-type flip-flops were either negligible or essentially identical. However, if there are delays and they are unequal, the effect is equivalent to having each of the comparators sampling at different times even if they are all controlled by a single clock.

The basic concept of the monitoring system requires that all of the amplitude range classifier comparator output signals represent measurements of the incoming baseband analog signal that are effectively taken simultaneously. The use of a single sample and hold circuit 18 providing data samples therefrom to all of the comparators in the amplitude range classifier, with the allowance of an adequate settling time before clocking the comparator outputs into the D-type flip-flops, rigorously satisfies the severe requirement for simultaneous sampling of the incoming baseband analog signal.

The provision of an adequate settling time, i.e. a holding period, is accomplished by clocking the sample and hold circuit 18 with the PHASE CONNECTED BAUD CLOCK signal, to initiate a sampling, while clocking the D-type flip-flops with the MONITOR SYSTEM CLOCK signal to initiate these flip-flops to accept the signals at the corresponding comparator outputs for temporary storage during one baud period. The MONITOR SYSTEM CLOCK is delayed approximately half a baud period from the PHASE CORRECTION BAUD CLOCK by a delay block, 37, shown in FIG. 5 to thus establish the holding period.

The five comparators shown in FIG. 5, comparators 19, 20, 21, 22 and 23, compare the discrete time, analog data samples obtained from the incoming baseband analog signal with corresponding comparator reference signal voltages. Each of the amplitude range classifier comparators has a different reference voltage so as to break the total data sample voltage amplitude range into several subranges which, for the basic system, are separated by the values $+d$ volts, 0 volts, $-d$ volts, $-(2d-a_1)$ volts, and $-2d$ volts.

Of course, the comparators 29, 30, 31 and 32 also act to provide further subranges the total data sample amplitude range, these further subranges being introduced by the further comparator reference voltages of $-(2d-a_2)$ volts, $+d'$ volts, $(2d'-a')$ volts, and $+2d'$ volts. In FIG. 3, the amplitude range classifier comparator reference signal voltages associated with the upper expected incoming signal level are designated by $+2d$, $d$ and $(2d-a)$ volts; however, the symmetry of FIG. 3 may not occur in practice. So, voltage values associated with the upper expected incoming signal level of FIG. 3 are represented by primed letters in FIG. 5.

A voltage $+2d$ volts is obtained from a fixed voltage reference source, 38, and is defined to be, after passing through a polarity inverter, as the FIG. 5 LOWER LEVEL EXPECTED LEVEL SIGNAL of 2d volts and so then represents the lower expected incoming signal level of FIG. 3. As FIG. 5 shows and as is discussed below, this negative form of the signal from source 38 is used as a reference in the sensing mechanism of block 17 in the slow-acting, amplitude control feedback loop for controlling the amplitude of the incoming baseband analog signal. This arrangement permits the source 38 signal to satisfy the requirements for meeting its definition as the LOWER LEVEL EXPECTED LEVEL SIGNAL.

The voltage $+d$ volts is obtained by dividing the voltage $+2d$ volts from source 38 in half by a divider, 39, which can be any of several precise and well known voltage divider circuits. As just stated above, the voltage $-2d$ volts is obtained from the $+2d$ volts provided by source 38 through a polarity inverter, i.e. multiplication by $-1$, effected by a multiplier, 40, which can be provided by well known operational amplifier circuits. The voltage $-d$ volts is provided through a divider, 41, operating on the voltage output from multiplier 40. Divider 41 can be constructed much the same as divider 39.

The value $a_1$ volts is the FIG. 5 LOWER LEVEL FIRST DISPERSION voltage signal for the dispersion determined lower offset threshold $-(2d-a)$ of FIG. 3. As indicated above, $a_1$ is developed in a feedback loop based on adjusting the value thereof, as necessary, to keep a selected pseudo error rate constant, a loop to be described at a later point herein. The value $-(2d-a_1)$ volts is obtained from the output voltage of multiplier 40, providing $-2d$ volts, and from the dispersion or offset voltage $a_1$ in a combining circuit, 42, which is a well known operational amplifier circuit. Obviously, voltage source 38 could have supplied instead a reference voltage of $-2d$ volts, and then the various other voltages just discussed could have been derived therefrom.

The voltage value $+2d'$ can be obtained from the slow-acting feedback loop associated with providing an UPPER LEVEL EXPECTED LEVEL SIGNAL of $+2d'$ volts associated with the upper expected incoming signal level of FIG. 3. This loop operates much like the one being described in connection with the lower expected incoming signal level. However, the slow-acting feedback loop associated with the upper expected incoming signal level does not, of course, act also to control the amplitude of the incoming baseband analog signals since that control mode is already preempted by the slow-acting, amplitude control feedback loop associated with the lower expected incoming signal level currently being described.

On the contrary, the slow-acting feedback loop associated with the upper expected incoming signal level accepts the incoming baseband analog signal amplitude as a given, and then directly develops the UPPER LEVEL EXPECTED LEVEL SIGNAL value, $+2d'$ volts. The value for $+2d'$ developed is just that to effect an apportionment by amplitude of half of those data samples, obtained from the incoming signal, which are associated with the upper expected incoming signal level to occurring above that level and the other half to occurring below that level.

The value $+d'$ volts can be obtained from the $+2d'$ volts of the UPPER LEVEL EXPECTED LEVEL SIGNAL through a divider, 43, constructed much as divider 39. The value $a'$ volts, the UPPER LEVEL DISPERSION voltage signal of FIG. 5, is also developed in a feedback loop based on adjusting the value of $a'$, as necessary, to keep a selected pseudo error rate constant in just the manner of the loop associated with the lower dispersion voltage $a_1$. The value $(2d'-a')$ volts, the dispersion determined upper offset threshold of FIG. 3, can be developed from the UPPER LEVEL EXPECTED LEVEL SIGNAL value of $+2d'$ volts and from the dispersion voltage $a'$ through a combining circuit, 44, which is constructed in the manner of combining circuit 42.

Another lower dispersion voltage, the LOWER LEVEL SECOND DISPERSION voltage signal, $a_2$, is also provided and is developed in a feedback loop just as is the dispersion voltage $a_1$ but with a different selection for the pseudo error rate to be held constant. The voltage value $-(2d-a_2)$, forming another and different dispersion determined lower offset threshold for FIG. 3 as opposed to the threshold $-(2d-a_1)$ is developed in the same manner as the voltage value $-(2d-a_1)$.

The remaining comparator reference level, zero (0) volts, is the reference level from which all the other reference levels are determined. All of these comparator reference level signals in the amplitude range classifier are constants except the signals $a_1$, $a_2$ and $a'$, developed in pseudo error detector feedback loops, and the signal $+2d'$, developed in the slow-acting feedback loop associated with the upper expected signal level, and of course, the signals derived from these signals.

Each comparator in FIG. 5 in the amplitude range classifier will have a signal level shift from the low logic state voltage to the high logic state voltage at the output thereof when that comparator has switched because an incoming signal data sample from block 18, applied to the non-inverting input (+ input) thereof, has exceeded the particular reference signal applied to the inverting input (− input) thereof. The relationship between the comparator outputs that have a high logic state voltage in a baud period versus those that do not provides the desired information concerning the amplitude of the data sample taken in that period. That is, these output signal level shifts provide the information as to which of the amplitude subranges, separated by the various reference voltages described in the immediately preceding paragraphs, is the subrange which extends over the amplitude value occurring for the data sample obtained from the incoming signal in that baud period, as this sample was provided at the output of sample and hold circuit 18.

Further, the comparator logic states after any signal shifts occurring at the comparator outputs are stored in the connected D-type flip-flops throughout a baud period to thereby provide logic signals containing data sample amplitude range information for the data sample taken for that baud period. These logic signals from the D-type flip-flops can be operated upon logically in the following system blocks in FIG. 5 for the purpose of extracting this amplitude information, and related information, concerning the data samples being obtained from the incoming baseband analog signal.

Note that all of these succeeding system blocks and the D-type flip-flops are supplied the timing signal MONITOR SYSTEM CLOCK so that they operate in conjunction with the values stored in the D-type flip-flops. That is, the succeeding system blocks only operate on logic signals obtained from the D-type flip-flops after the holding period, due to block 37, which began with the taking of the data sample taken in the baud period, has elapsed. Thus as earlier stated, transients are permitted to decay in the amplitude range classifier system portions ahead of the D-type flip-flops so that the succeeding system blocks after the flip-flops are properly synchronized with correct data sample information as available at the outputs of the D-type flip-flops.

The outputs of all of the D-type flip-flops have signal lines extending therefrom to the following system blocks, as appropriate, and along each of these signal lines is written, in inequality form, the information which is stored in the corresponding D-type flip-flop in a baud period. That is, each data sample obtained from the incoming baseband analog signal is assumed to be represented in value by the discrete time, analog variable, X, or where appropriate, by $X_n$, for the data sample in the $n^{th}$ baud period. The output logic states of the D-type flip-flops indicate, for a baud period, whether the data sample X, or the data sample $X_n$ occurring in the $n^{th}$ baud period, has sufficient amplitude to exceed the reference signal applied to the inverting inputs of the corresponding comparators. This decision, to be made by the corresponding comparator, is indicated by the inequality appearing at the output of each D-type flip-flop.

Since this decision, to be made by each comparator and stored in its corresponding D-type flip-flop, is of a true or false nature, the D-type flip-flop output logic variable can be represented by having the decision inequality written in parentheses along the output lines extending from the Q output in each of the D-type flip-flops. A true, or high, state at a D-type flip-flop output indicates that the inequality written along the line extending from that output has been satisfied, whereas a false, or low, logic state indicates the inequality has not been satisfied.

Turning now to the lower level amplitude relation adjust block 17, the signal LOWER LEVEL AMPLITUDE ADJUSTMENT, to be provided either along lines 13 or 15, is generated at the output of this block. This signal controls the amplitude of the incoming baseband analog signal as provided to the sample and hold block 18, either increasing the incoming signal amplitude if this signal has an amplitude detected by block 17 to be too small or decreasing the amplitude if the incoming signal is detected as being too large. To increase the incoming signal level, as indicated previously, the LOWER LEVEL AMPLITUDE ADJUSTMENT signal is either summed in summing circuit 16 to change the amplitude reference responded to by the receiver matched automatic gain control, or this control signal is used to control the gain level of variable gain amplifier 14. The components comprising block 17 are shown in FIG. 6.

FIG. 6 also represents what is comprised in the block associated with the upper expected incoming signal level, this block being designated as the upper level amplitude relation adjust, 45. That is, there is a block in the slow-acting, amplitude control feedback loop associated with the upper expected incoming signal level to more or less match block 17 in the slow-acting, amplitude control feedback loop associated with the lower expected incoming signal level. Therefore, a second set of input and output signals are shown in FIG. 6 which correspond to block 45.

For block 17, input logic signals are $(X > -d)$ and $(X > -2d)$ while, as indicated above, the analog output signal is LOWER LEVEL AMPLITUDE ADJUSTMENT as shown in both FIGS. 5 and 6. For block 45, the input logic signals are $(X > +d')$ and $(X > +2d')$. As set out above, the output of block 45 directly determines what the UPPER LEVEL EXPECTED LEVEL SIGNAL $+2d'$ volts actually is, in value. The output of block 17, on the other hand, directs gain control of the incoming baseband analog signal about a fixed reference provided for the LOWER LEVEL EXPECTED LEVEL SIGNAL $-2d$ volts. Hence, the output of block 45 has been labeled UPPER LEVEL EXPECTED LEVEL SIGNAL.

Now describing block 17 in FIG. 6, shown there are three signals presented to an up/down counter, 46, which has three inputs for receiving them. The first counter 46 input is a clocking input which is connected to receive the MONITOR SYSTEM CLOCK signal, a signal which acts in each baud period to alter the count total kept in up/down counter 46, but which can actually alter this count total only if counter 46 has been enabled. Whether counter 46 is enabled or not is determined by the logic signal $(X > -d)$ provided by the amplitude range classifier and passed through an inverter, 47. The output of inverter 47 is connected to the enable input of up/down counter 46. Inverter 47 effectively changes the logic signal $(X > -d)$ at its input to the logic signal $(X \leq -d)$ at its output, again with this logic signal being in the true or high logic state if the inequality therein is satisfied. Whether up/down counter 46 counts up or down, i.e. increases or decreases its count total stored therein, is determined by the logic signal (X > −2d), also provided by the amplitude range classifier, and supplied to the up/down decision input of counter 46.

Since counter 46 is associated with the lower expected incoming signal level, this counter may be termed an expectation counter. Counter 46 has twelve taps at the twelve most significant bits at its output indicating the count total therein. These taps supply in each baud period a digital number, indicating the counter 46 count total, in its twelve most significant places, to a digital-to-analog converter, 48, connected to the counter 46 output taps.

However, counter 46 should have the capability of keeping a count total of up to somewhere around $2^{20}$, that is, well beyond the count total maximum of $2^{12}$ which would be due to the bit positions supplied to converter 48. Alternatively, two counters could be used, a counter with a $2^8$ count total capability connected serially to another counter with a $2^{12}$ count total capability which would supply converter 48. The eight extra count positions represents a division of the counts which would otherwise accumulate in counter 46 to increase the time constant of the slow-acting, amplitude control feedback loop.

The actual time constant to be chosen depends to some extent on the conditions in which the loop is to be effective, that is, the disturbances which the loop is to be capable of counteracting as selected on the basis of disturbance event rapidity. However, a count total capability in counter 46 of $2^{20}$ is typically satisfactory to accomplish the goal set out above of obviating temperature change introduced errors in the incoming baseband analog signal without, however, correcting errors from more rapidly operating error sources.

The function of the lower level amplitude relation adjust block 17 is to adjust the incoming baseband analog signal amplitude so that half of those data samples, obtained from this signal and associated with the lower expected incoming signal level, −2d, have amplitudes below this −2d volts reference level, serving as the LOWER LEVEL EXPECTED LEVEL SIGNAL, and so the other half of the data samples have amplitudes occurring above that −2d reference. To accomplish this, the logic signal (X > −d) is provided to the enable input of counter 46 so that only data samples intended to have an amplitude level equal to the lower expected incoming signal level are permitted to affect the counter.

The logic signal (X > −2d) is used to control the counting direction of counter 46 in each baud period. When the incoming baseband analog signal is of a relatively small amplitude, the (X > −2d) logic signal will be true more often than false for data samples associated with the lower expected incoming signal level thus causing counter 46 to count up more often than down. The opposite situation will be true for incoming baseband analog signals that are relatively large. A net surplus of upward counts relative to downward counts over time causes the count total in counter 46 to increase over the same time thereby increasing the count total provided to the converter 48. A net deficit over time, on the other hand, decreases this count total over the same time.

Converter 48, in turn, provides at its output an increasing analog voltage representative of an increasing count total supplied to it by counter 46, or a decreasing voltage for a decreasing count total. An increasing signal at the output of converter 48, the LOWER LEVEL AMPLITUDE ADJUSTMENT signal, serves to drive either the receiver matched automatic gain control system or variable gain amplifier 14 in such a manner as to increase the amplitude of the incoming baseband analog signal. A decreasing output signal from converter 48 will have the opposite effect. Thus, the slow-acting, amplitude control feedback loop associated with the lower expected incoming signal level adjusts the incoming baseband analog signal as necessary to cause half of the data samples obtained from this signal, and associated with the lower expected level, to have amplitude occurring below the −2d reference level and the other half to have amplitudes occurring above that level.

As indicated previously, one may also wish to determine the dispersion with respect to the other expected incoming signal levels present in the incoming baseband analog signal. To do so properly requires another feedback loop for each expected incoming signal level involved to determine the precise expected incoming signal level value, at least where symmetry about the zero reference in the incoming signal cannot be relied upon. As an example, apparatus for doing so is shown for the upper expected incoming signal level by the dashed-line components in FIG. 5 associated with the upper expected incoming signal level and which form a slow-acting, expected signal level determining feedback loop. Incoming baseband analog signals having more expected incoming signal levels might have further feedback loops associated therewith.

The slow-acting, expected level determining feedback loop for the upper expected incoming signal level includes as additional amplitude range classifier components, comparators 30 and 32, D-type flip-flops 34 and 36, and, as indicated earlier, further includes upper level amplitude relation adjust box 45. This upper expected incoming signal level feedback loop operates just as the one described in connection with the lower expected incoming signal level in the foregoing, but rather than adjusting the incoming signal amplitude, the UPPER LEVEL EXPECTED LEVEL signal is developed directly to have a magnitude that just apportions by amplitude the data samples obtained from the incoming signal, and associated with the upper expected incoming signal level, equally on either side thereof.

Thus, in general, the expected level signal for an expected incoming signal level may be provided by either adjusting the incoming baseband analog signal amplitude in connection with a fixed expected level signal, or by adjusting the expected level signal itself. The adjustment is made as necessary to provide the desired equal apportionment by amplitude of data samples obtained from the incoming signal on either side of whatever is serving as the expected level signal. On the other hand, once the incoming baseband analog signal amplitude is adjusted for one expected incoming signal level, the feedback loops for the other expected incoming signal levels must be operated by adjusting the expected level signal itself to provide the proper apportionment.

Returning now to the timing arrangement for operating the monitor system, the BAUD CLOCK signal is obtained from the incoming baseband analog signal in the receiver circuits of dashed-line box 10 by a baud timing phase-lock loop, 50. From this basic timing signal, BAUD CLOCK, the MONITOR SYSTEM CLOCK signal is obtained to operate the D-type flip-flops and the succeeding blocks in the system diagram of FIG. 5. However, when the receiver circuits of box 10 are not of an ideal or optimal design, which would lead to only the signal coming across the channel link being monitored, but are matched instead to the actual receiver used in the channel itself, the receiver matched circuits in matching the actual receiver may contribute to degradation in the incoming baseband analog signal. In these circumstances, the BAUD CLOCK signal cannot be relied upon for monitor system timing, and further, there may be phase delays in the monitor system which must be compensated.

For these reasons, the MONITOR SYSTEM CLOCK and the PHASE CORRECTED BAUD CLOCK signals are used for monitor system timing. The PHASE CORRECTED BAUD CLOCK and MONITOR SYSTEM CLOCK signals, although obtained from the BAUD CLOCK signal, are developed in a feedback loop intended to correct some of the degradation which might occur in the BAUD CLOCK signal and to compensate monitor system phase delays.

The receiver circuit phase-lock loop may be subject to temperature variation, a situation which could possibly be eliminated in the actual receiver by maintaining the environment thereabout at a relatively constant temperature level. This is a very gradually occurring source of error for most phase-lock loops which could reasonably be adjusted away in practice, and so should probably be eliminated from the causes of timing variation in the timing signal derived from the incoming signals being monitored and used to time the operation of the monitor system.

On the other hand, the phase-lock loops used in the receiver circuits are quite often affected by noise level in a rather dynamic manner and these probably should be allowed to affect the timing signals used in operating the monitor system. This is because the errors, reflected as phase jitter, etc. can cause signal degradation which cannot be adjusted away at the channel receiver. Thus, there again is a need for a slow-acting, timing control feedback loop to correct certain slowly changing timing errors in the timing signal extracted from the incoming baseband analog signal. Yet, this loop should not remove the dynamic timing errors which surely should be considered for they effect they may have on the performance of the digitally based communication channel.

The correction of the BAUD CLOCK signal is accomplished through a controlled phase shifter, 51, to which the BAUD CLOCK signal is provided. Controlled phase shifter 51 adjusts the phase of the BAUD CLOCK signal insofar as this signal operates the sample and hold circuit 18 to initiate sampling of the incoming baseband analog signal. Controlled phase shifter 51 exercises its control in response to the PHASE CORRECTION signal provided to it from the monitor system phase correction block, 52. Monitor system phase correction block 52 receives, among its inputs, a signal from a monitor system update enable block, 53, which serves as a zero crossing and direction of crossing detector.

Monitor system update enable block 53 is used because of the manner in which errors in the PHASE CORRECTED BAUD CLOCK signal from phase shifter 51 controlling the sample and hold circuit 18 are detected. These errors are detected through observing those data samples taken from the incoming baseband analog signal near times that this signal is passing through the center expected incoming signal level shown in FIG. 3.

If the incoming baseband analog signal is rising at the sampling time, sampling late will cause the data sample obtained for an incoming signal without offset therein to exceed zero leading to the logic signal $(X>0)$ being in the high state as a true output from comparator 20 and D-type flip-flop 25. On the other hand, if an offset free incoming baseband analog signal were near zero and falling at the sampling time, sampling a zero crossing late would produce a false or low logic state value in the logic signal $(X>0)$. Therefore, to detect the direction of a phase error in the PHASE CORRECTION BAUD CLOCK, one must know (i) whether the data sample in question, as to being of proper phase, taken from the incoming baseband analog signal, was taken at or close to a zero crossing, and (ii) whether the incoming baseband analog signal is rising or falling when the data sample in question was taken.

Referring to FIG. 3, one can observe that this information is inferable whenever (i) the data sample preceeding the data sample in question was a data sample having an amplitude nominally equal to the upper expected incoming signal level, and the data sample following the data sample in question has an amplitude nominally equal to the lower expected incoming signal level to form a falling signal pattern, or (ii) the data sample preceeding the data sample in question was a data sample having an amplitude nominally equal to the lower expected incoming signal level, and the data sample following the data sample in question has an amplitude nominally equal to the upper expected incoming signal level to form a rising signal pattern. In both of these instances, the incoming baseband analog signal is known to have passed through, or nearly through, zero at the sampling time of the data sample in question. And, in the first instance, one knows the incoming baseband analog signal was falling at the time the data sample in question was obtained, while in the second instance, one knows that the incoming baseband analog signal was rising at the time the data sample in question was obtained. This kind of information is extracted from the data samples obtained from sample and hold circuit 18 in both the amplitude range classifier and the monitor system update enable 53.

As stated above, monitor system update enable 53 serves as a zero crossing detector and a crossing direction detector. The information is needed because, as indicated, there are two data sample patterns which must be detected. These patterns must be detected to indicate whether a particular data sample in question, obtained from the incoming baseband analog signal, was at or near the center expected incoming signal level through the incoming signal yielding data samples found to occur in either of the above rising or falling patterns, i.e. whether the data sample in question is to be taken to be a countable data sample for purposes of operating the monitor system phase correction block 52. Further, the monitor system update enable 53 must indicate which of these patterns the data sample in question, if determined to be a countable data sample, was found to be in, either a rising pattern indicating an increasing incoming baseband analog signal or a falling pattern indicating a decreasing incoming signal.

In more detail, this information is to be determined by noting (i) whether the incoming baseband analog signal was at the lower expected incoming signal level in the baud period previous to that baud period in which the data sample in question appears and whether the incoming signal then proceeds to the upper expected incoming signal level in the buad period following the baud period in which the data sample in question appears, or (ii) whether the incoming baseband analog signal was at the upper expected incoming signal level in the baud period previous to the baud period in which the data sample in question appears and whether the incoming signal then proceeds to the lower expected incoming signal level in the baud period following the baud period in which the data sample in question appears. If so, then the data sample in question, as a countable data sample, will separate a pair of acceptable data samples in such a manner as to provide one or the other of the following patterns: (i) $X_{n-2} = +2d$, $X_{n-1} = 0$, $X_n = -2d$, or (ii) $X_{n-2} = -2d$, $X_{n-1} = 0$, $X_n = +2d$. The data samples $X_{n-2}$ and $X_n$ form, in each of those instances, a pair of acceptable data samples separated by the countable data sample $X_{n-1}$.

Turning now to FIG. 7, there is provided a logic diagram for a logic system capable of detecting the foregoing sequences of data samples in the stream of data samples obtained from the incoming baseband analog signal, this apparatus comprising the contents of monitor system update enable 53. The incoming logic signals in FIG. 7 have been written as they are obtained from the amplitude range classifier in FIG. 5, and then these logic signals have been rewritten in FIG. 7 with a counting subscript n to indicate which baud period the logic signal represents.

In FIG. 7, when the logic signal $(X_n > d)$ is true, the amplitude value $X_n$ of the data sample in the $n^{th}$ baud period in the incoming baseband analog signal is nominally at the upper expected incoming signal level $+2d$ volts. The comparator decision as to whether or not this inequality is satisfied in the $n^{th}$ baud period is correspondingly inserted into a flip-flop, 54. This process is repeated for each baud period. Thus, the information is available as to whether or not this inequality was satisfied in the baud period immediately preceding the current one by virtue of the storage of this information in that preceding baud period in flip-flop 54. Further, the information as to whether this inequality was satisfied or not two baud periods previous to the current baud period is transferred to and retained in another flip-flop, 55, connected to the output of flip-flop 54. The outputs of flip-flops 54 and 55 are thus the logic signals $(X_{n-1} > d)$ and $(X_{n-2} > d)$, respectively.

When the logic signal $(X_{n-1} > -d)$ is false, the current data sample has an amplitude $X_n$ intended to equal the lower expected incoming signal level of $-2d$ volts. Therefore, the logic signal $(X_n > -d)$ is passed through an inverter, 56, to provide the logic signal $(X_n \leq -d)$. This logic signal is stored for the baud period immediately previous to the current one in a flip-flop, 57, and is transferred and retained for two baud periods previous to the current one in another flip-flop, 58, connected to the output of flip-flop 57. The logic signals available at the outputs of flip-flops 57 and 58 are $(X_{n-1} \leq -d)$ and $(X_{n-2} \leq -d)$, respectively.

With this information available from flip-flops 54, 55, 57 and 58, the presence of one of the desired data sample patterns, described above, in the stream of data samples obtained from the incoming baseband analog signal can be detected. Two AND gates, 59 and 60, are used to detect the desired patterns of data samples, each of these AND gates being capable of detecting one of the desired patterns. AND gate 59 detects presence of a countable data sample obtained from the incoming baseband analog signal at a time when this signal is in an increasing pattern. One input to AND gate 59 is supplied with the current baud period logic signal $(X_n > d)$ which indicates whether the current data sample $X_n$ has an amplitude nominally equal to the upper expected incoming signal level of $+2d$ volts. The other input of AND gate 59 is supplied the logic signal $(X_{n-2} \leq -d)$ which indicates whether the data sample occurring two baud periods previous to the current baud period has an amplitude value that was nominally equal to the lower expected incoming signal level of $-2d$ volts.

If both of these signals supplied to AND gate 59 are true, there is a rising pattern in the incoming baseband analog signal occurring over the current baud period and the past two baud periods and, necessarily, the data sample occurring one baud period previous to the current baud period $X_{n-1}$ must have an amplitude value intended to equal the center expected incoming signal level. AND gate 60, in a similar manner, detects whether the data sample in the baud previous to the current baud $X_{n-1}$ has an amplitude value intended to equal the center expected incoming signal level and whether this data sample was obtained from the incoming baseband analog signal during a time this signal was in a decreasing pattern occurring over the current baud period and the two previous baud periods. Hence, AND gate 60 also determines certain data samples to be countable data samples.

Since either of these data sample patterns are to be accepted as indications of countable data samples in the manner and for the purposes set out above, the outputs of AND gates 59 and 60 are supplied to an OR gate, 61. OR gate 61 provides an output signal, UPDATE ENABLE, indicating that one or the other of the pertinent data sample patterns has occurred over the current baud period and the two previous baud periods. Thus, the UPDATE ENABLE signal indicates that the data sample in the previous baud period was a countable data sample, a data sample obtained when an increasing or decreasing pattern incoming baseband analog signal portion passed through the center expected incoming signal level of zero volts.

A data sample, obtained from the incoming baseband analog signal in the current baud period, will have an amplitude occurring nominally at either the upper expected incoming signal level or at the lower expected incoming signal level at times when the UPDATE ENABLE signal is true indicating this data sample is a member of an acceptable pair of data samples separated by a countable data sample. Such a current data sample will indicate whether the incoming baseband analog signal was in an increasing or decreasing pattern, i.e. its slope direction, positive or negative, when this signal passed through zero volts in the baud period before the current one. Hence, either one of the logic signals $(X_n > d)$ or $(X_n \leq -d)$ can serve to indicate the slope direction of the incoming baseband analog signal for each associated zero crossing event.

Thus, in FIG. 7, the logic signal $(X_n \leq -d)$ indicating whether or not the data sample obtained from the incoming baseband analog signal in the current baud period has an amplitude nominally equal to the lower expected incoming signal level has been taken as an output in FIG. 7. If logic signal $(X_n \leq -d)$ is true, a falling pattern has been detected if UPDATE ENABLE is also true. For this output, the output signal shown can be taken as either the logic signal ($X_n \leq -d$), or redesignated as the logic signal, SLOPE.

Figure 8:
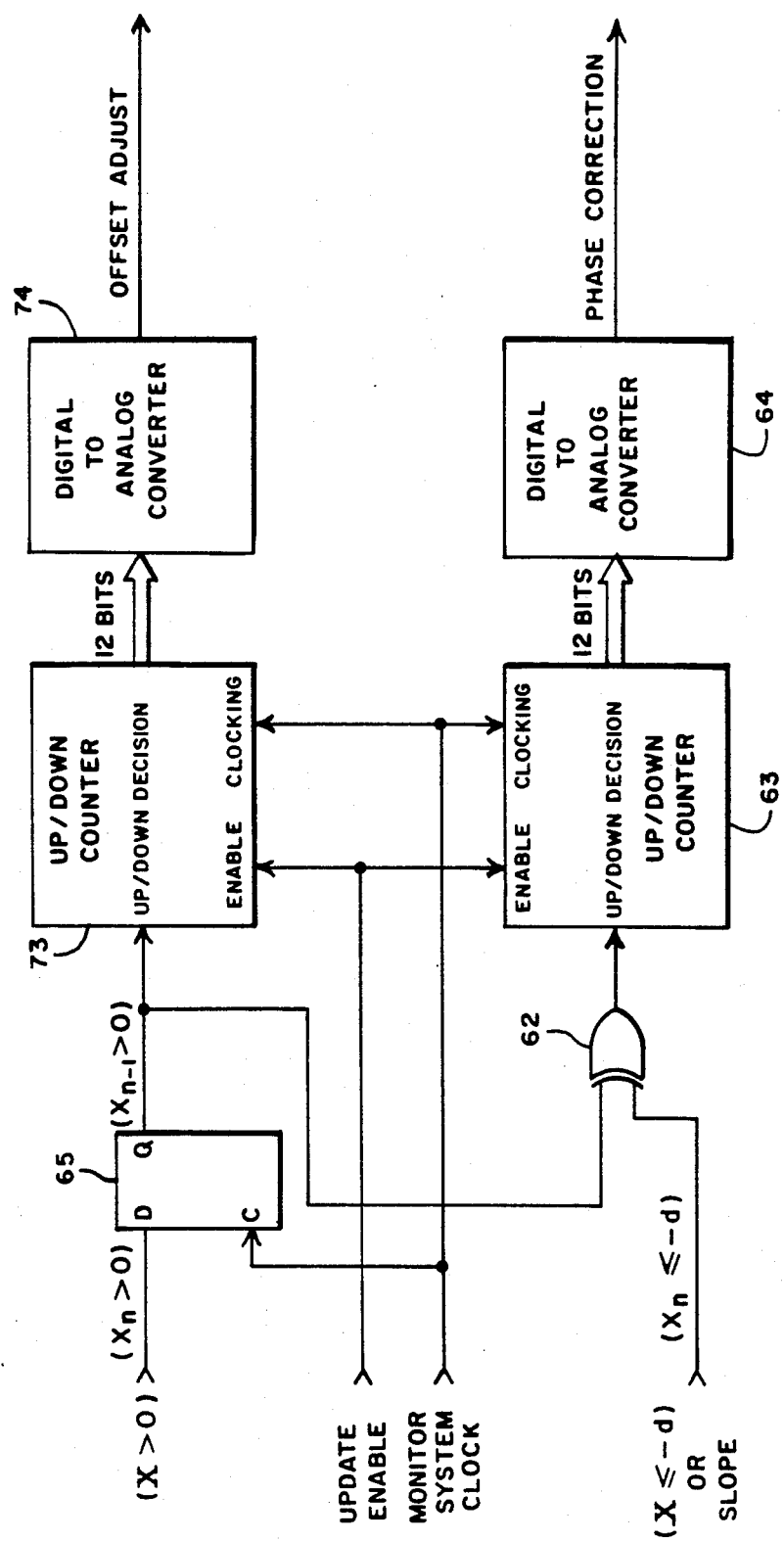

The signals UPDATE ENABLE and SLOPE are provided to the block 52 monitor system phase correction as shown in FIG. 5. FIG. 8 shows the components comprising the block 52 monitor system phase correction (and also shows the components comprising another block in the monitor system to be described at later point). The monitor system phase correction comprises an EXCLUSIVE-OR logic gate, 62, an up/down binary counter, 63 and a digital-to-analog converter, 64. Also, the monitor system phase correction 52 shares a D-type flip-flop, 65.

EXCLUSIVE-OR gate 62 determines when the sampling phase is late. If the SLOPE logic signal, i.e. ($X_n \leq -d$), is in the true state at the same time the UPDATE ENABLE logic signal is in the true state, the SLOPE logic signal indicates that the incoming baseband analog signal was in a falling pattern (during the current and two previous baud periods) when the data sample obtained from this signal in the baud period previous to the current one was nominally equal to the center expected incoming signal level. Now, in conjunction with the SLOPE logic signal and the UPDATE ENABLE logic signals both being true, the data sample from the baud period preceding the current baud period may be sampled late, i.e. the incoming baseband analog signal was directed to be sampled by the PHASE CORRECTED BAUD CLOCK signal after the time at which it went through the center expected incoming signal level of zero. Then the amplitude of this data sample will actually be negative rather than zero (for an offset free incoming signal) causing the logic signal ($X_{n-1} > 0$) to be false.

The logic signal ($X > 0$) is obtained from the amplitude range classifier as shown in FIG. 5, and for FIG. 8, this logic signal is rewritten as ($X_n > 0$) to indicate that is provided in FIG. 8 in the current baud period. Since this logic signal is supplied to D-type flip-flop 65 for storage for one baud period, the output of flip-flop 65 provides the logic signal ($X_{n-1} > 0$) which, of course represents information concerning the data sample occurring in the baud period immediately previous to the current one.

When the SLOPE logic signal is true and when the ($X_{n-1} > 0$) signal is false, there will be an output from EXCLUSIVE-OR gate 62 which indicates that the sampling phase is late. Similarly, if the data sample from the baud period previous to the current one is indicated by a true UPDATE ENABLE logic signal to have occurred when the incoming baseband analog signal was nominally equal the center expected incoming signal level, and this signal was in a rising signal pattern, the SLOPE logic signal will be false. Then, the actual amplitude of this data sample will be positive with respect to the center expected incoming signal level of zero if the sampling directed by the PHASE CORRECTED BAUD CLOCK signal, is late because the incoming baseband logic signal (assumed offset free) will have passed through zero before the sampling has occurred. That is, if the sampling phase is late, the logic signal ($X_{n-1} > 0$) will be true. The two logic signals, SLOPE and ($X_{n-1} > 0$), occurring in the opposite logic state, will cause the EXCLUSIVE-OR gate 62 to again provide a true output indicating that the sampling phase is late. Thus, sampling late will produce a true state in the EXCLUSIVE-OR gate 62 output as the indication that the sampling phase is late for either an increasing or a decreasing pattern incoming baseband analog signal portion passing through zero.

On the other hand, it may be shown that the sampling of increasing or decreasing incoming baseband analog signal portions early, at times when this incoming signal is nominally equal to the center expected incoming signal level, will cause EXCLUSIVE-OR gate 62 to have a false state output at, of course, times when the UPDATE ENABLE logic signal is true. Thus, the situation of early samplings of increasing or decreasing pattern incoming baseband analog signal portions, at times when the signal amplitude nominally equals the center expected incoming signal level, will lead to false states at the output of EXCLUSIVE-OR gate 62 when the UPDATE ENABLE signal is true. This situation indicates there has been a countable data sample in the baud period immediately previous to the current one.

The output signal from EXCLUSIVE-OR gate 62 is provided to the up/down decision input of counter 63 to control the counting direction therein, and the UPDATE ENABLE logic signal is provided to counter 63 to enable its counting. Then, the MONITOR SYSTEM CLOCK signal acts to cause the count total kept in counter 63 to be altered in each baud period, but can do so only when counter 63 is enabled by the UPDATE ENABLE signal being at the true logic value. When the output of EXCLUSIVE-OR gate 62 is in the true state, counter 63 will increase the count total therein by one count, i.e. increase its count total by one count in response to the circumstance occurring that the sampling phase is late. When the sampling phase is early, counter 63 will decrease the count total therein by one count in response to the false state appearing at the output of EXCLUSIVE-OR gate 62. A preponderance of counts, in either the up direction or the down direction, leads to a count total in counter 63 indicating that the sampling is not being correctly directed in time by the PHASE CORRECTED BAUD CLOCK signal with respect to the incoming baseband analog signal, at least for the points of the incoming signal intended to equal the center expected incoming signal level.

Once again, only the twelve most signficant bits of the count total in counter 63 are provided to converter 64. Again, to increase the time constant of the phase correction feedback loop, counter 63 is typically capable of keeping a count total of somewhere around $2^{20}$ counts. Thus, the time constant for the phase correction loop can be adjusted by the total number of counts permitted to accumulate in counter 63 to thereby satisfy the requirement that the feedback loop only compensates for relatively slow acting causes of phase shift errors.

Figure 9A:
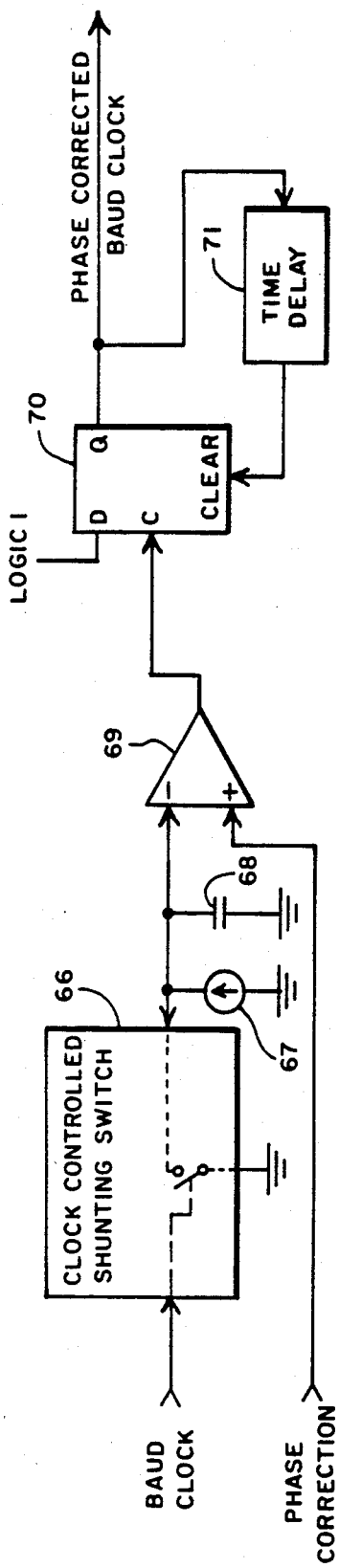
FIGS. 9A, 9B and 10 show a voltage controlled phase shifter in connection with the present invention.

The signal provided by converter 64, the signal PHASE CORRECTION, is provided to control the amount of phase shift introduced by phase shifter 51 into the BAUD CLOCK timing signal received from the receiver phase-lock loop 50 to form the PHASE CORRECTED BAUD CLOCK signal. The signal PHASE CORRECTION, the analog voltage signal provided by converter 64 which controls phase shifter 51, is also shown provided in FIG. 9A. FIG. 9A is a system diagram for the controlled phase shifter block 51 in FIG. 5.

In FIG. 9A, a clock controlled shunting switch, 66, is connected across a current source, 67, and a capacitor, 68. Current source 67 acts to charge capacitor 68 whenever switch 66 is open; however, when switch 66 closes, capacitor 68 is discharged and the current from current source 67 is shunted to ground.

Figure 9B:
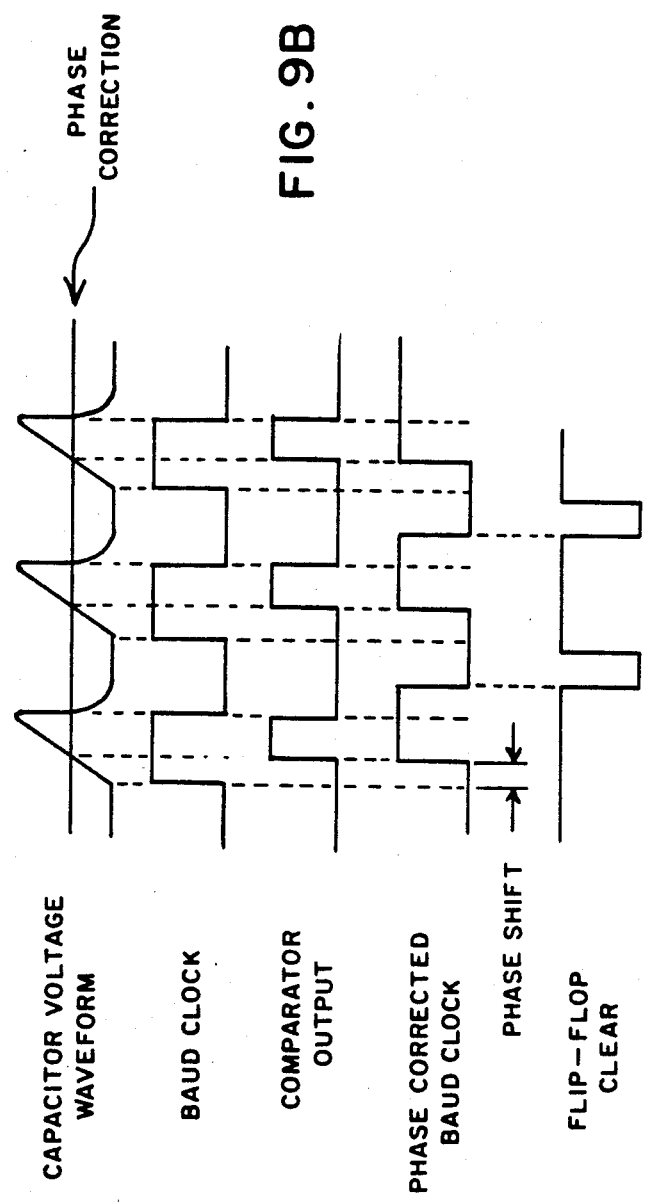

Switch 66 is controlled by the BAUD CLOCK timing signal, a sample overtime being shown in FIG. 9B. The leading edge of the BAUD CLOCK signal opens the shunting switch to permit current source 67 to charge capacitor 68 leading to a voltage waveform across this capacitor which is approximately a linear function of time. The trailing edge of the BAUD CLOCK signal closes switch 66 to discharge capacitor 68. A portion of the resulting voltage waveform across capacitor 68 as a function of time is shown in FIG. 9B. Voltage plotted on the ordinate axes in FIG. 9B becomes more positive in the upward direction. This capacitor voltage waveform is the voltage applied to the inverting input of an analog comparator, 69.

The non-inverting input of comparator 69 receives the PHASE CORRECTION signal from the monitor system phase correction block 52. The slowly changing PHASE CORRECTION signal appears to be a nearly unvarying, direct voltage insofar as the controlled phase shifter system 51 is concerned, and is therefore shown as a horizontal line across the capacitor voltage waveform in FIG. 9B, at an arbitrary level by way of example. When the capacitor voltage waveform rises to the level of this horizontal line, it is just sufficient to cause a signal level shift at the output of comparator 69. The corresponding output voltage signal of comparator 69 over time is shown in FIG. 9B where there is a dashed line from the leading edge of each comparator output pulse to the corresponding switching point on the capacitor voltage waveform of FIG. 9B. This switch point occurs where the PHASE CORRECTION signal equals, i.e. crosses, the capacitor voltage waveform at its rising or leading edge in each period of the CLOCK signal.

The output signal of comparator 69 is applied to the clock input of a D-type flip-flop, 70. A true logic state signal is continuously applied to the D input of flip-flop 70 so that flip-flop 70 will set its output to the true state every time comparator 69 has an output signal level shift upward. The result at the output of flip-flop 70 is the signal PHASE CORRECTED BAUD CLOCK. A portion of this signal over time is shown in FIG. 9B and the resulting phase shift between the BAUD CLOCK signal and the PHASE CORRECTED BAUD CLOCK signal is indicated there. Clearly, if the signal PHASE CORRECTION increases and so moves upward on the capacitor voltage waveform shown in FIG. 9B, the phase shift of the leading edge of the signal PHASE CORRECTED BAUD CLOCK will increase with respect to the leading edge of the signal BAUD CLOCK.

The duty cycle of the PHASE CORRECTED BAUD CLOCK signal is controlled by a time delay circuit, 71, shown in FIG. 9A. The output voltage pulse from time delay circuit 71 clears flip-flop 70 to the low level logic state in preparation for the next cycle in the BAUD CLOCK signal. The duty cycle of the signal PHASE CORRECTED BAUD CLOCK thus depends on the length of the time delay provided in time delay circuit 71. This time delay can be set by using a selected fixed delay, or it can be set by use of an automatic control loop sensing the duty cycle of the signal PHASE CORRECTED BAUD CLOCK which can provide some command against which the time delay can be adjusted to determine the duty cycle in the PHASE CORRECTED BAUD CLOCK signal. An automatically controlled delay can have the advantage of continually correcting for variable delays occurring in the circuit in which the sensing occurs due to temperature, aging, etc.

Figure 10:
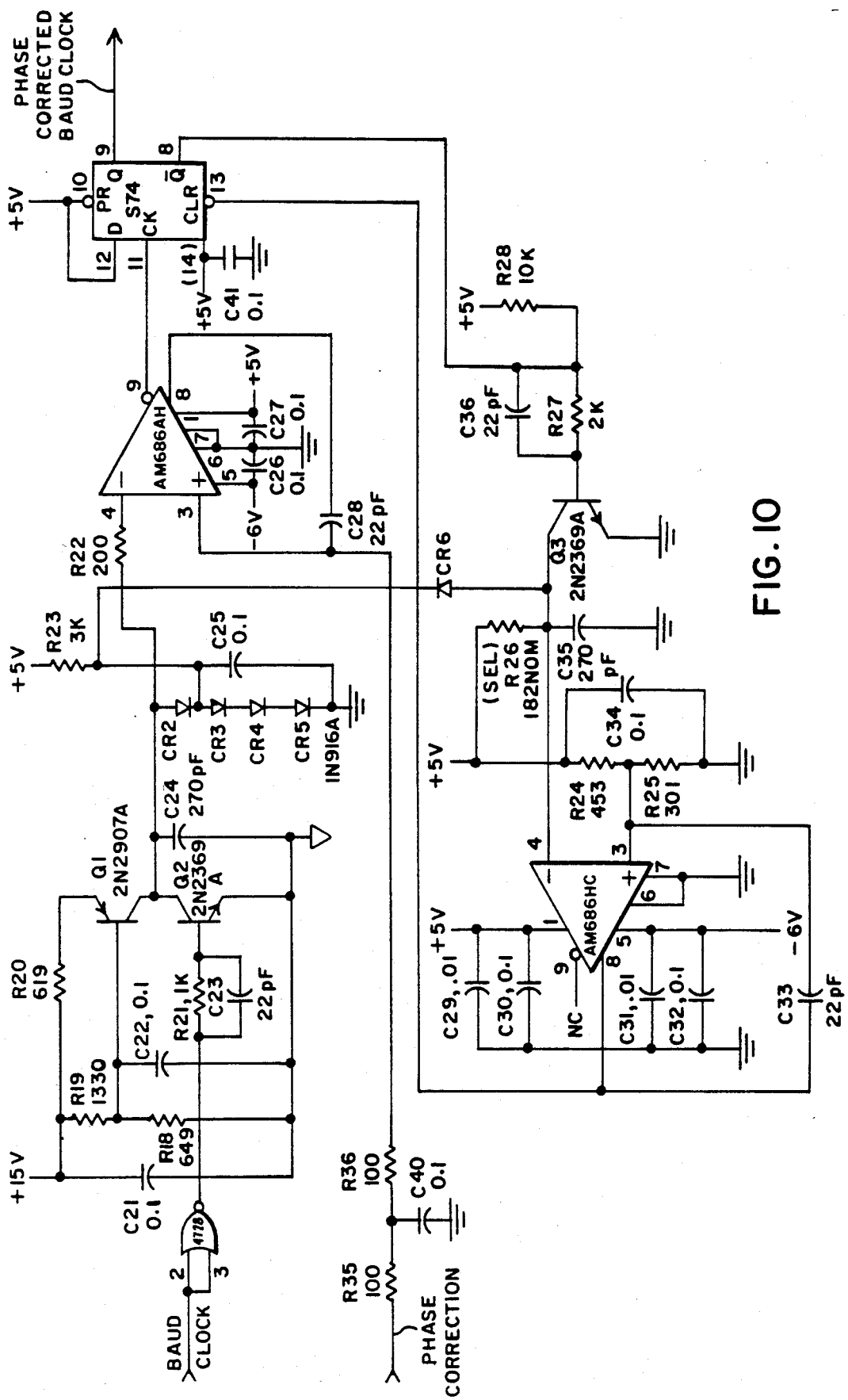

A fully developed circuit for use as a voltage controlled phase shifter is shown in FIG. 10 which is satisfactory for use with a BAUD CLOCK signal of approximately 12.5 megahertz presented in a $T^2L$ signal format. The duty cycle for the FIG. 10 circuit is provided by a fixed delay to result in approximately a 50% duty cycle in the PHASE CORRECTED BAUD CLOCK signal.

Current source 67 of FIG. 9A is implemented in FIG. 10 by a transistor, Q1, a capacitor, C22, and three resistors, R18, R19 and R20. Capacitor 68 in FIG. 9A has a corresponding capacitor in FIG. 10 designated C24. For the BAUD CLOCK signal shown in FIG. 9B, having approximately a 50% duty cycle, capacitor C24 in FIG. 10 is allowed to charge for one half cycle of the BAUD CLOCK signal while being discharged on the other half cycle. Such a charging and discharging cycle would allow a total phase shift correction of approximately 180°. However, by extending the BAUD CLOCK signal duty cycle, the circuit of FIG. 10 can provide phase correction to nearly 360°.

Switch 66 in FIG. 9A controls the charging of capacitor 68 there. The counterpart, in FIG. 10, of switch 66 in FIG. 9A, for controlling the charging of capacitor C24 in FIG. 10, is implemented by a transistor, Q2, which is driven by the BAUD CLOCK signal through a $T^2L$ NOR gate, 4728, and by a resistor, R21, in parallel with capacitor C24. A set of diodes, CR2, CR3, CR4, and CR5, plus a capacitor, C25, provide voltage protection for a voltage comparator, AM686AH, to prevent excessive voltages from being applied thereto. This voltage comparator is a counterpart of comparator 68 in FIG. 9A.

The linearly rising voltage occurring across capacitor C24, as a result of its being charged by a current source as described above, is compared with the PHASE CORRECTION signal, provided from the monitor system phase correction block 52, by the voltage comparator AM686AH. In doing so, input filtering for the PHASE CORRECTION signal is provided by a combination of resistors, R35 and R36, along with a capacitor, C40. A resistor, R22, couples the voltage developed across capacitor C24 to the voltage comparator and serves to prevent oscillation. Some capacitors, C26, C27, and C28, are used in conjunction with the voltage comparator AM686AH for proper operation of that comparator in a well known manner.

Voltage comparator AM686AH of FIG. 10 drives a flip-flop, S74. This flip-flop, in FIG. 10, is a counterpart of flip-flop 70 in FIG. 9A. The falling edge of the PHASE CORRECTED BAUD CLOCK signal taken from the output of flip-flop S74 in FIG. 10 is generated by clearing this flip-flop after a fixed time delay so as to generate again a 50% duty cycle in the PHASE CORRECTED BAUD CLOCK signal. This fixed time delay is, of course, one half the period of the BAUD CLOCK signal.

The time delay is implemented with another voltage comparator, AM686HC, a transistor, Q3, and the related components shown thereabout in FIG. 10. The diodes CR3, CR4 and CR5, plus capacitor C25, along with a further diode, CR6, provide voltage protection for the voltage comparator AM686HC to prevent excessive voltages from being applied thereto.

When the signal PHASE CORRECTED BAUD CLOCK shifts up to form a leading edge of voltage pulse therein, the signal at the complementary output of flip-flop S74 falls causing transistor Q3 to turn off. This allows a capacitor, C35, to charge through a resistor, R26. The time constant of this charging of capacitor C35 provides a time delay and therefore controls the duty cycle. The voltage across capacitor C35 is compared to a fixed reference voltage, generated by two resistors, R24 and R25. This comparison is effected by the voltage comparator AH686HC. When the voltage across capacitor C35 exceeds the fixed reference voltage so generated, this comparator has a level shift at its output which acts to clear flip-flop S74 to generate the falling edge of the PHASE CORRECTED BAUD CLOCK.

After flip-flop S74 is cleared, the complementary output of flip-flop S74 goes to the true or high logic state. This turns on transistor Q3 to discharge capacitor C35 and thereby resets the time delay circuit in FIG. 10.

Turning now to the system diagram of FIG. 5, the incoming baseband analog signal may not be symmetrical about points in this signal intended to equal the center expected incoming signal level, usually as a result distortion in the generating or processing of signals in the digitally based communications channel. The result is that there appears to be an offset between the center expected incoming signal level of zero volts and the points in the incoming baseband analog signal intended to equal the center expected incoming signal level. For proper monitor system performance, the points in the incoming baseband analog signal which are intended to be at the center expected incoming signal level should be maintained there for at least three reasons.

First, the phasing of the data samples sought to be corrected in the phase correction feedback loop just described will not fully correct if the intended center expected incoming signal level points in the incoming baseband analog signal do not occur at the center expected incoming signal level. Secondly, the value of the LOWER LEVEL and UPPER LEVEL EXPECTED LEVEL SIGNALS will not reflect the actual lower and upper expected incoming signal levels being measured with respect to the reference zero volts of the center expected incoming signal level if the intended center expected incoming signal level points in the incoming baseband analog signal are not properly at zero volts. Finally, maintaining at zero volts the points in the incoming baseband analog signal intended to equal the center expected incoming signal level of zero volts allows an independent and correct determination of the upper expected incoming signal level when the lower expected incoming signal level is determined the manner shown in FIG. 5, even though there is asymmetry in the incoming baseband analog signal.

The causes of offset in the input baseband analog signal are usually relatively showly changing if they are changing at all. Thus, a slow-acting feedback loop again is satisfactory for countering offsets of this nature in the incoming baseband analog signal. This is accomplished in the monitor system of FIG. 5 by using a combining circuit, 72, to combine the incoming baseband analog signal with a signal, the OFFSET ADJUST signal, which is just sufficient to counter any offset occurring in the incoming baseband analog signal. Combining circuit 72 can be provided by a well known operational amplifier circuit.

The OFFSET ADJUST signal is provided by the components comprising a monitor system offset adjust block, 73, appearing in FIG. 5. Monitor system offset adjust 73 operates in conjunction with the monitor system update enable 53 and the amplitude range classifier to provide the OFFSET ADJUST signal. The components comprising monitor system offset adjust 73 can be found in FIG. 8 which also shows the components comprising the monitor system phase correction as earlier noted.

Assume that the data sample phasing is correct, but that there is a positive voltage offset in the incoming baseband analog signal. Then the amplitude value X of a data sample, obtained from such an incoming baseband analog signal in a baud period when this signal is intended to be at the center expected incoming signal level of zero volts, will be positive regardless of the slope direction of the incoming baseband analog signal. That is, regardless of whether the incoming baseband analog signal is increasing or decreasing at the time this signal is intended to have an amplitude value equal to the center expected incoming signal level. Therefore, the logic signal $(X>0)$ will have a true value for a data sample obtained from this incoming baseband analog signal in a baud period during which this signal is intended to equal the center expected incoming signal leve. Again, in FIG. 8, the logic signal $(X>0)$ is rewritten as $(X_n>0)$ to indicate that the logic signal is with reference to a data sample taken in the current baud period.

When the UPDATE ENABLE signal is true, the data sample in the baud period immediately previous to the current baud period had an amplitude intended to equal the center expected incoming signal level and this previous baud period data sample is, as usual, designated $X_{n-1}$. Hence, flip-flop 65 stores the $(X_n>0)$ logic signal to thereby provide at the output of this flip-flop the logic signal $(X_{n-1}>0)$ which provides amplitude information concerning the data sample taken in the baud period immediately previous to the current one.

So, when the signal UPDATE ENABLE is true, indicating that the data sample taken in the baud period immediately previous to the current one was intended to occur at the center expected incoming signal level, and the logic signal $(X_{n-1}>0)$ is in the true state, the offset in the baseband analog signal is indicated to be positive. An up/down binary counter, 73, in FIG. 8 receives the MONITOR SYSTEM CLOCK signal at its clocking input, the logic signal $(X_{n-1}>0)$ at its up/down decision input for determing counting direction, and the logic signal UPDATE ENABLE at the counter enabling input to enable counter 73 to change the count total kept therein. The MONITOR SYSTEM CLOCK signal acts to cause the count total kept in counter 73 to be altered in each baud period but only when the UPDATE ENABLE signal is in the true state indicating, as just stated, that the data sample provided in the baud period immediately previous to the current one was intended to have an amplitude value equal to the center expected incoming signal level. The direction of this count alteration is controlled by the logic signal $(X_{n-1}>0)$ which directs the counter 73 to increase the count total therein by one count in the baud period whenever this logic signal is in the true state indicating, again as just set out, that the offset in the input baseband analog signal is positive. If the logic signal $(X_{n-1}>0)$ is in the false state, indicating the offset is negative, the count total in the counter 73 is decreased by one count if the UPDATE ENABLE logic signal is in the true state. The net of the count increase over the count decreases, positive or negative, represents the offset magnitude and its polarity.

Once again, there are 12 output taps from counter 73 which present the twelve most significant bits of the count total number in counter 73 to a digital-to-analog converter, 74. As indicated, the offset adjustment loop is to be a slow-acting loop so that the counter 73 again can keep a count total having a maximum of typically $2^{20}$. The count capability beyond $2^{12}$ represents dividing the counts accumulating in counter 73 by $2^8$ before transfer to converter 74 to thereby increase the time constant occurring in the offset adjust loop.

The analog voltage provided at the output of converter 74 forms the signal OFFSET ADJUST. This signal is, as earlier set out, provided to combining circuit 72.

At this point, the first kind of primary feedback loop presented in FIG. 5, including both the slow-acting, amplitude control feedback loop and the slow-acting, expected signal level determining feedback loop, associated with the developing of the upper and lower expected level signals, respectively, have been described. Further, the associated control loops in FIG. 5 for properly timing and sampling the incoming baseband analog signal and for countering any offset occurring in this signal have also been described. Now, the description of the second and final kind of primary feedback loop appearing in FIG. 5 ensues. That is, there is now described the feedback loops for providing dispersion signals of a magnitude to keep selected pseudo error rates constant. Such dispersion signals serves as measures of the dispersion of the perturbations about expected incoming signal levels occurring in the incoming signal delivered to the user at the receiver, perturbations due to signal degradation occurring in the digitally based communication channel.

Again, the function of the constant pseudo error rate control loop in the basic system of FIG. 5 is to adjust the magnitude of the dispersion signal, $a_1$, involved in the FIG. 3 dispersion determined lower offset threshold $-(2d-a_1)$. $a_1$ is a measure of the dispersion of the degradation caused signal perturbations about the lower expected incoming signal level as these signal perturbations change in average magnitude. This $a_1$ magnitude is adjusted so that of the data samples obtained from the input baseband analog signal, those data samples intended to have amplitudes equal to the lower expected incoming signal level have actual amplitudes such that selected constant fractions of them occur above and below the dispersion determined lower offset threshold of FIG. 3, $-(2d-a_1)$ volts.

The time response of the constant pseudo error rate feedback loop, i.e. pseudo error detector, must be substantially faster than the time response of the other feedback loops in the monitor system discussed previously. This is so because the dispersion signal $a_1$ is desired to be used as a predictor of the baud error rates (BER) occurring in the digitally based communications channel as indicated in FIG. 4. Therefore, the dispersion voltage $a_1$ must follow fairly closely the relatively rapid changes in the sources of signal degradation affecting the signals transmitted in the digitally based communications channel for delivery to the user at the receiver therein.

On the other hand, the time constant for the response of the constant pseudo error rate feedback loop cannot be too fast if a sufficient number of pseudo errors are to occur within a duration equal to one time constant to thereby avoid undue statistical fluctuation in the dispersion signal developed in the loop. Hence, the time constant must be much more carefully chosen for constant pseudo error rate feedback loops and a derivation of the loop time constant is given after the description of the loop apparatus and operation immediately following.

Turning to the system diagram of FIG. 5, the signal LOWER LEVEL FIRST DISPERSION, $a_1$, is seen to be developed within a lower level first constant pseudo error rate block, 75. Signal $a_1$ is then combined with the LOWER LEVEL EXPECTED LEVEL SIGNAL, $-2d$ volts, in a combining circuit, 42. The output of the combining circuit, $-(2d-a_1)$, is then used as one of the comparator reference signals in the amplitude range classifier, in particular, as a reference signal for amplitude range classifier comparator 22. Hence, comparator 22 has a varying reference signal supplied thereto rather than a constant reference signal. The input amplitude range classifier is operated in all respects, just as previously described, for use here with constant pseudo error rate feedback loops.

Figure 11:
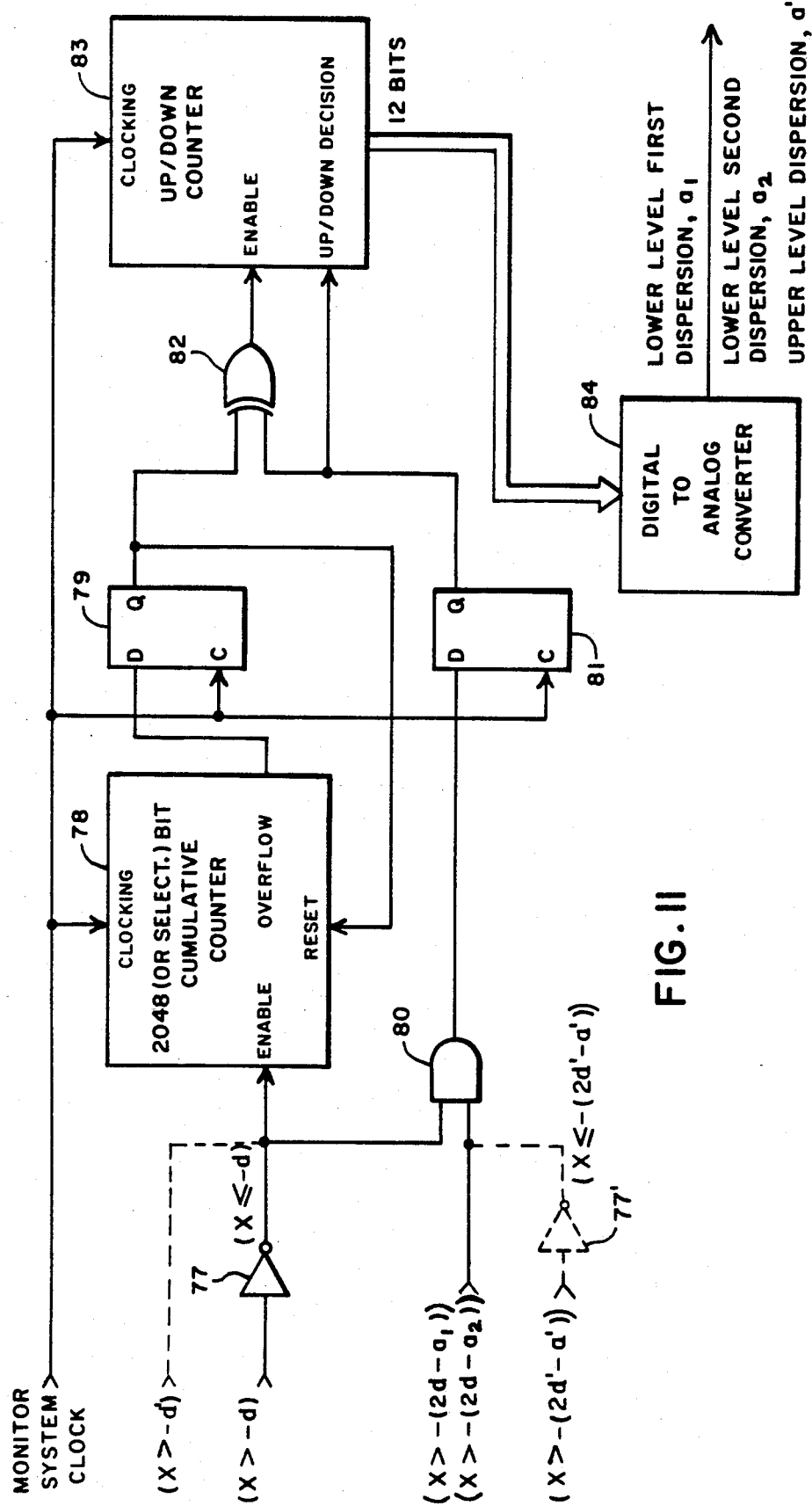
FIG. 11 shows the present invention in connection with developing certain dispersion level signals.

The components comprising lower level first constant pseudo error rate block 75 are shown in FIG. 11 (as well as showing the components for the other constant pseudo error rate feedback loops in the monitor system of FIG. 5 which have other, different input and output signals). The logic signal $(X > -d)$ is supplied to an inverter, 77, leading to the logic signal $(X \leq -d)$ at the output of inverter 77. Logic signal $(X \leq -d)$ indicates whether a data sample having amplitude X, obtained from the input baseband analog signal, is judged to have been intended to have an amplitude equal to the lower expected incoming signal level. The logic signal $(X \leq -d)$ is supplied to the enable input of a 2048 bit cumulative binary counter, 78, to enable counter 78 to increase the count total kept therein. The MONITOR SYSTEM CLOCK signal, supplied to the clocking input of counter 78, acts to cause the count total kept in counter 78 to increase by one count once in each baud period but only when counter 78 is enabled. Since, as just stated, enabling is provided by logic signal $(X \leq -d)$, the count total is increased in counter 78 by one count for each data sample judged to have an intended amplitude equal to the lower expected incoming signal level.

Counter 78 will provide a true signal at its overflow output when the count total kept therein reaches the maximum count total which can be stored therein of 2048 counts, and this true state signal operates on a connected D-type flip-flop, 79, which is synchronized by the MONITOR SYSTEM CLOCK signal. The output of flip-flop 79 is connected to the reset input of counter 78. A true state of the overflow output signal in counter 78, stored for a baud period in flip-flop 79 results, after the baud period, in resetting counter 78 to a zero count total and in returning the overflow output signal at the overflow output of this counter to the false state. The end result is that flip-flop 79 provides at its output a true state logic signal for one baud period after the counting of 2048 data samples having amplitude values judged to be intended to equal the lower expected incoming signal level.

In practice, the reset signal from flip-flop 79 to counter 78 is not essential if the maximum count total capability of counter 78 is an integer power of 2, i.e. $2^n$, because binary counters are available designed such, that upon receiving one further clock pulse after reaching the counter maximum count total capability, the binary counter provides a true state overflow signal for one baud period and then returns the count total keep therein to a value of zero. On the other hand, the provision of flip-flop 79 with a reset signal line connection to counter 78 provides more design freedom. Counter 78 can then be a binary counter which will provide an overflow output signal true state upon reaching arbitrary count totals that are not integer powers of 2 and thereafter will reset to a zero count total.

The logic signal $(X \leq -d)$ is also provided to AND gate, 80, as is the logic signal $(X > -(2d-a_1))$. As earlier stated, when the logic signal $(X \leq -d)$ is in the true state, the corresponding data sample obtained from the input base-band analog signal has an amplitude value X is interpreted to nominally equal the lower expected incoming signal level. Further, when the amplitude of this data sample is also more positive than the dispersion determined lower offset threshold value from FIG. 3, $-(2d-a_1)$ volts, then the logic signal $(X \leq -(2d-a_1))$ is also in the true state. With both of these signals in the true state, AND gate 80 is in a true state at the output thereof which activates the D input of a connected D-type flip-flop 81. With the MONITOR SYSTEM CLOCK signal provided to the clocking input of flip-flop 81 also, flip-flop 81 provides a true state logic signal at its output in the succeeding baud period after AND gate 80 goes to a true state at its output.

The output signal from the AND gate 80 going to the true state indicates the occurrence of a pseudo error as earlier defined herein. This is because the amplitude of the data sample in the current baud period has been determined, by the truth of the logic signals $(X \leq -d)$ and $(X > -(2d-a_1))$, to have a value between the lower level decision circuit threshold, $-d$ volts, and the dispersion determined lower offset threshold, $-(2d-a_1)$ volts.

To refresh, the term pseudo error is used because a true state output from AND logic gate 80 provides, as just set out, the information that perturbations about the lower expected incoming signal level in the incoming base-band analog signal have led to a data sample having an amplitude in the range $-d$ volts to $-(2d-a_1)$ volts, a range which indicates potential for actual errors occurring in the digitally based communications channel. Since the number of pseudo errors is kept constant by the pseudo error detector feedback loop, this range must narrow in response to perturbations increasing on the average, with this narrowing occurring through the dispersion determined lower offset threshold $-(2d-a_1)$ increasing, i.e. through $|a_1|$ increasing, as $-d$ is fixed. As this range narrows in response to increasing perturbations, i.e. increased degradation in the incoming baseband analog signal, the deviations from the lower expected incoming signal level may produce actual errors in the decision circuits of the receiver in the digitally based communications channel because the decision point in these circuits is set at a $-d$ volts, the lower level decision circuit threshold of FIG. 3.

Where the perturbations in the incoming baseband analog signal are especially great, so great as to exceed the decision margin separating the lower expected incoming signal level of $-2d$ volts and the lower level decision threshold of $-d$ volts Decision margin $= |-2d-(-d)| = d$.

rather than being merely larger than the pseudo error rate margin,

Pseudo error rate
margin $= |-2d-[-(2d-a_1)]| = a_1$.

actual errors will occur. Hence, those data samples having amplitude values nominally equal the lower expected incoming signal level, but which are perturbed to such an extent as to have amplitude deviations occurring outside of the pseudo error rate margin, represent pseudo errors. However, if these data samples are so perturbed as to have amplitude deviations outside the decision margin, they are actual errors.

Because flip-flop 79 is used to provide a reset signal for counter 78, a one baud period delay occurs after which the overflow output signal of counter 78 is available for further signal processing. Also, another D-type flip-flop, 81, is provided to synchronize the signal pulse edges at its output, obtained from the pseudo error indication signal provided at the output of AND gate 80, with the signal pulse edges provided at the output of flip-flop 79.

The output of flip-flop 79 and the output of flip-flop 81 are each connected to a respective input of an EXCLUSIVE-OR logic gate, 82. Further, the output from logic gate 81 is additionally connected to the up/down decision input of an up/down binary counter, 83. The enable input of up/down counter 83 is connected to the output of EXCLUSIVE-OR logic gate 82. The MONITOR SYSTEM CLOCK signal is provided to the clocking input of counter 83 and acts to cause the count total kept therein to be altered one count in each baud period but only when counter 83 has been enabled by a true signal at its enable input.

The goal in the arrangement of connections just described is to have the LOWER LEVEL FIRST DISPERSION signal $a_1$ be adjusted until the average rate at which pseudo errors are indicated to have occurred at the output of flip-flop 81 just equals the rate at which overflow indications from counter 78 appear at the output of flip-flop 79. The arrangement of FIG. 11 leads to having the count total stored in counter 83 increase so long as the average rate of pseudo errors indicated at the output of flip-flop 81 exceeds the desired rate of one pseudo error for each 2048 data samples having amplitudes nominally equal to the lower expected incoming signal level.

This can be seen by noting that when the delayed overflow signal at the output of flip-flop 79 is such that the output of flip-flop 79 is in the false state and a delayed pseudo error signal at the output of flip-flop 81 is such that the output of flip-flop 81 is in the false state, the output of EXCLUSIVE-OR logic gate 82 is in the false state which prevents counter 83 from increasing its count total. Should a true state occur at the output of flip-flop 81, indicating a pseudo error, without a corresponding true state occurring at the output of flip-flop 79, indicating an overflow has occurred, the EXCLUSIVE-OR logic gate 82 will have its output in a true state enabling counter 83 to alter the count total kept therein in the corresponding baud period. Since the output of flip-flop 81 is in the true state, this true state also operates the up/down decision input of counter 83 to cause that counter to increase the count total kept therein by one count in that baud period. That is, the occurrence of a pseudo error without a corresponding overflow indication leads to counter 83 increasing the count total kept therein.

On the other hand, the occurrence of a true state at the output of flip-flop 79, indicating that an overflow pulse has occurred, but without a corresponding true state output at the output of flip-flop of 81, indicating a pseudo error, the EXCLUSIVE-OR logic state 82 again has a true state output which enables counter 83 to count. However, in this situation, the lack of a true state at the output of flip-flop 81—because there has been no occurrence of a pseudo error—leads to the flip-flop 81 false state operating the up/down decision input of counter 83 such that this counter now decreases the count total therein by one count in the corresponding baud period.

Finally, if there is both a true state at the output of flip-flop 79, indicating an overflow has occurred, and a true state at the output of flip-flop 81, indicating that a pseudo error has been detected, the output of EXCLUSIVE-OR logic gate 82 will be in the false state which prevents counter 83 from altering the count total kept therein in the corresponding baud period. This is equivalent to having had the counter 83 increase its count total by one count in response to a pseudo error indication at the output of flip-flop 81, in the manner previously set out, and to have had this counter decrease its count total kept therein by one count in response to an overflow indication appearing at the output of flip-flop 79, as previously set out. The net result is that the count total in counter 83 would remain unchanged which is just the result achieved by preventing the enablement of this counter.

Thus, the count total kept in counter 83 will increase so long as the average rate of pseudo errors detected by the monitor system is larger than one for every 2048 data samples having amplitudes nominally equal to the lower expected incoming signal level, and the count total kept therein will decrease if the number of pseudo errors occurs in a ratio to such data samples that is less than one in 2048.

Again, the twelve most significant bits of the count total kept in counter 83 are provided to a digital-to-analog converter, 84. Converter 84 provides an analog voltage signal at its output which forms the LOWER LEVEL FIRST DISPERSION signal, $a_1$. The maximum count total capability of counter 83 is discussed below in connection with the time constant for this feedback loop.

An increasing count total in counter 83 will cause the output voltage from converter 84 to increase. As the converter output signal, $a_1$, increases so that there is an increasing dispersion determined lower offset threshold $-(2d-a_1)$, i.e. an increasing pseudo error threshold, there will be a corresponding decrease in the pseudo error rate. On the other hand, if the pseudo error rate is less than one pseudo error per 2048 data samples having amplitudes judged nominally equal to the lower expected incoming signal level, counter 83 will count down thereby decreasing the LOWER LEVEL FIRST DISPERSION signal $a_1$ which causes the dispersion determined lower offset threshold $-(2d-a_1)$ to also decrease thereby increasing the pseudo error rate.

The choice of 2048 bits for the count total capability of counter 78 is to a substantial extent arbritary, depending on what point one desires to use for indicating the extent of dispersion on the probability density curve associated with the distribution of perturbations, or deviations, from the lower expected incoming signal level in the input baseband analog signal. The arrangement of FIGS. 5 and 11 amounts to recurrently taking 2048 data samples, just those samples from among the data samples obtained from the input baseband anlog signal which are judged nominally equal to the lower expected incoming signal level, to form sampling distributions of 2048 samples each. The FIG. 11 arrangement adjusts the dispersion determine lower offset threshold $-(2d-a_1)$, by adjusting the LOWER LEVEL FIRST DISPERSION signal $a_1$, to a point where on the average only one of these sample points in each sampling distribution occurs in the tail of the sampling distribution beyond the lower level offset threshold, $-(2d-a_1)$. With the earlier assumption that the probability density curve for the signal perturbations is normal, the sampling distributions are also normally distributed with a mean value of zero and a standard deviation equal to $\sigma$. Then, arranging to have this one data sample, a pseudo error, to occur in the tail of the probability density curve for the sampling distribution of the 2048 data samples having amplitudes nominally equal to the lower expected incoming signal level, is equivalent to having the lower level offset threshold at a point in the sampling distribution probability density curve approximately equal to $3.3\sigma$.

Thus, the LOWER LEVEL FIRST DISPERSION signal $a_1$ is a measure of dispersion of the sampling distribution by being related to the standard deviation thereof. The number of standard deviations which the lower level offset threshold represents can be altered by changing from 2048 the count total maximum which, when exceeded, leads to an overflow of counter 78.

Because counter 78 represents the samples in the sampling distribution, counter 78 may be termed the distribution counter. Since counter 83 serves to determine the LOWER LEVEL FIRST DISPERSION signal $a_1$, counter 83 may be termed the dispersion counter.

Again, the time constant for the constant pseudo error rate feedback loop, or pseudo error detector, is determined by the number of additional counts which can be kept in counter 83 beyond the $2^{12}$ counts represented by the 12 taps which are connected to converter 84. Of course, a second counter could be used connected serially with the counter supplying a 12 bit representation of the count total to converter 84 for increasing the maximum count total capability in the feedback loop. As stated above, the constant pseudo error rate feedback loop must respond considerable faster than the other feedback loops in the monitor system described previously. Thus, there will be a lower maximum total count capability in counter 83 than the $2^{20}$ count totals approximately available in the up/down binary counters used in the feedback loops described previously. A satisfactory count total maximum for counter 83 has been found to be $2^{14}$ leading to time constants on the order of several tenths of a second over the range of error rates generally encountered.

An expression for the time constant for the constant pseudo error rate loop developing dispersion signal $a_1$ is found in the manner shown in the following. Of course, the actual time constant which is satisfactory in a particular application will depend on the rapidity with which signal degradation sources act, and so must be followed by a monitor, in a digitally based communications channel to which the monitor system is to be applied.

Figure 12:
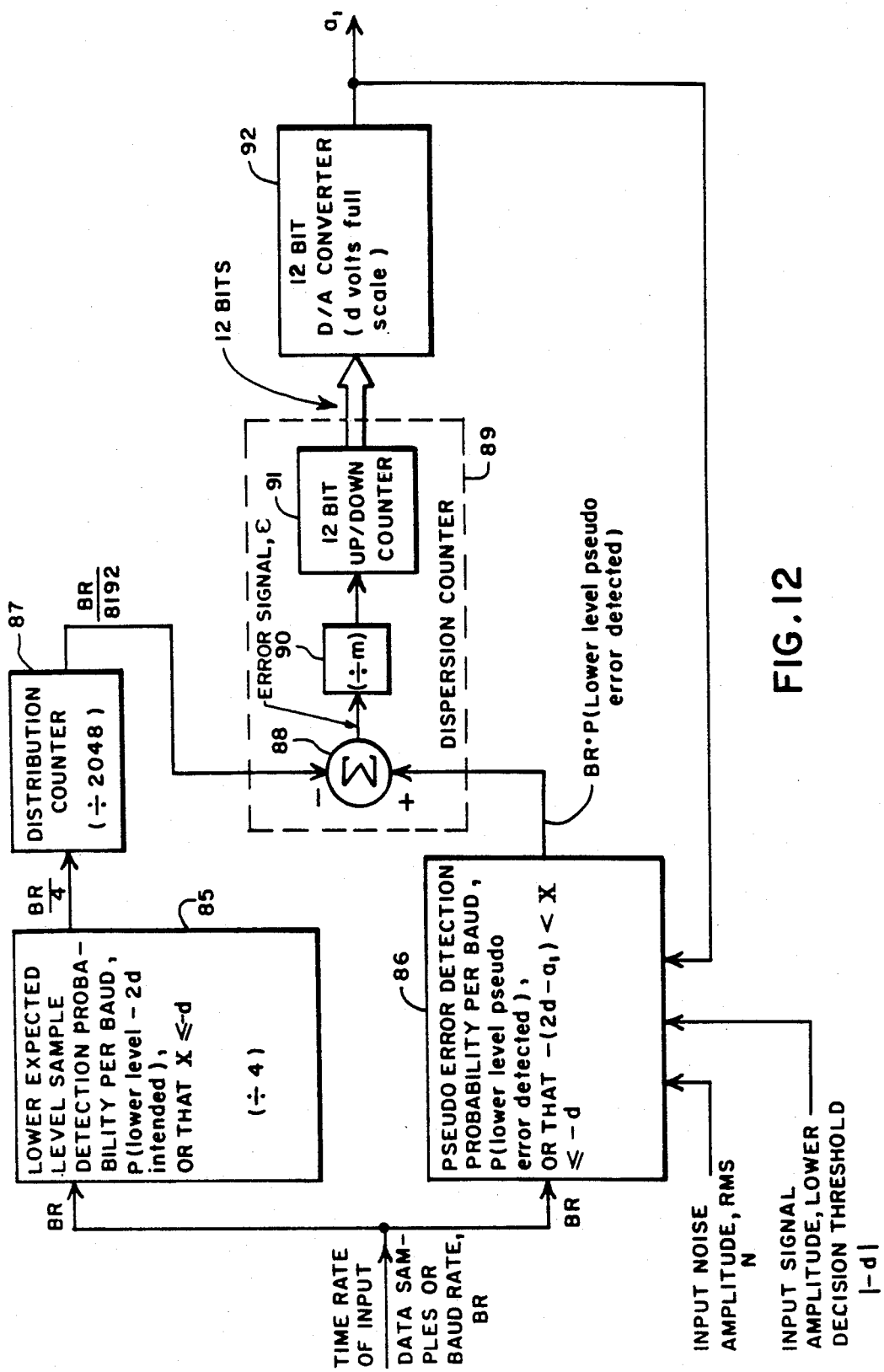
FIG. 12 is a block diagram for a dispersion signal loop.

The analysis leading to an expression for the time constant for this constant pseudo error rate feedback loop is based on the system diagram for that loop shown in FIG. 12. This system diagram shows the rate at which data samples, one in each baud period, enter the loop, i.e. the baud rate, and the rates at which the data samples can have an effect over time in the loop. As stated earlier, the baud rate, BR, for the present embodiment is approximately 12.5 megabauds/sec.

In the FIG. 12 constant pseudo error rate feedback loop, the data samples first encounter two selection processes which are represented by the blocks, 85 and 86, for purposes of the constant pseudo error rate loop. Block 85 represents the probability that the data samples are detected as having amplitudes judged nominally equal to the lower expected incoming signal level, $-2d$ volts. This probability has been set out before and again is, $$P(\text{lower level } -2d \text{ intended}) = \tfrac{1}{4}.$$

Block 86 represents the probability of a pseudo error being detected and this has been shown above for the upper expected incoming signal level to be $$P(\text{upper level pseudo error detected})$$
$$= \tfrac{1}{4}\{Q(a/N) + Q(d/N) - 2Q[(2d - a)/N]$$
$$+ Q(3d/N) - Q[(4d - a)/N]\}.$$

This calculation, of course, would hold by symmetry for the lower expected incoming signal level and could be rederived by making the proper substitutions. However, rather than making such substitutions, this analysis will rely on the foregoing derivation, and so the analysis will be made as though FIG. 12 is representing a constant pseudo error rate feedback loop associated with the upper expected incoming signal level of just the kind being described with respect to the lower expected incoming signal level. Therefore, the probability function to be associated with block 85 for this analysis is as follows:

$$P(\text{upper level } +2d \text{ intended}) = \tfrac{1}{4} = P(\text{lower level } -2d \text{ intended}).$$

While data samples are delivered to block 85 at the baud rate, BR, only a fraction of these are detected at the lower (or upper) expected incoming signal level in accordance with the probability function P(lower level $-2d$ intended) [or P(upper level $+2d$ intended)]. As indicated, the probability function to be used for block 85 is that for the upper level function P(upper level $+2d$ intended), which equals $\tfrac{1}{4}$. Hence, the expected rate of data samples at the output of block 85 is BR/4, i.e. block 85 effectively performs division by 4.

Data samples at this rate out of block 85 are supplied to distribution counter block, 87, in FIG. 12 which represents both the distribution counter 78 in FIG. 11 and associated apparatus associated therewith in that figure. Since counter 78 divides by 2048, the output rate of data samples from block 87 is shown to be BR/8192 delivered to a combining circuit, 88. The function of combining circuit 88 in FIG. 12 is performed as part of both the dispersion counter 83 in FIG. 11 and the apparatus associated therewith in that figure.

Data samples at the baud rate, BR, are also supplied to block 86 where, again, just a fraction of them are found to be pseudo errors with a probability P(lower level pseudo error detected). For the present purposes, the probability P(upper level pseudo error detected) will be used for block 86 as indicated above. The resulting expected data sample rate at the output of block 86 is (BR) [P(upper level pseudo error detected)]. Data samples at this rate out of block 86 are then also supplied to the combining function 88.

As indicated in connection with FIG. 11, the existence of pseudo errors causes the dispersion counter 83 to count in a direction leading to an increasing count total while the existence of overflow indications from distribution counter 87 causes the dispersion counter 83 to count in the opposite direction. This is faithfully matched by the combining function 88 in FIG. 12 which, as indicated previously, is a function performed by both the dispersion counter and associated hardware. Therefore, combining function 88 is shown as a part of dispersion counter 83 which is represented by a dashed block, 89, in FIG. 12.

The division block, 90, shown in FIG. 12 as a part of the dispersion counter dashed-line block 89, represents the primary variable available for setting the time constant in the constant pseudo error rate feedback loop. That is, a value must be found for m to set the time constant in the loop. Block 90 symbolizes that part of the count capacity of counter 83 in FIG. 11 not represented in supplying bits to the converter 84 in FIG. 11. Alternatively, as earlier explained, block 90 could represent a second serially connected counter.

For supplying the twelve bits to converter 84 in FIG. 11, a block 91, is shown in FIG. 12 as being a 12 bit up/down binary counter. The twelve bits at the output of block 91 are delivered to another block, 92, in FIG. 12 representing converter 84 of FIG. 11. Since the maximum voltage which would ever have to be supplied to combining circuit 42 in FIG. 5 for dispersion signal $a_1$ is d volts, which would set the pseudo error margin equal to the decision margin, the full scale output shown for block 92 is d volts. The LOWER LEVEL FIRST DISPERSION signal $a_1$ is developed at the output of block 92 in FIG. 12 just as it is at the output of converter 84 in FIG. 11.

To begin the analysis, the following definitions are first made:

$$\alpha \triangleq d/N,$$

$$\beta \triangleq a_1/d.$$

With these definitions, the equation above for P(upper level pseudo error detected) becomes as follows:

$$P(\text{upper level pseudo error detected}) \triangleq \rho(\alpha, \beta)$$
$$= \tfrac{1}{4}\{Q(\beta\alpha) + Q(\alpha) - 2Q[(2 - \beta)\alpha] + Q(3\alpha) - Q[(4 - \beta)\alpha]\}$$

where
$Q(t) = P(z > t)$ given z is normally distributed with mean=0 and variance=1.

Because of the extreme transcendental nature of the foregoing equation, iterative methods must be used for obtaining values of $\alpha$ and $\beta$. $\alpha$ can be obtained for the equation derived above for the buad error rate, BER, as follows:

$$BER = 2(1 - 1/M^2) Q(d/N).$$

For the definitions of $\alpha$ given above, this last equation becomes with M=2 for a three level partial response system, BER = 3/2 Q(d/N) = 3/2 Q (α).

This can be put in the following form indicating a solution for α:

$$\alpha \triangleq (d/N) = Q^{-1}[\tfrac{2}{3}(BER)].$$

To solve for β, the note from FIG. 12 that the following equation holds after substituting the probabilities associated with the upper expected incoming signal level for the probabilities associated with lower expected incoming signal level in the manner indicated above to yield:

$$\epsilon = +(BR) \, P(\text{upper level pseudo error detected}) - \frac{BR}{8192}$$

$$= +(BR)P(\alpha, \beta) - \frac{BR}{8192}.$$

Using the fact that the error signal, ε, in the constant pseudo error rate feedback loop in FIG. 12 goes to zero as the value of the dispersion signal $a_1$ approaches its steady state value (note that d is a constant, being held so in the FIG. 5 basic system which varies the amplitude of the incoming signals), the following implicit solution for β is obtained in terms of α in the steady state:

$$0 = (BR)\left[P(\alpha,\beta) - \frac{1}{8192}\right]\Big|_{\text{steady state}}, \ (BR) \neq 0$$

$$P(\alpha,\beta)|_{\text{steady state}} \triangleq P(\beta_\alpha, \alpha) = \frac{1}{8192},$$

where $\beta_\alpha$ is the steady state value of β for a specified value of α. Then substituting this last equation into the first equation in the present sequence of equations in this derivation, after the initial defining equations for α and β, one obtains the following;

$$\tfrac{1}{4}\{Q(\beta\alpha)+Q(\alpha)-2Q[(2-\beta)\alpha]+Q(3\alpha)-Q[(4-\beta)\alpha]\}=1/8192.$$

where $\beta = \beta_\alpha$.

With a selected value for BER, the magnitude of α may be computed from the equation for α above. Using the resulting value for α, the last equation obtained just above may be solved for the corresponding value of $\beta = \beta_\alpha$ through iteratively trying various value for β until this last equation is satisfied.

The values of α and $\beta = \beta_\alpha$, along with the value for BR, which here is nominally 12.5 megabauds/sec., permit the time constant for the constant pseudo error rate feedback loop of FIG. 12 to be determined. First, note that converter box 92 has a full scale voltage of d volts and so the scale factor for 12 bits up/down counter 91 and converter 92 together is $[d/(2^{12}-1)]$ volts per count. From FIG. 12, ε is an error signal representing the net difference in counts per second between the count rate of the distribution counter and the count rate of pseudo errors. Thus, the counts/second rate supplied to 12 bit up/down counter 91 is ε/m counts/second from FIG. 12 so that the dispersion voltage $a_1$ from digital-to-analog converter 92 changes at the rate of $[d/2^{12}-1)](\epsilon/m)$ volts per second, or $$\frac{d}{dt} a_1 = \frac{d}{m(2^{12}-1)} \epsilon.$$

This can be rewritten in terms of β by noting the earlier definition for β and applying a simple rule from differential calculus yielding $$\beta \triangleq \frac{a_1}{d}$$

and $$\frac{d}{dt}\beta = \frac{d}{dt}\left(\frac{a_1}{d}\right) = \frac{1}{d} \frac{d}{dt} a_1 = \frac{1}{m(2^{12}-1)} \epsilon.$$

To proceed, there is needed the loop gain transfer function for changes in ε as a result of changes in β. This can be obtained from the earlier found equation $$\epsilon = (BR) \, P(\alpha,\beta) - \frac{(BR)}{8192}.$$

The differentiating this last equation, $$\frac{d\epsilon}{d\beta} = \frac{d}{d\beta}\left\{(BR)\left[P(\beta,\alpha) - \frac{1}{8192}\right]\right\} = (BR)\frac{d}{d\beta} P(\beta,\alpha)$$

$$= (BR)\frac{d}{d\beta} \tfrac{1}{4}\{Q(\beta\alpha) + Q(\alpha) -$$

$$2Q[(2-\beta)\alpha] + Q(3\alpha) - Q[(4-\beta)\alpha]\}$$

$$= \frac{(BR)}{4} \frac{d}{d\beta}\{Q(\beta\alpha) - 2Q[(2-\beta)\alpha] - Q[(4-\beta)\alpha]\}.$$

The following definition $$-\frac{d}{dx} Q(x) \triangleq f(x),$$

defines the probability density function of the normal probability and allows rewritting the previous equation as follows:

$$\frac{d\epsilon}{d\beta} = -\frac{(BR)}{4}\Big\{f(\beta\alpha)\frac{d}{d\beta}(\beta\alpha) -$$

$$2f[(2-\beta)\alpha]\frac{d}{d\beta}[(2-\beta)\alpha] - f[(4-\beta)\alpha]\frac{d}{d\beta}[(4-\beta)\alpha]\Big\}$$

$$= -\frac{(BR)}{4}\{f(\beta\alpha) + 2f[(2-\beta)\alpha] + f[(4-\beta)\alpha]\}\alpha.$$

Note again the following equation developed above:

$$\epsilon = (BR)\left[P(\alpha,\beta) - \frac{1}{8192}\right].$$

The analysis of the constant pseudo error feedback loop need only be made for small excursion of β about the steady state value therefore, $\beta_\alpha$, which is facilitated through the following definition:

$$\beta \triangleq \beta_\alpha + \Delta\beta.$$

With the use of this last definition, the equation preceeding that definition becomes approximately, from differential calculus, and taking $\Delta\beta$ being small enough that the derivative of $\epsilon$ with respect to $\beta$ is approximately constant $$\epsilon \simeq (BR)\left[P(\beta_a,a) - \frac{1}{8192}\right] + \frac{d\epsilon}{d\beta}\bigg|_{\beta=\beta_a}\Delta\beta.$$

As shown above, $$P(\beta_a,a) = \frac{1}{8192},$$

so that the preceeding equation becomes $$\epsilon \simeq \frac{d\epsilon}{d\beta}\bigg|_{\beta=\beta_a}\Delta\beta.$$

This last equation can be substituted in the time derivative of $\beta$ found above $$\frac{d}{dt}\beta = \frac{1}{m(2^{12}-1)}\epsilon,$$

with the result $$\frac{d}{dt}\beta = \frac{1}{m(2^{12}-1)}\frac{d\epsilon}{d\beta}\bigg|_{\beta=\beta_a}\Delta\beta.$$

The time dependence of the excursion $\Delta\beta$ can be taken to be the same as the time dependence of $\beta$ itself or $$\frac{d}{dt}\Delta\beta = \frac{d}{dt}\beta.$$

Then combining these last two equations with the earlier equation for the derivative of $\epsilon$ with respect to $\beta$, $$\frac{d\epsilon}{d\beta} = -\frac{(BR)}{4}\{f(\beta a) + 2f[(2-\beta)a] + f[(4-\beta)a]\}a,$$

yields the following:

$$\frac{d}{dt}\Delta\beta = \frac{-1}{m(2^{12}-1)}\frac{(BR)}{4}\{f(\beta_a a) +$$

$$2f[(2-\beta_a)a] + f[(4-\beta_a)a]\}a\Delta\beta.$$

This last equation is an equation for a first order system as can be seen from the following. The equation representing a first order system is well known to be $$x = x_o \exp\left(-\frac{t}{\tau}\right),$$

where $\tau$ represents the time constant for the system and $x_o$ represents an initial value for the first-order system. Differentiating this last equation yields $$\frac{d}{dt}x = -\frac{1}{\tau}x_o\exp\left(-\frac{t}{\tau}\right) = -\frac{1}{\tau}x.$$

A comparison of this last equation with the equation for the time derivate of $\Delta\beta$ shows that this equation represents a first-order system in $\Delta\beta$ for small error signals at the output of combining function 88 in FIG. 12. That is to say, the constant pseudo error rate feedback loop for adjusting $\beta$ appears approximately like a linear first-order system for small excursions from steady state, i.e. that the dispersion voltage, $a_1$, normalized by the constant decision voltage d, is developed in a first-order feedback loop.

Comparing the time derivative of a general first-order system, set out just above, and the equation for the time derivative of $\Delta\beta$, one can see that the time constant $\tau$ is as follows:

$$\tau = \left(\frac{1}{m(2^{12}-1)}\frac{(BR)}{4}\{f(\beta_a a) +$$

$$2f[(2-\beta_a)a] + f[(4-\beta_a)a]\}a\right)^{-1}.$$

By knowing the baud rate, BR, (approximately 12.5 megabauds/sec. in the present embodiment) and by choosing several values for the baud error rate, BER, over the range of error rates expected in operation, one can calculate several values for $\tau$ using different values for m in box 90 of FIG. 12 and so in the equation for $\tau$. If each of the values for $\tau$ for a particular m comes within the time constant range desired for the constant pseudo error feedback loop developing the dispersion voltage $a_1$, that value of m can be used in block 90 of FIG. 12 to give the desired loop response. Typically, since block 90 is part of the dispersion counter 83 in FIG. 11, m will be chosen to be a value which is an integer power of the base 2 since this counter is a binary counter but this need not be so.

Returning now to FIGS. 5 and 11, the system diagram of FIG. 5 reveals that two other constant pseudo error rate feedback loops, shown in dashed-lines, are provided. The first of these involves a combining circuit, 95, and a block designated lower level second constant pseudo error rate, 96, to develop the LOWER LEVEL SECOND DISPERSION signal, $a_2$. The elements comprising block 96 are also shown in FIG. 11, where for this feedback loop, the logic signal input to inverter 77 is again $(X > -d)$ but the logic signal input to AND gate 80 is now $(X > -(2d-a_2))$.

This constant pseudo error rate feedback loop is to operate at a different selected constant pseudo error rate than is the one associated with the feedback loop containing block 75. The purpose for this, as indicated earlier, is to determine whether the probability density function of the perturbations in the incoming baseband analog signal about the lower expected incoming signal level delivered to the user at the receiver truely follow a Gaussian distribution. As pointed out previously, the LOWER LEVEL FIRST DISPERSION signal $a_1$ and the LOWER LEVEL SECOND DISPERSION signal $a_2$ should maintain a particular and constant ratio with respect to one another if perturbations about the lower expected incoming signal level in the incoming baseband analog signal follow a Gaussian distribution. Of course, to set the pseudo error rate in the constant pseudo error feedback loop containing block 96 therein at a constant different than the constant in the feedback loop containing block 75, the counter 78 in FIG. 11 must have a different maximum count total capability in each of the two feedback loops.

A third constant pseudo error rate loop in FIG. 5 involves combining circuit 44 along with a block designated upper level constant pseudo error rate, 97. This constant pseudo error feedback loop is used with respect to data samples in the incoming baseband analog signal which have amplitudes judged nominally equal to the upper expected incoming signal level. Such being the use, no logic signal is provided to inverter 77 in FIG. 11 for this feedback loop, i.e. inverter 77 is not used, but rather the logic signal $(X>d')$ is presented directly to AND gate 80. However, the other available logic signal to be provided to AND gate 80, $(X>(2d'-a'))$, must be inverted which is accomplished by a dashed-line inverter, 77; to provide the logic signal $(X \leq (2d'-a'))$. Again, the maximum count total capability of counter 78 will determine the pseudo error rate in this upper level constant pseudo error rate feedback loop.

Of course, the time constant for the response for all of these constant pseudo error rate feedback loops need not be the same. Most often, though, the time constant will probably be similarly chosen in each of these loops.

One difference between the upper level constant pseudo error rate feedback loop and the two constant pseudo error rate feedback loops associated with the lower level, comes about because, referring now to the ordinate axis in FIG. 4, what is wanted is an indication of the normalized dispersion voltage as the parameter of interest rather than the raw dispersion voltage. For the two lower level constant pseudo error rate feedback loops, the normalizing parameter $-d$ is a constant and so the dispersion voltages $a_1$ and $a_2$ are merely scaled versions of the desired normalized dispersion voltages.

On the other hand, for the upper level constant pseudo error rate feedback loop, the normalizing parameter $d'$ is not a constant and so division by this parameter must be provided. The division is accomplished by a divider, 98, which receives the UPPER LEVEL EXPECTED LEVEL SIGNAL $2d'$ after it has been divided by 2 in another divider 99. The implementation of divider 99 can be that used with divider 41. Divider 98 is a well known divider for dividing two variables and can be arranged to include divider 99.

There are a number of advantages in the monitor system just described, some of which have been mentioned earlier such as the substantially linear relationship between the dispersion signals, $a_1$, $a_2$, and $a'$, developed therein and a statistical dispersion measure of the signal perturbations due to the degradation of the monitored signal as shown by the graphs in FIG. 4. This relationship results in the predictability of the baud error rate, BER, as also shown in FIG. 4. Also, because of the constant pseudo error rate concept being implemented in the constant pseudo error rate feedback loops developing the dispersion voltages, the response time of the monitor system tends to remain relatively constant because the pseudo error rate, i.e. the information rate, is kept constant even though the actual BER Is so small as to be essentially zero. This can be seen by computing the time constant for the constant pseudo error rate feedback loops, as set out above, over a range of baud error rates.

The incoming signal delivered to the user at the receiver can suffer from offsets, saturations, etc. as the incoming signal varies over several orders of magnitude. The use of the constant pseudo error rate concept is quite helpful because the concept is easily adapted to monitoring signals having such dificiencies introduced into them by various hardware shortcomings in the digitally based communications channel. As indicated by the above embodiment description, the monitor system can tolerate incoming signals which are asymmetrical at the expected incoming signal values with respect to the reference value, signals with a wide range in amplitudes, etc.

Even with ideal hardware in the digitally based communications channel, the constant pseudo error rate implementation for the monitor system is quite helpful because the standard deviation of the actual error count per unit time divided by the expected error count per unit time, n, is equal to $1/(n)^{\frac{1}{2}}$. The use of a constant pseudo error rate concept keeps n per unit time constant thereby keeping the normalized statistical error constant (as well as keeping the time response constant and providing an output linearly related to the dispersion of the perturbations in the degraded incoming signal).

As shown in the system diagram of FIG. 5, the monitor system concept can be extended to monitor the perturbations at more than one expected incoming signal level occurring in the incoming signal delivered to the user at the receiver. Thus, while only two expected incoming signal levels are shown monitored in the system diagram of FIG. 5, other kinds of incoming signals may have more expected incoming signal levels in them and these incoming signals can also be monitored at some or all of these other expected incoming signal levels.

The choice of which expected incoming signal level to monitor and where to monitor around any one of the expected incoming signal levels chosen involves consideration of a number of factors. Not only is there an important question as to which expected incoming signal levels are the most representative of the degradation occurring in the incoming signals, but also the relation between any one of the expected incoming signal levels and associated waveform of the incoming signal at that point is of concern.

Thus, in the context of the present incoming baseband analog signal waveform used in connection with an embodiment of the monitor system disclosed herein, one might have chosen as two bands outside which pseudo errors were to be determined with respect to the outer expected incoming signal levels to be, first, between $+2d'$ volts and $+(2d'+a')$ volts, as a first band, and second, between $-2d$ volts and $-(2d+a)$ volts as a second band. This choice would be an attractive possibility because it would minimize the sensitivity of the monitor system to sampling phase errors since phase errors at the outer levels are occurring where the slope of the incoming baseband analog signal with respect to time is the smallest.

These bands would also be attractive possibilities as bands on which to base measures of a pseudo errors because all of the expected incoming signal levels are inside the actual dispersion determine threshold voltages. This circumstance would minimize the possibility that perturbations in the signal, causing deviations larger than d at an expected incoming signal level not associated with these center level bands would appear like deviations smaller than d from the expected incoming signal levels associated with these bands.

However, use of these bands were rejected because amplitude clipping in the digitally based communications channel could clip off the noise peaks in the incoming baseband analog signal which the monitor system should be measuring to indicate the potential for error in the digitally based communications channel. Yet all of the noise remains which would actually cause errors in the received data as determined by the receiver threshold circuit. This situation, coupled with the higher than average tolerance for phase errors, could cause performance predictions based on the dispersion determined threshold levels $+(2d+a)$ and $-(2d+a)$ to be excessively optimistic.

Another possibility would be to set the bands outside which the pseudo errors are to be determined on either side of the center expected incoming signal level with the dispersion determined offset threshold placed at $+a$ and at $-a$. This would be attractive because there are twice as many data samples at the center expected level for forming sampling distributions as there are at either of the outer expected levels. Further, signal perturbations are much more affected by phase jitter, i.e. rapid comunications channel timing errors, about the center level because the incoming baseband signal has a much greater slope at that level.

However, measuring pseudo errors at the center expected incoming signal level was rejected because non-linear distortion, signal clipping, and associated transient ringing could occur to degrade the incoming baseband analog signal at the outer expected incoming signal levels without increasing the perturbations in the incoming baseband analog signal about the center expected incoming signal level. Thus, the measurement at the center expected incoming signal level of pseudo errors may not serve very well to predict performance of the digitally based communications channel. Thus, where phase jitter is not a dominant cause of signal perturbations, the best choise of bands upon which to base measuring pseudo errors appears to be those chosen for the system of FIG. 5. That is, outside the bands between $+2'$ volts and $+(2d'-a')$ volts, in the one hand, and between $-2d$ volts and $-(2d-a_1)$ or $-(2d-a_2)$ volts on the other.

The minitor system of FIG. 5 measures pseudo errors in the bands just mentioned separately, with at least one of these bands being associated with each of the upper and lower expected incoming signal levels. If there is symmetry in operation between these outer expected incoming signal levels, the pseudo errors measured in each of these bands could be combined to provide one dispersion voltage output for the monitor system characterizing both outer expected incoming signal levels simultaneously. However, where there is not symmetry in operation at the outer expected incoming signal levels, the separate pseudo error detector systems in FIG. 5 giving a measure of dispersion due to degradation of the incoming baseband analog signal about each of the outer expected incoming signal levels may be preferable.

Of course, to save on hardware, and therefore expense, one may wish to build a monitor system which is capable of measuring pseudo errors in a band associated with only one of the outer expected incoming signal levels. Yet, monitoring can be accomplished at both of the outer expected incoming signal levels at alternative times in such a system by the simple expedient of monitoring the incoming baseband analog signal in one polarity first and then inverting the polarity of the incoming baseband analog signal at a later time, a sequence which can be repeated.

Figure 13:
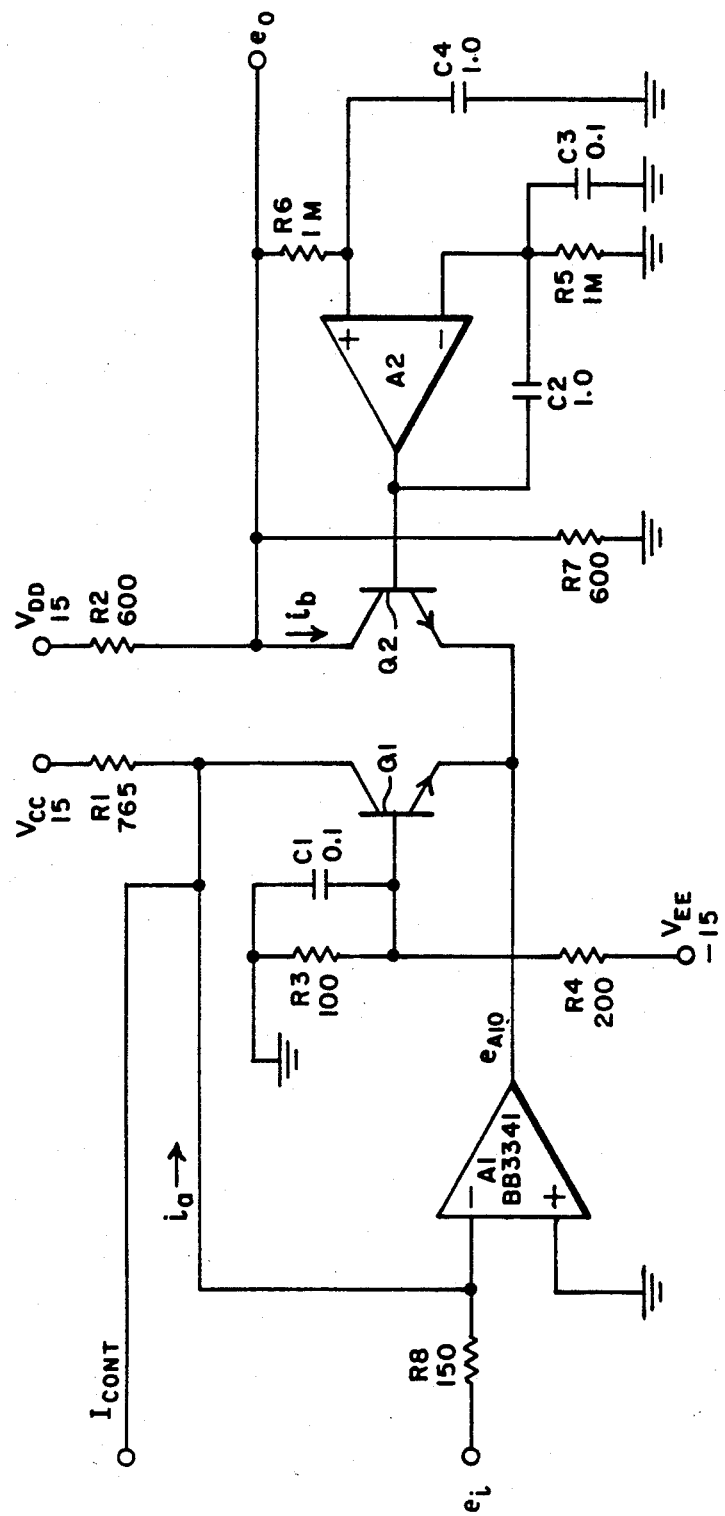
FIGS. 13, 14 and 15 show variable gain amplifiers in connection with the present invention.

As earlier indicated, the variable gain amplifier 14 in system diagram of FIG. 5 must be capable of accomodating very high data rates; in the present situation, on the order of 12.5 megabauds/sec. A variable gain amplifier design capable of accomplishing this is shown in FIG. 13, a design which can also operate at data rates down to a very few hertz. The amplifier shown in FIG. 13 has some similarity to the variable gain amplifier disclosed in U.S. Pat. No. 3,992,616 to Acker and assigned to Honeywell Inc. However, the variable gain amplifier shown there has a capacitive coupling member therein which limits operation at lower frequencies.

The gain control feature of the amplifier shown in FIG. 13 depends on the non-linear characteristics of the base-emitter junctions in a pair of closely matched transistors, Q1 and Q2. These base-emitter junctions each follow rather closely an exponential voltage-current characteristic that is well known. That exponential law is as follows:

$$I_E = I_{ES}\left[\left(\exp\frac{qV_{BE}}{kT}\right) - 1\right],$$

which can be rewritten for any reasonable forward bias on a base-emitter junction as $$I_E = I_{ES} \exp\frac{qV_{BE}}{kT}.$$

There are two other well known transistor equations pertinent there which are as follows:

$$I_E = I_C + I_B$$

$$I_B = \frac{I_C}{\beta}$$

The use of these two equations with the equation preceding them permits writing the transistor equation in terms of the collector current and the base-emitter voltage as follows:

$$I_C = \frac{\beta I_{ES}}{1 + \beta} \exp\frac{qV_{BE}}{kt}.$$

The ratio between any two operating points for either of the two transistors appearing in FIG. 13, which can be represented by this last equation, will be expressed below using the following notation. For transistor Q1, the two collector currents occurring at the two different operating points will be designated $I_{C1,1}$ and $I_{C1,2}$. The two base-emitter voltages and the two current gains occurring at these operating points will be similarly designated $V_{BE1,1}$ and $V_{BE1,2}$, and again $\beta_{1,1}$ and $\beta_{1,2}$. $I_{ES}$ is assumed constant. Similar notation is used with respect to transistor Q2.

With this notation and the last equation above, two operating points for transistor Q1 can be written as follows:

$$I_{C1,1} = \frac{\beta_{1,1}I_{ES}}{1 + \beta_{1,1}} \exp\frac{qV_{BE1,1}}{kT},$$

-continued
$$I_{C1,2} = \frac{\beta_{1,2} I_{ES}}{1 + \beta_{1,2}} \exp\frac{qV_{BE1,2}}{kT}.$$

For the closely matched transistors Q1 and Q2, the reverse emitter saturation currents, $I_{ES}$, and the transistor current gains, $\beta$, will be taken as being equal to one another for each of the transistors Q1 and Q2 over temperature, and for the current gains, at common operating points. The ratio of the collector currents of transistor Q1 at operating points is as follows:

$$\frac{I_{C1,2}}{I_{C1,1}} = \frac{\left(\frac{\beta_{1,2}}{1+\beta_{1,2}}\right)\exp\frac{qV_{BE1,2}}{kT}}{\left(\frac{\beta_{1,1}}{1+\beta_{1,1}}\right)\exp\frac{qV_{BE1,1}}{kT}}.$$

This equation can be rewritten after algebraic manipulation as follows:

$$V_{BE1,2} = V_{BE1,1} + \frac{kT}{q}\ln\frac{I_{C1,2}\left(\frac{\beta_{1,1}}{1+\beta_{1,1}}\right)}{I_{C1,1}\left(\frac{\beta_{1,2}}{1+\beta_{1,2}}\right)}.$$

Return now to FIG. 13, operational amplifier A1 must be a very high performance operational amplifier because the incoming signal must be operated on by this operational amplifier, including the high frequency extremes occurring in this signal. Since the incoming signal represents a baud rate of about 12.5 megabauds/sec in the present embodiment, operational amplifier A1 should have a gain "roll-off" with frequency at somewhere around 35 megahertz for completely satisfactory operation. Operational amplifier A1 should also, of course, have a high input impedance, a high gain out to the "roll-off" frequency, and a low output impedance. A BB3341 operational amplifier has been found satisfactory.

Operation amplifier A2, on the other hand, need not have a high performance capability over a large frequency range because it will not be operating on the signal passed through the variable gain amplifier of FIG. 13. Thus, operational amplifier A2, while it should have a high input impedence and a low output impedence, need only have a high gain out to a moderate "roll-off" frequency.

As earlier stated, the transistors Q1 and Q2 must be matched in base-emitter junction voltage-current characteristics, not only at room temperature, but also in these characteristics over temperature. Such transistors can be obtained commercially often integrated in the same semiconductor chip. Possibly, one may wish to have this chip or two discrete matched transistors mounted in a temperature controlled oven. Also, transistor Q1 and Q2 should have substantial current gains, $\beta$, out to frequencies beyond the "roll-off" frequency of operational amplifier A1.

The symbol $I_{CONT}$ represents the control current for controlling the gain of the variable gain amplifier FIG. 13. A current source having a variable voltage and a first resistor is one simple way to provide the current $I_{CONT}$ for control of the amplifier gain in a linear relationship with the control variable, the variable voltage. This control current can also be developed in such a way that it is an exponential function of the control variable to provide an exponential control of the gain in the variable gain amplifier FIG. 13. One manner of developing such an exponential control relationship is disclosed in the earlier cited reference, U.S. Pat. No. 3,992,616 to Acker, in connection with FIG. 11 appearing therein.

Operation of the variable gain amplifier in FIG. 13 can perhaps be best understood by the following analysis. The operational amplifier A1, because of its high gain over its frequency range to the "roll-off" point, will result in maintaining the inverting input of operational amplifier A1 approximately at the voltage level of its non-inverting input, which is shown to be ground in FIG. 13. Use of transistor Q1 in the feedback loop involving operational amplifier A1 is important in extending the frequency range of operation of this loop because of the additional gain occurring around this loop which is provided by transistor Q1 even at very high frequencies. With the inverting input of operational amplifier A1 at essentially ground and the collector of transistor Q1 connected thereto, this collector is also essentially at ground so that the voltage at the output of operational amplifier A1, $E_{A1o}$, will be equal to the voltage drop across transistor Q1.

The voltage drop across the base-emitter junction of transistor Q1 can be taken from the rewritten version of the transistor collector current ratio equation given above if the voltage $V_{BE1,1}$ is taken to be the voltage drop across the junction with no input signal, $e_i$, present. The voltage $V_{BE1,2}$ is also taken to be the voltage drop across this base-emitter junction, but with an input signal $e_i$ present leading to a corresponding signal current $i_1$ being present in the feedback loop around operational amplifier A1. This gives the following set of equations from FIG. 13:

$$V_{BE1,1} \triangleq V_{BE1,dc}$$

$$V_{BE1,2} \triangleq V_{BE1,ac+dc}$$

$$= V_{BE1,dc} +$$

$$\frac{kT}{q}\ln\frac{\left[I_{CONT} + \frac{V_{CC}}{R1} + i_a\right]\left(\frac{\beta_{1,dc}}{1+\beta_{1,dc}}\right)}{\left[I_{CONT} + \frac{V_{CC}}{R1}\right]\left(\frac{\beta_{1,ac+dc}}{1+\beta_{1,ac+dc}}\right)}.$$

The AC component of the voltage drop across the base-emitter junction of transistor Q1, $V_{BE1,ac}$, which is the difference in voltage drop across this junction when the input signal is present versus when it is not present, is found as follows:

$$V_{BE1,ac} \triangleq V_{BE1,ac+dc} - V_{BE1,dc}$$

$$= V_{BE1,dc} +$$

$$\frac{kT}{q}\ln\frac{\left[I_{CONT} + \frac{V_{CC}}{R1} + i_a\right]\left(\frac{\beta_{1,dc}}{1+\beta_{1,dc}}\right)}{\left[I_{CONT} + \frac{V_{CC}}{R1}\right]\left(\frac{\beta_{1,ac+dc}}{1+\beta_{1,ac+dc}}\right)} - V_{BE1,dc}$$

$$= \frac{kT}{q} \ln \frac{\left[I_{CONT} + \frac{V_{CC}}{R1} + i_a\right]\left(\frac{\beta_{1,dc}}{1 + \beta_{1,dc}}\right)}{\left[I_{CONT} + \frac{V_{CC}}{R1}\right]\left(\frac{\beta_{1,ac-dc}}{1 + \beta_{1,ac-dc}}\right)}$$

The resistors, R3 and R4, which bias the base of transistor Q1 do so at a negative voltage so that there will be an adequate voltage drop across the base-collector junction of transistor Q1. The base capacitor, C1, for transistor Q1 maintains the base of that transistor at ground for AC base current components even for very high frequencies of these components. This is quite important so that the AC voltage drop across the base-emitter junctions of transistor Q1 and Q2 will occur in matched circuit conditions even at very high frequencies. A similar capacitive arrangement for the AC grounding of Q2 is provided to assure this matching, an arrangement which is set out below.

The operational amplifier A2 also maintains its non-inverting input at very near the value of its inverting input, at least in the frequency range where A2 has a high gain. The inverting input of operational amplifier A2 is shown in FIG. 13 to be essentially at ground. That is true because of the high input impedance of operational amplifier A2, a situation leading to little or no current being drawn in the grounding resistor, R5, which is shunted by a capacitor, C3. A feedback capacitor, C2, serves to cause operational amplifier A2 to operate essentially as an integrator so the base of transistor Q2 will be maintained at voltage values sufficient for the DC performance of transistor Q2 to essentially match that of transistor Q1.

Capacitors C2 and C3 also serve to connect the base of transistor Q2 essentially to AC ground so that the AC current components through the base-emitter junction of transistor Q2 flow in a circuit essentially matched to that at the corresponding junction of transistor Q1. With capacitor C3 much less in capacitance value than is capacitor C2, the actual capacitance from the base of transistor Q2 to ground is essentially determined by capacitor C3 which is, therefore, chosen to be equal in capacitance value to capacitor C1 to maintain the matched circuit conditions desired. Resistor R6 and capacitor C4 provide a lowpass filter at the non-inverting input of operational amplifier A2.

With transistor Q2 closely matched to transistor Q1 and having the same base-emitter junction voltage-current characteristics, the AC voltage component across this junction will be related to the collector current through this transistor in the same manner as is true for the base-emitter junction of transistor Q1. Therefore, the AC voltage component across the base-emitter junction of transmitter Q2 is similarly expressed as follows:

$$V_{BE2,ac} = \frac{kT}{q} \ln \frac{\left[\frac{V_{DD}}{R2} + i_b\right]\left(\frac{\beta_{2,dc}}{1 + \beta_{2,dc}}\right)}{\frac{V_{DD}}{R2}\left(\frac{\beta_{2,ac-dc}}{1 + \beta_{2,ac-dc}}\right)}$$

The current $i_b$ occurs in the collector of transistor Q2 in response to the presence of an input signal $e_i$.

Then, because of the matched circuit conditions occurring across the base-emitter junction of transistors Q1 and Q2, the AC voltage components across these two junctions can be equated with the following results:

$$V_{BE1,ac} = V_{BE2,ac}$$

Substituting the equations found above for these AC voltage components, and following this by some algebraic operations, the following equations result:

$$\frac{kT}{q} \ln \frac{\left[I_{CONT} + \frac{V_{CC}}{R1} + i_a\right]\left(\frac{\beta_{1,dc}}{1 + \beta_{1,dc}}\right)}{\left[I_{CONT} + \frac{V_{CC}}{R1}\right]\left(\frac{\beta_{1,ac-dc}}{1 + \beta_{1,ac+dc}}\right)}$$

$$= \frac{kT}{q} \ln \frac{\left[\frac{V_{DD}}{R2} + i_b\right]\left(\frac{\beta_{2,dc}}{1 + \beta_{2,dc}}\right)}{\frac{V_{DD}}{R2}\left(\frac{\beta_{2,ac-dc}}{1 + \beta_{2,ac+dc}}\right)}$$

After algebra, including cancelling the matched current gains, there is obtained $$1 + \frac{i_a}{I_{CONT} + \frac{V_{CC}}{R1}} = 1 + \frac{i_b}{\frac{V_{DD}}{R2}}$$

or, after further algebra, $$\frac{i_a}{i_b} = \frac{I_{CONT} + \frac{V_{CC}}{R1}}{\frac{V_{DD}}{R2}}.$$

The signal caused current $i_a$, developed in the feedback loop associated with operational amplifier A1, is developed in response to the input signal voltage $e_i$ across the input resistor R8. Of course, one could also use a capacitor in series with resistor R8 to provide AC coupling since, in any event, the variable gain amplifier of FIG. 13 does not pass DC signal components because of the operation arrangement for amplifier A2 which would lead to the nulling out of any such DC components. Since an input coupling capacitor of a properly chosen capacitance value could be ignored as an impedance element in series with resistor R8, the following equation holds with or without the use of the coupling capacitor because of the virtual grounding of the inverting input of operational amplifier A2:

$$e_i = i_a R8.$$

The AC signal current $i_b$ in the output circuit in FIG. 13 is drawn by the collector of transistor Q2, and must be supplied through the resistors R2 and R7. As relied upon in the foregoing analysis, only resistor R2 is significant for DC current components because operational amplifier A2 holds the output line of the FIG. 13 variable gain amplifier at ground insofar as DC operation is concerned. However, operational amplifier A2 does not follow higher frequency signals (in fact, the time constant associated with the operation of amplifier A2 determines to a substantial extent the low frequency response of the variable gain amplifier in FIG. 13). Therefore, the signal current $i_b$ can be drawn from both resistors R2 and R7.

Hence, resistor R2 can be used to set the desired DC current condition in the collector of transistor Q2 since the DC condition will be effected only by this resistor in the output. On the other hand, resistor R7 can then be used to adjust the level of the output of impedance of the variable gain amplifier to a desired value within a practical range since this impedance will depend on the parallel combination of resistors R2 and R7. The resulting relationship between the output signal voltage of the variable gain amplifier, $e_o$, and the signal current $i_b$ is:

$$e_o = i_b \frac{(R2)(R7)}{R2 + R7}.$$

Combining the last three equations yields the following:

$$\frac{\frac{e_i}{R8}}{\frac{e_o}{\frac{(R2)(R7)}{R2+R7}}} = \frac{I_{CONT} + \frac{V_{CC}}{R1}}{\frac{V_{DD}}{R2}}.$$

Defining the variable amplifier gain, an expression for that gain is obtained:

$$VGA \text{ gain} \triangleq \frac{e_o}{e_i} = \frac{(R1)(R7)V_{DD}}{R8(R2+R7)[(R1)I_{CONT} + V_{CC}]}.$$

The preceding gain expression for the variable gain amplifier shows that the gain thereof can be adjusted by varying any of several parameters, with the most convenient one usually being $I_{CONT}$. This equation also shows, for well-matched transistors Q1 and Q2, that temperature and operating point changes do not affect the gain of the amplifier to first order There are limits on the choices of the current $I_{CONT}$, and the transistor collector currents set by $V_{CC}$, $V_{BB}$, R1, and R2 because of the following:
(i) The quiescent collector currents of transistors Q1 and Q2 must be greater than the peak negative values of the AC current components $i_a$ or $i_b$, to keep the transistors Q1 and Q2 operating in the normal active region.
(ii) The quiescent collector currents of transistors Q1 and Q2 must not become too large with respect to either of the AC current components $i_a$ or $i_b$ to prevent the AC voltage drops across the bass-emitter junctions transistors Q1 and Q2 from becoming too small with respect to background noise levels.
(iii) The collector currents of transistors Q1 and Q2 should remain in the range where the first equation in this analysis is closely followed by the transistors Q1 and Q2.

In most applications, the collector currents of transistors Q1 and Q2 will be in range of one and one-half to five times the peak amplitudes of the AC current components, $i_a$ and $i_b$, for satisfactory operation.

Figure 14:
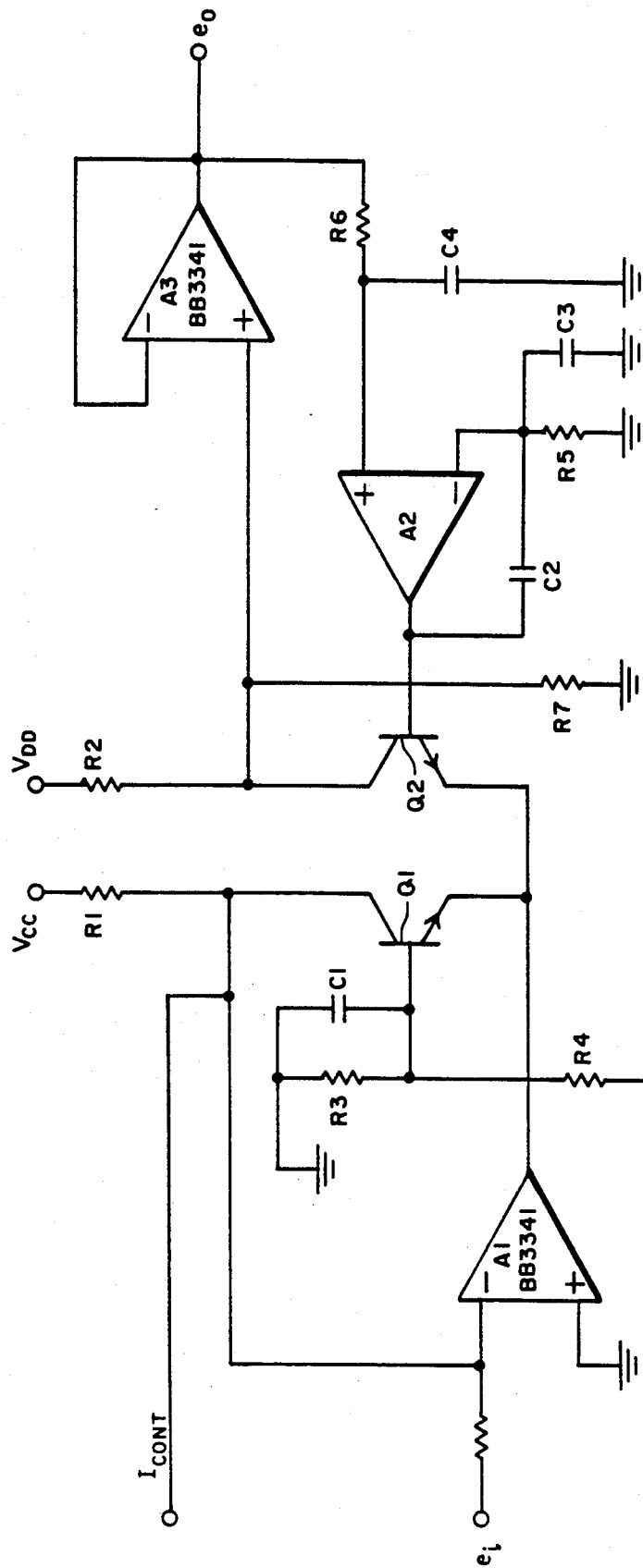

The output of FIG. 13, supplying the signal voltage $e_o$, may not have a satisfactory impedance level for any practical values of the resistors R2 and R7. The addition of another operational amplifier at the output of the variable gain amplifier of FIG. 13 can serve as a buffer to provide a low output impedance and, possibly, a selected further amount of fixed gain which can often be usefully and easily provided. Thus, FIG. 14 shows another version of the variable gain amplifier of FIG. 13, using an operational amplifier A3 as a voltage follower at the variable gain amplifier output, for the purpose of providing a satisfactory output impedance although no additional gain. Other known kinds of operational amplifier circuits for use at the variable gain amplifier output, which are connected to also be non-inverting circuits, may also be used in the arrangement of FIG. 14 in place of the voltage follower circuit shown there. This would allow both a low output impedance and an additional amount of fixed gain.

Figure 15:
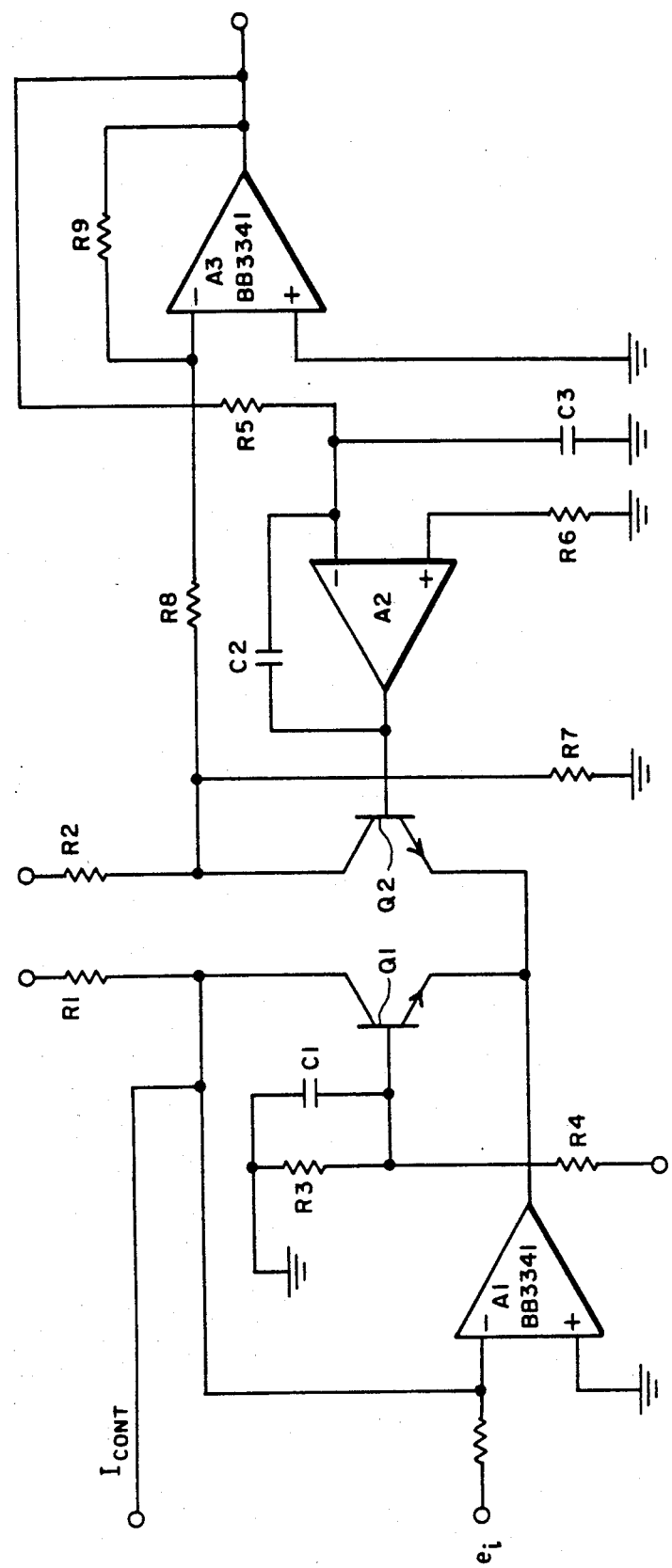

Should an inverting circuit arrangement be desired for use as the added operational amplifier, FIG. 15 shows such an arrangement using added operational amplifier A3. This operational amplifier is connected for inverting operation to provide an additional amount of fixed gain as determined by the ratio of resistors R9 to R8. Resistor R8 can be set to zero to hold the collector of transistor Q2 at AC ground for better matching of Q1 and Q2, while still providing a low output impedance and increased amplifier gain.

In both of the FIGS. 14 and 15, the providing of a ground for the AC current components in the base transistor Q2 is accomplished by the use of the capacitors C2 and C3. Thus, even though the operational amplifier A2 is unable to follow the frequency swings demanded by the signal $e_i$, the capacitors C2 and C3 will continue to maintain the base of transistor Q2 at ground for AC current components.

The operational amplifier A3 in each of the circuits in FIGS. 14 and 15 must again have a substantial gain out to a high "roll-off" frequency because these operational amplifiers must operate on the signals passing through the variable gain amplifier, including the extreme frequency components therein. Thus, they will often be chosen to be the same operational amplifiers chosen for operational amplifier A1 and are so designated in FIGS. 14 and 15.

The embodiments of the invention in which an exclusive property or right is claimed are defined as follows:

1. A variable gain amplifier having a variable gain amplifier input terminal and a variable gain amplifier output terminal, said amplifier comprising:
   an input transistor means having an input transistor control terminal and first and second input transistor terminals;
   an output transistor means having an output transistor control terminal and first and second output transistor terminals, said second input transistor terminal being electrically connected to said second output transistor terminal; and
   a maintaining means to maintain selected non-zero frequency voltage components occurring between said input transistor control terminal and said second input transistor terminal substantially equal to corresponding non-zero frequency voltage components occurring between said output transistor control terminal and said second output transistor terminal including:
      an input maintaining means electrically connected between said first and second input transistor terminals, said input maintaining means also being electrically connected to said variable gain amplifier input terminal;
      an output maintaining means electrically connected between said first output transistor terminal and said output transistor control terminal;
      first interconnection means adapted to be electrically connected to a voltage source; and first and second capacitive means, each of said capacitive means having first and second terminals, said first capacitive means first terminal being electrically connected to said input transistor control terminal and said first capacitive means second terminal being electrically connected to said first interconnection means, said second capacitive means first terminal being electrically connected to said output transistor control terminal and said second capacitive means second terminal being electrically connected to said first interconnection means.

2. The system of claim 1 wherein:

said input maintaining means comprises an input maintaining means resistive means having first and second terminal means and an input maintaining means amplifier having first and second input terminal means and an output terminal means, said input maintaining means amplifier being capable of providing a high circuit impedance at each of said input maintaining means amplifier input terminal means and being capable of providing a low circuit impedance at said input maintaining means amplifier output terminal means, said input maintaining means amplifier being capable of providing a large magnitude gain in an opposite magnitude direction for signals appearing at said input maintaining means amplifier output terminal means over corresponding signals appearing at said input maintaining means amplifier first input terminal means, and with said input maintaining means amplifier being capable of providing a large magnitude gain in an identical magnitude direction for signals appearing at said input maintaining means amplifier output terminal means over corresponding signals appearing at said input maintaining means amplifier second input terminal means, said input maintaining means resistive means first terminal means being electrically connected to said variable gain amplifier input terminal means and said input maintaining means resistive means second terminal means being electrically connected to said input maintaining means amplifier first input terminal means, said input maintaining means amplifier first input terminal means being electrically connected to said input transistor first terminal, said input maintaining means amplifier second terminal means being connected to said first interconnection means, and said input maintaining means amplifier output terminal means being electrically connected to said input transistor second terminal;

said output maintaining means comprises an output maintaining means amplifier having first and second input terminal means and an output terminal means, said output maintaining means amplifier being capable of providing a high circuit impedance at each of said output maintaining means amplifier input terminal means and being capable of providing a low circuit impedance at said output maintaining means amplifier output terminal means, said output maintaining means amplifier being capable of providing a large magnitude gain in an opposite magnitude direction for signals appearing at said output maintaining means amplifier output terminal means over corresponding signals appearing at said output maintaining means amplifier first input terminal means, and with said output maintaining means amplifier being capable of providing a large magnitude gain in an identical magnitude direction for signals appearing at said output maintaining means amplifier output terminal means over corresponding signals appearing at said output maintaining means amplifier second input terminal means, said output maintaining means amplifier second input terminal means being electrically connected to said output transistor first terminal, and said output maintaining means amplifier output terminal means, being electrically connected to said output transistor control terminal; and said second capacitive means further comprises a third terminal means, said second capacitive means third terminal means being electrically connected to said output maintaining means amplifier first input terminal means.

3. The system of claim 2 wherein said output maintaining means further comprises an output maintaining means resistive means, said output maintaining means resistive means accomplishing said electrical connection between said output maintaining means amplifier second input terminal means and said output transistor first terminal.

4. The apparatus of claim 3 further comprising a second interconnection means adapted to receive a variable gain amplifier control signal, said second interconnection means being electrically connected to said input maintaining means amplifier first input terminal means.

5. The system of claim 4 wherein said second capacitive means comprises first and second capacitors, each of said capacitors having first and second terminal means, said second capacitive means first capacitor first terminal means serving as said second capacitive means first terminal means, said second capacitive means first capacitor second terminal means serving as said second capacitive means third terminal means, said second capacitive means second capacitor first terminal means being electrically connected to said output maintaining means amplifier first input terminal means, and second capacitive means second capacitor second terminal means serving as said second capacitive means second terminal means.

6. The system of claim 1 wherein:

said input maintaining means comprises an input maintaining means resistive means having first and second terminal means and an input maintaining means amplifier having first and second input terminal means and an output terminal means, said input maintaining means amplifier being capable of providing a high circuit impedance at each of said input maintaining means amplifier input terminal means and being capable of providing a low circuit impedance at said input maintaining means amplifier output terminal means, said input maintaining means amplifier being capable of providing a large magnitude gain in an opposite magnitude direction for signals appearing at said input maintaining means amplifier output terminal means over corresponding signals appearing at said input maintaining means amplifier first input terminal means, and with said input maintaining means amplifier being capable of providing a large magnitude gain in an identical magnitude direction for signals appearing at said input maintaining means amplifier output terminal means over corresponding signals appearing at said input maintaining means amplifier second input terminal means, said input maintaining means resistive means first terminal means being electrically connected to said variable gain amplifier input terminal means and said input maintaining means resistive means second terminal means being electrically connected to said input maintaining means amplifier first input terminal means, said input maintaining means amplifier first input terminal means being electrically connected to said input transistor first terminal, said input maintaining means amplifier second terminal means being connected to said first interconnection means, and said input maintaining means amplifier output terminal means being connected to said input transistor second terminal;

said output maintaining means comprises an output maintaining means amplifier having first and second input terminal means and an output terminal means, said output maintaining means amplifier being capable of providing a high circuit impedance at each of said output maintaining means amplifier input terminal means and being capable of providing a low circuit impedance at said output maintaining means amplifier output terminal means, said output maintaining means amplifier being capable of providing a large magnitude gain in an opposite magnitude direction for signals appearing at said output maintaining means amplifier output terminal means over corresponding signals appearing at said output maintaining means amplifier first input terminal means, and with said output maintaining means amplifier being capable of providing a large magnitude gain in an identical magnitude direction for signals appearing at said output maintaining means amplifier output terminal means over corresponding signals appearing at said output maintaining means amplifier second input terminal means, said variable gain amplifier output terminal being electrically connected to a selected one of said output maintaining means amplifier input terminal means, and said output maintaining means amplifier output terminal means being electrically connected to said output transistor control terminal;

said second capacitive means further comprises a third terminal means, said second capacitive means third terminal means being electrically connected to said output maintaining means amplifier second input terminal means; and said system further comprises an output amplifier having first and second input terminal means and an output terminal means, said output amplifier being capable of providing a high circuit impedance at each of said output amplifier input terminal means and being capable of providing a low circuit impedance at said output amplifier output terminal means, said output amplifier being capable of providing a large magnitude gain in an opposite magnitude direction for signals appearing at said output amplifier output terminal means over corresponding signals appearing at said output amplifier first input terminal means, and with said output amplifier being capable of providing a large magnitude gain in an identical magnitude direction for signals appearing at said output amplifier output terminal means over corresponding signals appearing at said output amplifier second input terminal means, said output amplifier output terminal means being electrically connected to said variable gain amplifier output terminal, said output transistor first terminal being electrically connected to a selected one of said output amplifier input terminal means, and said output amplifier first input terminal means being electrically connected to said output amplifier output terminal means.

7. The system of claim 6 wherein said selected one of said output maintaining means amplifier input terminal means is said output maintaining means amplifier second input terminal means and said selected one of said output amplifier input terminal means is said output amplifier second input terminal means.

8. The system of claim 7 wherein said output maintaining means further comprises an output maintaining means resistive means said electrical connection between said variable gain amplifier output terminal and said output maintaining means amplifier second input terminal means being accomplished by said output maintaining means resistive means.

9. The system of claim 8 further comprising a second interconnection means adapted to receive a variable gain amplifier control signal, said second interconnection means being electrically connected to said input maintaining means amplifier first input terminal means.

10. The system of claim 9 wherein said second capacitive means comprises first and second capacitors, each of said capacitors having first and second terminal means, said second capacitive means first capacitor first terminal means serving as said second capacitive means first terminal means, said second capacitive means first capacitor second terminal means serving as said second capacitive means third terminal means, said second capacitive means second capacitor first terminal means being electrically connected to said output maintaining means amplifier first input terminal means, and second capacitive means second capacitor second terminal means serving as said second capacitive means second terminal means.

11. The system of claim 6 wherein said selected one of said output maintaining means amplifier input terminal means is said output maintaining means amplifier first input terminal means and said selected one of said output amplifier input terminal means is said output amplifier first input terminal means and said system further comprises first and second output amplifier resistive means, said output amplifier first resistive means accomplishing said electrical connection between said output transistor first terminal and said output amplifier first input terminal means and said output amplifier second resistive means accomplishing said electrical connection between said output amplifier first input terminal means and said output amplifier output terminal means.

12. The system of claim 11 further comprising a third interconnection means adapted to be electrically connected to a voltage source and a fourth interconnection means adapted to be electrically connected to a voltage source, said third interconnection means being electrically connected to said output maintaining means amplifier second input terminal means and said fourth interconnection means being electrically connected to said output amplifier second input terminal means.

13. The system of claim 12 wherein said output maintaining means further comprises an output maintaining means resistive means, said output maintaining means resistive means accomplishing said electrical connection between said output maintaining means amplifier first input terminal means and said variable gain amplifier output terminal.

14. The apparatus of claim 13 further comprising a second interconnection means adapted to receive a variable gain amplifier control signal, said second interconnection means being electrically connected to said input maintaining means amplifier first input terminal means.

15. The system of claim 14 wherein said second capacitive means comprises first and second capacitors, each of said capacitors having first and second terminal means, said second capacitive means first capacitor first terminal means serving as said second capacitive means first terminal means, said second capacitive means first capacitor second terminal means serving as said second capacitive means third terminal means, said second capacitive means second capacitor first terminal means being electrically connected to said output maintaining means amplifier first input terminal means, and second capacitive means second capacitor second terminal means serving as said second capacitive means second terminal means.

* * * * *